(12) United States Patent
Nishikawa et al.

(10) Patent No.: US 10,580,787 B2
(45) Date of Patent: Mar. 3, 2020

(54) THREE-DIMENSIONAL MEMORY DEVICE CONTAINING DUMMY ANTENNA DIODES

(71) Applicant: SANDISK TECHNOLOGIES LLC, Addison, TX (US)

(72) Inventors: Masatoshi Nishikawa, Yokkaichi (JP); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/991,268

(22) Filed: May 29, 2018

(65) Prior Publication Data

US 2019/0371800 A1 Dec. 5, 2019

(51) Int. Cl.
*H01L 27/1157* (2017.01)
*H01L 27/11582* (2017.01)
(Continued)

(52) U.S. Cl.
CPC .... *H01L 27/1157* (2013.01); *H01L 21/76205* (2013.01); *H01L 27/0629* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC .......................... H01L 27/11519–11524; H01L 27/11551–11556; H01L 27/11565–1157; H01L 27/11578–11582; H01L 21/3065; H01L 21/31116; H01L 21/0255; H01L 27/0629; H01L 27/0727; H01L 27/11556; H01L 27/11582; H01J 2237/0206
See application file for complete search history.

(56) References Cited

U.S. PATENT DOCUMENTS 4,954,201 A 9/1990 Latz et al.
5,567,975 A 10/1996 Walsh et al.
(Continued)

OTHER PUBLICATIONS

U.S. Appl. No. 15/605,204, filed May 25, 2017, SanDisk Technologies, LLC.

(Continued)

*Primary Examiner* — Younes Boulghassoul
(74) *Attorney, Agent, or Firm* — The Marbury Law Group, PLLC

(57) ABSTRACT

At least one diode, lower-level metal interconnect structures embedded within lower-level dielectric material layers, and a doped semiconductor material layer are formed over a semiconductor substrate. An electrically conductive path is provided between the at least one diode and the doped semiconductor material layer. An alternating stack of insulating layers and spacer material layers and memory stack structures extending therethrough are formed above the doped semiconductor material layer. A backside trench is formed through the alternating stack. The electrically conductive path is employed during plasma etch processes employed to form the memory stack structures and the backside trench to provide a discharge path for accumulated electrical charges. The electrically conductive path is subsequently disconnected by removing a conductive component underlying the backside trench. The spacer material layers can be replaced with electrically conductive layers employing the backside trench.

12 Claims, 49 Drawing Sheets

(51) Int. Cl.
   *H01L 27/11556* (2017.01)
   *H01L 27/11524* (2017.01)
   *H01L 27/11529* (2017.01)
   *H01L 27/11573* (2017.01)
   *H01L 27/06* (2006.01)
   *H01L 21/762* (2006.01)

(56) References Cited

U.S. PATENT DOCUMENTS

| | | | |
|---|---|---|---|
| 5,679,597 A | 10/1997 | Moon | |
| 6,190,518 B1 | 2/2001 | Phan et al. | |
| 6,329,691 B1 | 12/2001 | Finzi | |
| 6,951,780 B1 | 10/2005 | Herner | |
| 7,276,403 B2 | 10/2007 | Herner | |
| 7,414,274 B2 | 8/2008 | Herner | |
| 8,004,009 B2 | 8/2011 | Hsieh | |
| 8,476,085 B1 | 7/2013 | Zhang et al. | |
| 9,437,658 B2 | 9/2016 | Sakotsubo | |
| 9,589,981 B2 | 3/2017 | Nishikawa et al. | |
| 9,646,981 B2 | 5/2017 | Nishikawa et al. | |
| 9,666,281 B2 | 5/2017 | Sakakibara | |
| 9,812,505 B2 | 11/2017 | Sakotsubo | |
| 9,859,422 B2 | 1/2018 | Nishikawa et al. | |
| 2006/0024868 A1 | 2/2006 | Herner | |
| 2008/0013355 A1 | 1/2008 | Herner | |
| 2010/0289073 A1 | 11/2010 | Hsieh | |
| 2013/0189799 A1 | 7/2013 | Zhang et al. | |
| 2016/0351709 A1 | 12/2016 | Nishikawa et al. | |
| 2017/0025421 A1 | 1/2017 | Sakakibara et al. | |
| 2017/0141161 A1 | 5/2017 | Sakotsubo | |
| 2017/0352678 A1* | 12/2017 | Lu | H01L 21/4846 |
| 2019/0198524 A1* | 6/2019 | Fujiki | H01L 27/11582 |

OTHER PUBLICATIONS

U.S. Appl. No. 15/720,306, filed Sep. 29, 2017, SanDisk Technologies, LLC.

Endoh et al., "Novel Ultra High Density Memory with a Stacked-Surrounding Gate Transistor (S-SGT) Structured Cell," IEDM Proc., (2001), 33-36.

* cited by examiner

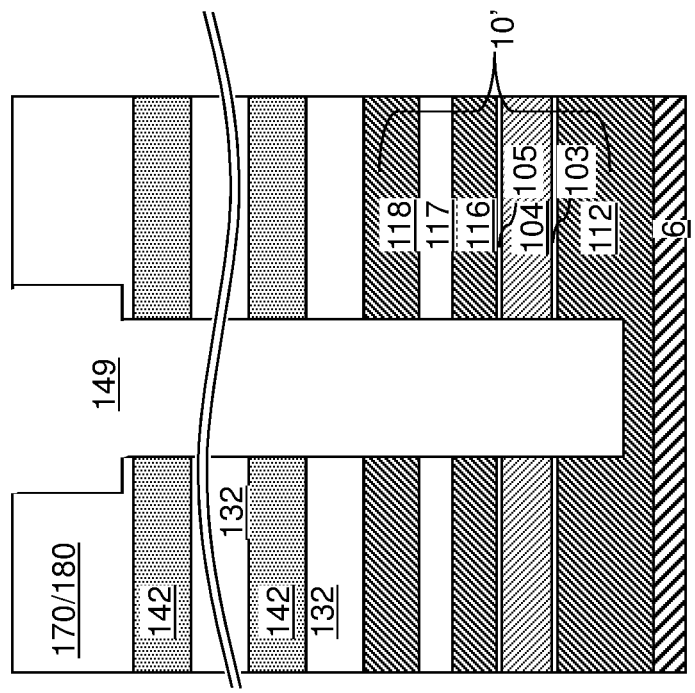
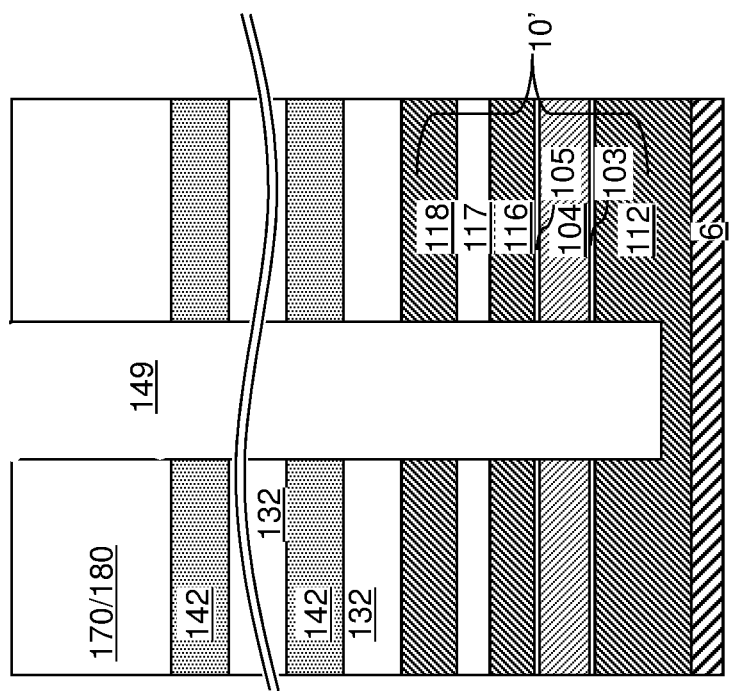

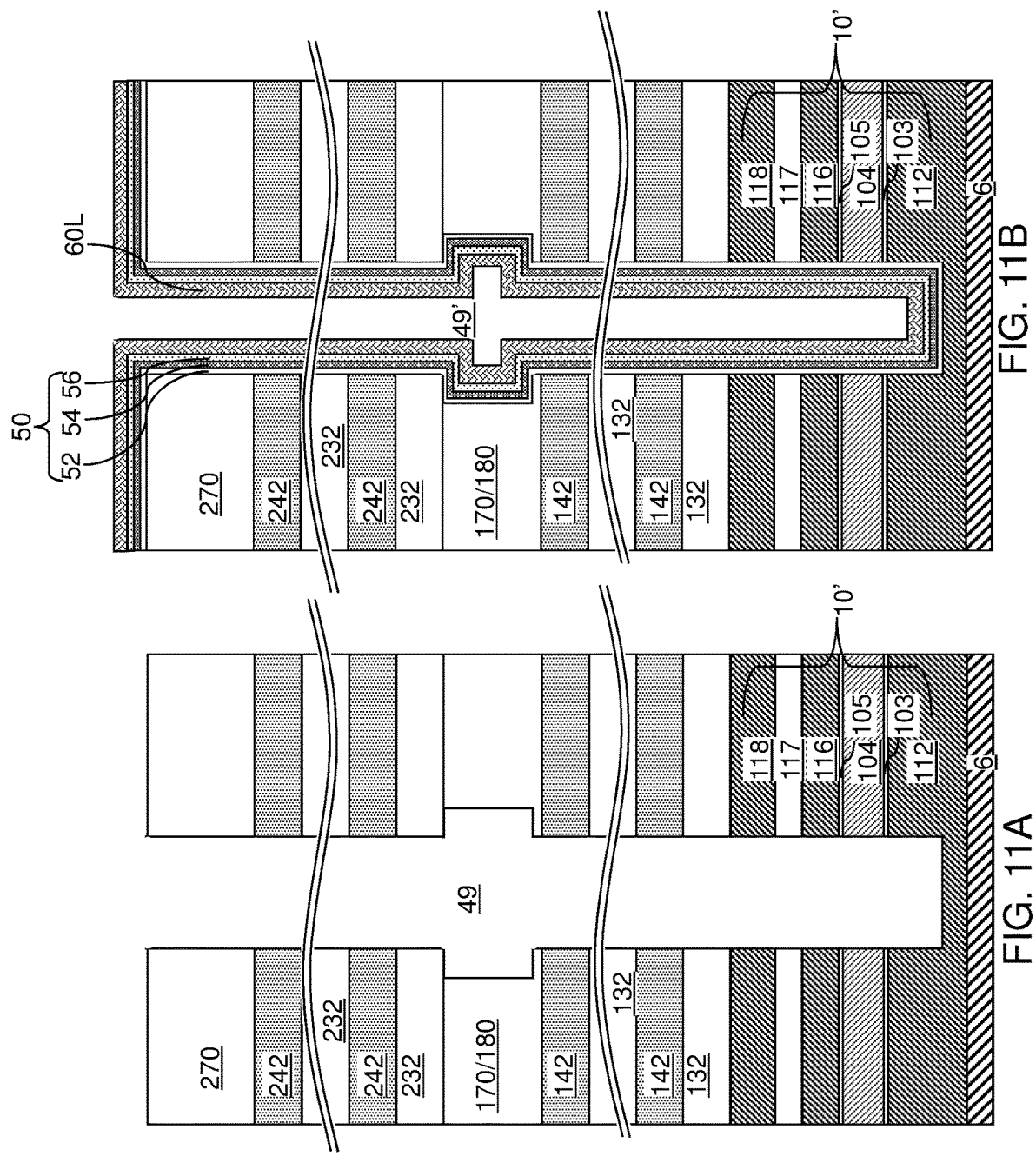

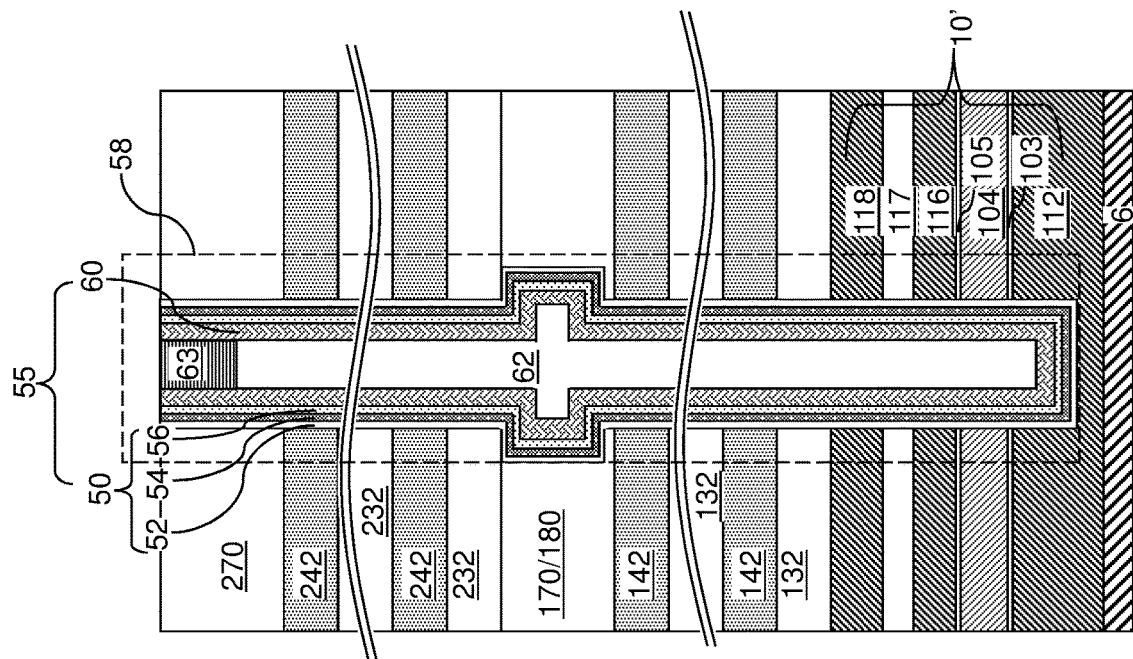
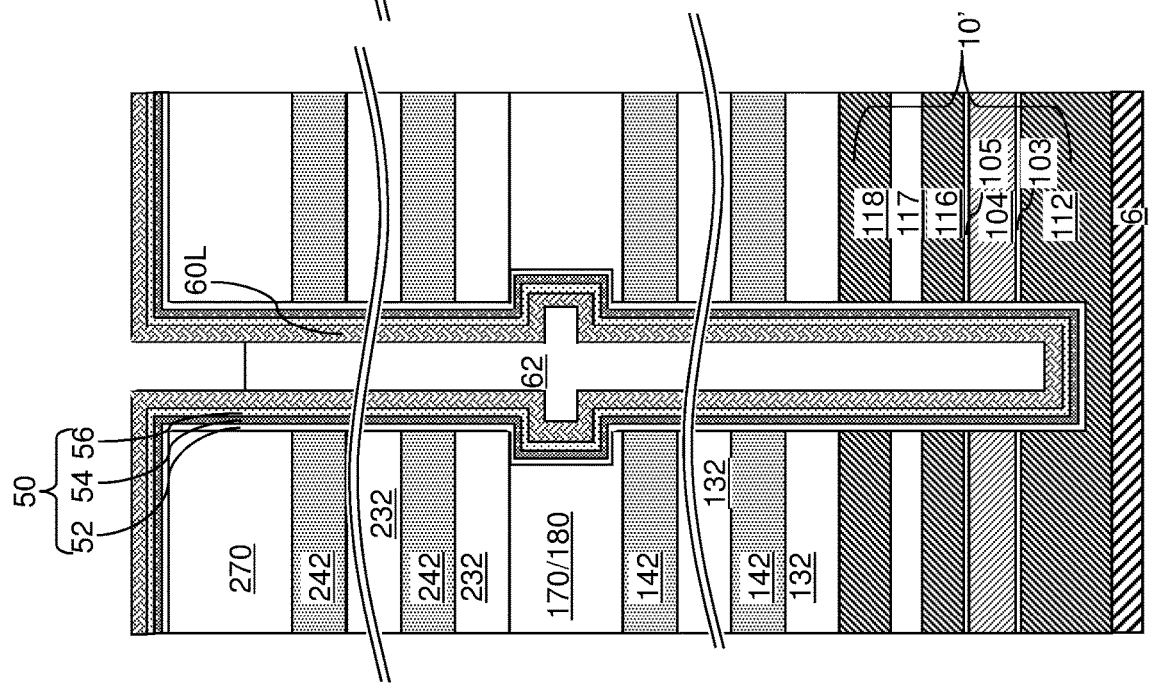
FIG. 11D
FIG. 11C

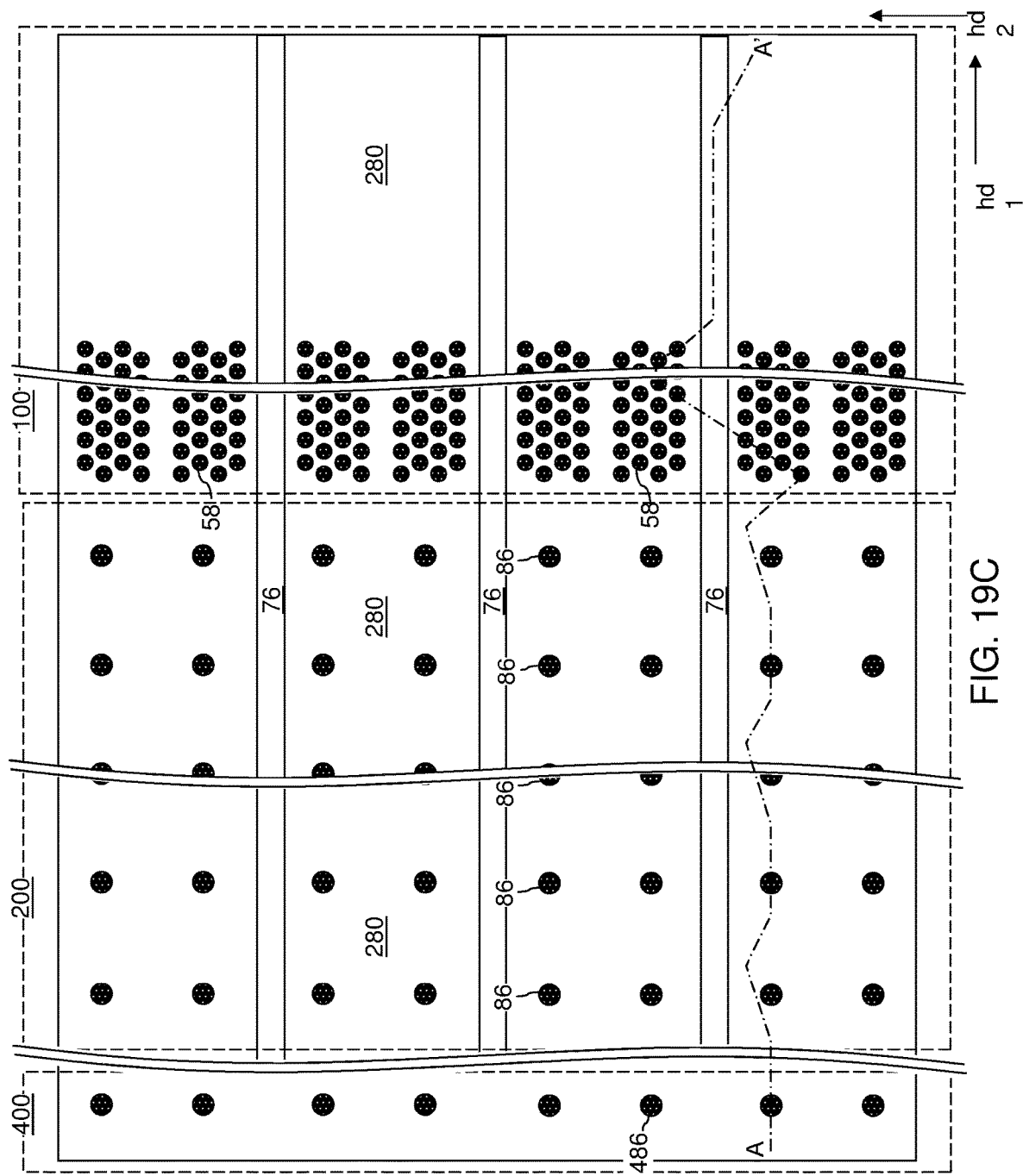

THREE-DIMENSIONAL MEMORY DEVICE CONTAINING DUMMY ANTENNA DIODES

FIELD

The present disclosure relates generally to the field of semiconductor devices, and particular to a three-dimensional memory device employing antenna diodes for local electrical discharge during plasma etch processes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: lower-level metal interconnect structures embedded within lower-level dielectric material layers and overlying a semiconductor substrate; an alternating stack of insulating layers and electrically conductive layers laterally extending along a first horizontal direction, located over the lower-level dielectric material layers; memory stack structures that vertically extend through the alternating stack; a dielectric wall structure vertically extending through each layer within the alternating stack and including a lengthwise sidewall that laterally extends along the first horizontal direction and contacts each electrically conductive layer within the alternating stack; and at least one diode located on the semiconductor substrate and electrically shorted to a subset of the lower-level metal interconnect structures that includes a topmost metal interconnect structure that contacts a first bottom surface of the dielectric wall structure.

According to another aspect of the present disclosure, a method of forming a three-dimensional memory device is provided, which comprises: forming at least one diode on a semiconductor substrate; forming lower-level metal interconnect structures embedded within lower-level dielectric material layers over the at least one diode and the semiconductor substrate; forming at least one doped semiconductor material layer over the lower-level dielectric material layers, wherein the at least one diode is electrically shorted to the at least one doped semiconductor material layer through a subset of the lower-level metal interconnect structures; forming an alternating stack of insulating layers and spacer material layers over the at least one doped semiconductor material layer; forming memory stack structures through the alternating stack; and forming a backside trench through the alternating stack, wherein an electrically connected path between the at least one diode and the at least one doped semiconductor material layer that includes the subset of the lower-level metal interconnect structures is disconnected by an anisotropic etch process that forms the backside trench.

BRIEF DESCRIPTION OF THE DRAWINGS

FIGS. 5A and 5B illustrate processing steps that can be employed to expand upper portions of the first-tier memory openings and first-tier support openings according to an embodiment of the present disclosure.

FIGS. 11A-11D are sequential vertical cross-sectional views of an inter-tier memory opening during formation of a memory opening fill structure according to an embodiment of the present disclosure.

FIG. 19C is a top-down view of the first exemplary structure of FIGS. 19A and 19B.

DETAILED DESCRIPTION

Figure 1A:
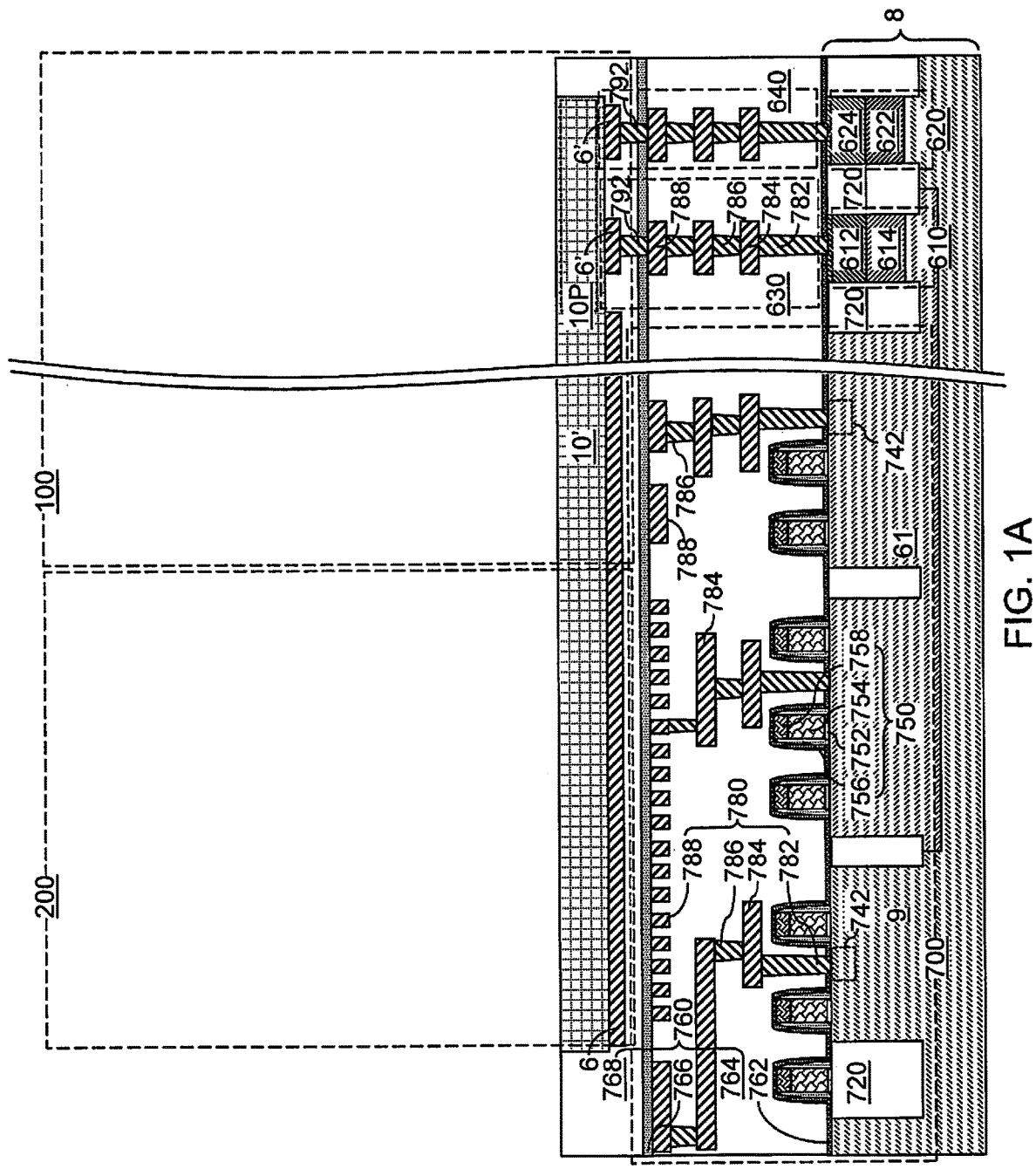
FIG. 1A is a vertical cross-sectional view of a first exemplary structure after formation of semiconductor devices, lower level dielectric layers, lower metal interconnect structures, and in-process source-level material layers on a semiconductor substrate according to an embodiment of the present disclosure.

Plasma etch processes are employed to etch memory openings and backside trenches through an alternating stack of insulating layers and spacer material layers in a three-dimensional memory device. In case the spacer material layers include a dielectric material, electrical charges can locally build up during the plasma etch processes, such as during the memory opening plasma etching. The local charge build up can cause plasma bending during subsequent plasma etching steps, which can lead to lateral distortions in the shape of subsequently formed openings, such as the shape of subsequently formed backside trenches formed by plasma etching. This may cause the backside trenches to have a curved shape instead of extending in a straight line along the vertical direction.

An embodiment of the present disclosure provides an antenna diode for reducing or preventing formation of charge build up due to local electrical discharge and resulting etch distortions during subsequent plasma etch processes. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1B:
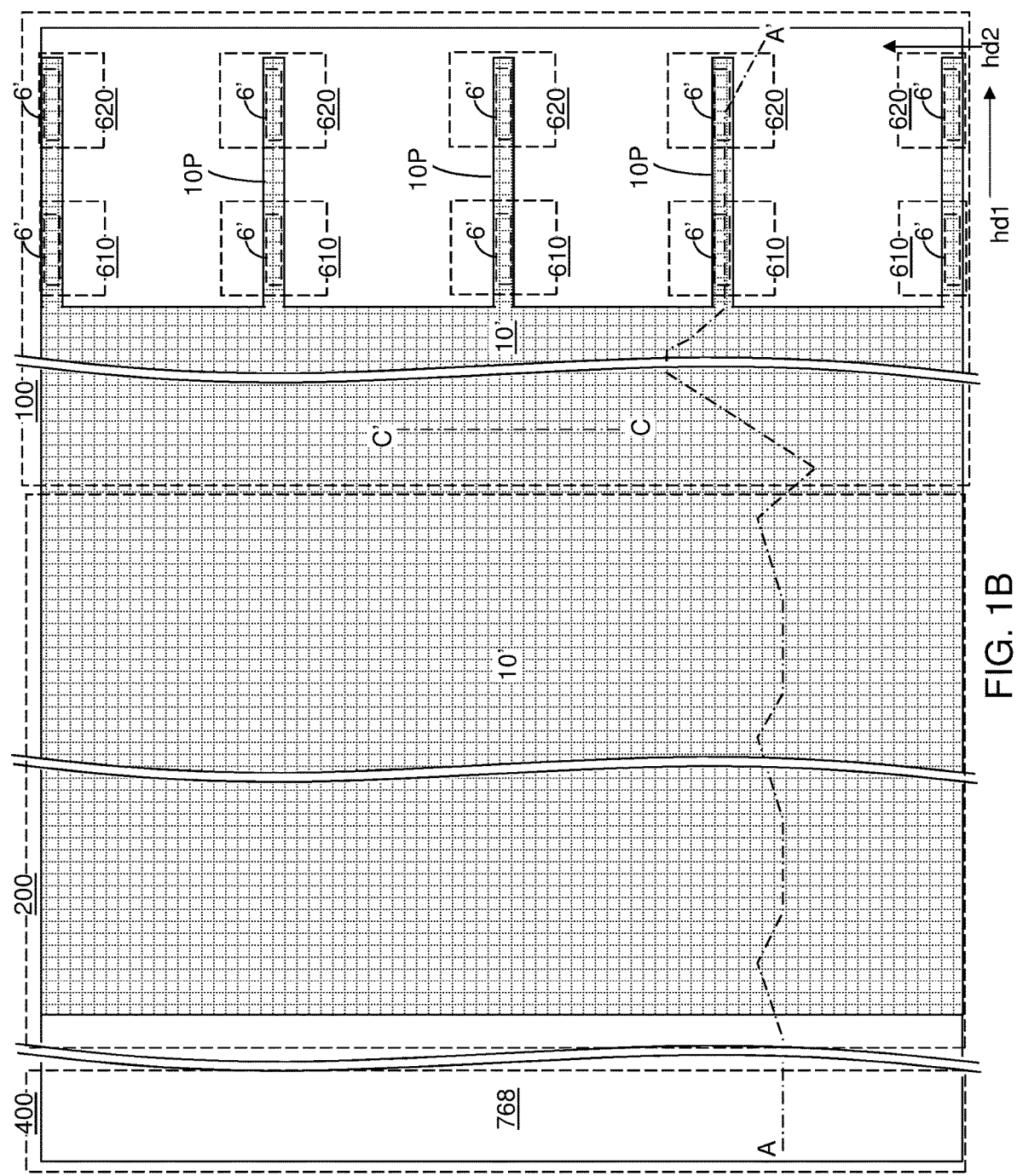
FIG. 1B is a top-down view of the first exemplary structure of FIG. 1A. The zig-zag vertical plane A-A' is the plane of the vertical cross-sectional view of FIG. 1A.
Figure 1C:
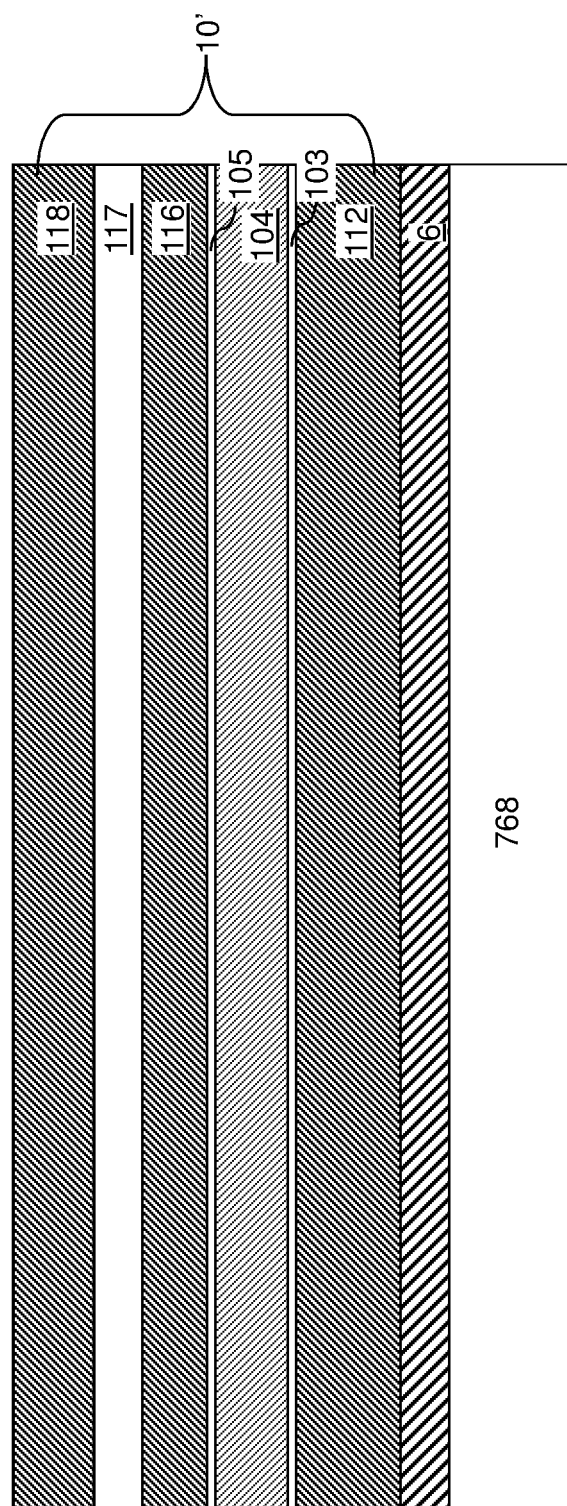
FIG. 1C is a magnified view of the in-process source-level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and a complementary metal oxide semiconductor (CMOS) circuitry 700 formed thereupon. The semiconductor substrate 8 includes a substrate semiconductor layer 9 at least at an upper portion thereof. Various doped wells 61 can be formed in upper portions of the substrate semiconductor layer 9. Shallow trench isolation structures 720 can be formed in an upper portion of the substrate semiconductor layer 9 to provide electrical isolation among the semiconductor devices. The CMOS circuitry 700 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The CMOS circuitry 700 can include additional semiconductor devices in addition to p-type field effect transistors and n-type field effect transistors, which can be employed to support operation of a memory structure to be subsequently formed. The CMOS circuitry 700 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one diode (610, 620) can be formed on the semiconductor substrate 8. In one embodiment, the at least one diode (610, 620) can comprise a plurality of diodes (610, 620) that are distributed over a memory array region 100, which is a region in which a three-dimensional array of memory cells located in memory stack structures is to be subsequently formed. In one embodiment, the at least one diode (610, 620) can include pairs of a p-n diode 610 and an n-p diode 620. As used herein, a "p-n diode" refers to a diode having an n-doped semiconductor material portion that is electrically grounded directly or through an intervening resistive (Ohmic) element. As used herein, an "n-p diode" refers to a diode having a p-doped semiconductor material portion that is electrically grounded directly or through an intervening resistive (Ohmic) element. In a non-limiting illustrative example, each pair of a p-n diode 610 and an n-p diode 620 can be laterally spaced apart along a first horizontal direction hd1, and pairs of a p-n diode 610 and an n-p diode 620 can be laterally spaced apart among one another along a second horizontal direction hd2 that is perpendicular to the first horizontal direction. The pairs of a p-n diode 610 and an n-p diode 620 may be distributed over regions in which backside trenches are to be subsequently formed at regular intervals. In one embodiment, the pairs of a p-n diode 610 and an n-p diode 620 may be formed as a one-dimensional periodic array that is repeated along the second horizontal direction hd2.

Each p-n diode 610 and each n-p diode 620 include at least one doped portion of the semiconductor material within the semiconductor substrate 8. For example, each p-n diode 610 can include a vertical stack of a p-doped semiconductor material portion 612 and an n-doped semiconductor material portion 614. The n-doped semiconductor material portion 614 can be a heavily n-doped well having a dopant concentration in a range from $1.0 \times 10^{20}/cm^3$ to $2.0 \times 10^{21}/cm^3$, and can have a sufficiently large area to function as an electron reservoir in case a respective p-n diode 610 is turned on. In one embodiment, the n-doped semiconductor material portions 614 may comprise a single continuous n-doped well that is electrically grounded, for example, by direct contact with the substrate semiconductor layer 9. Each p-doped semiconductor material portion 612 of the p-n diodes may be implemented as a p-doped surface portion of the semiconductor material of the substrate semiconductor layer 9, or may be formed by implanting p-type dopants into the substrate 8 or by depositing a p-doped semiconductor material (such as p-doped polysilicon) on an n-doped surface portion (which can be a portion of an n-doped semiconductor material portion 614) of the substrate semiconductor layer 9. In one embodiment, each p-n diode 610 can comprise vertical stack of a p-doped semiconductor material portion 612 overlying an n-doped semiconductor material portion 614 that are located within the semiconductor substrate 8.

Each n-p diode 620 can include a vertical stack of an n-doped semiconductor material portion 624 and a p-doped semiconductor material portion 622. The p-doped semiconductor material portion 622 can be a heavily p-doped region on a p-doped semiconductor material layer within the substrate semiconductor layer 9, and can have a dopant concentration in a range from $1.0 \times 10^{20}/cm^3$ to $2.0 \times 10^{21}/cm^3$. The p-doped semiconductor material portion 622 can have a sufficiently large area to function as a hole reservoir in case a respective n-p diode 620 is turned on. In one embodiment, the p-doped semiconductor material portions 622 may comprise a heavily p-doped region contacting the substrate semiconductor layer 9. Alternatively, the p-doped semiconductor material portion 622 may be a portion of the substrate semiconductor layer 9 that has a p-type doping. Each n-doped semiconductor material portion 624 of the n-p diodes 620 may be implemented as an n-doped surface portion of the semiconductor material of the substrate semiconductor layer 9, or may be formed by implanting n-type dopants into the substrate 8 or by depositing an n-doped semiconductor material (such as n-doped polysilicon) on a p-doped surface portion (which can be a portion of a p-doped semiconductor material portion 622) of the substrate semiconductor layer 9. In one embodiment, each n-p diode 620 can comprise a vertical stack of an n-doped semiconductor material portion 624 overlying a p-doped semiconductor material portion 622 that are located within the semiconductor substrate 8.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed. Further, the lower-level metal interconnect structures 780 can include diode connection via structures 792 that are formed through the silicon nitride layer 766 on a top surface of a respective one of the landing-pad-level metal line structures 788.

The landing-pad-level metal line structures 788 can be formed within a topmost dielectric material layer of the first dielectric material layers 764 (which can be a plurality of dielectric material layers). The landing-pad-level metal line structures 788 can be employed as landing pads for metal via structures to be subsequently formed thereabove. Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

A set (630, 640) of lower-level metal interconnect structures 780 can be formed on each of the p-n diodes 610 and the n-p diodes 620. Each set (630, 640) of lower-level metal interconnect structures 780 is electrically shorted to a top doped semiconductor material portion of a respective diode (610, 620). For example, each first set 630 of lower-level metal interconnect structures 780 is electrically shorted to a p-doped semiconductor material portion 612 of a p-n diode 610, and each second set 640 of lower-level metal interconnect structures 780 is electrically shorted to an n-doped semiconductor material portion 624 of an n-p diode 620. Each first set 630 of lower-level metal interconnect structures 780 electrically shorted to a p-doped semiconductor material portion 612 of a p-n diode 610 is also referred to as a first diode interconnect assembly 630, and each set 640 of lower-level metal interconnect structures 780 electrically shorted to an n-doped semiconductor material portion 624 of an n-p diode 620 is herein referred to as a second diode interconnect assembly 640.

Each of the first diode interconnect assemblies 630 and the second diode interconnect assemblies 640 can include a respective diode connection via structure 792 that extends through the silicon nitride layer 766 and contacts a respective landing-pad-level metal line structures 788. The diode connection via structures 792 can be formed above the level of the landing-pad-level metal line structures 788 within the memory array region 100.

A metallic material layer can be deposited over, or within patterned recesses of, the at least one second dielectric material layer 768, and can be patterned to provide a conductive plate layer 6 and diode connection line structures 6'. The metallic material layer can include a metallic compound material such as a conductive metallic nitride (e.g., TiN), a metal (e.g., W) and/or a metal alloy (e.g., tungsten silicide). The conductive plate layer 6 can extend through memory array region 100 and a staircase region 200, which is provided adjacent to the memory array region 100.

The conductive plate layer 6 provides a high conductivity conduction path for electrical current that flows into, or out of, the in-process source-level material layers 10'. The conductive plate layer 6 extends over areas in which memory stack structures are to be subsequently formed and areas in which stepped surfaces of alternating stacks of insulating layers and electrically conductive layers are to be subsequently formed.

The diode connection line structures 6' can be discrete structures that contact a top surface of a respective one of the diode connection via structures 792. The diode connection line structures 6' are components of the lower-level metal interconnect structures 780 that contact the diode connection via structures 792. Each diode connection line structure 6' can be electrically shorted to a respective p-doped semiconductor material portion 612 or a respective n-doped semiconductor material portion 624. The conductive plate layer 6 and the diode connection line structures 6' may include, for example, a tungsten or a tungsten silicide layer having a thickness in a range from 3 nm to 100 nm, although lesser and greater thicknesses can also be employed. The conductive plate layer 6 may function as a component of a source layer in the completed device. In addition, the conductive plate layer 6 may function as an etch stop layer. The thickness of the conductive plate layer 6 and the diode connection line structures 6' may be in a range from 5 nm to 100 nm, although lesser and greater thicknesses can also be employed.

Material layers including at least one doped semiconductor material layer can be deposited over the conductive plate layer 6 and the diode connection line structures 6' and can be patterned to form in-process source-level material layers 10'. The in-process source-level material layers 10' can be formed directly on top surfaces of the conductive plate layer 6 and diode connection line structures 6'. The in-process source-level material layers 10' are formed in the memory array region 100 and a staircase region 200, which is provided adjacent to the memory array region 100. The conductive plate layer 6 provides a high conductivity conduction path for electrical current that flows into, or out of, the in-process source-level material layers 10'.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-select-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The conductive plate layer 6 and the in-process source-level material layers 10' can be patterned such that an opening extends over a staircase region 200 in which contact via structures contacting word line electrically conductive layers are to be subsequently formed. In one embodiment, the staircase region 200 can be laterally spaced from the memory array region 100 along a first horizontal direction hd1 (e.g., word line direction). A horizontal direction that is perpendicular to the first horizontal direction hd1 is herein referred to as a second horizontal direction hd2 (e.g., bit line direction). In one embodiment, additional openings in the conductive plate layer 6 and the in-process source-level material layers 10' can be formed within the area of a memory array region 100, in which a three-dimensional memory array including memory stack structures is to be subsequently formed. A peripheral region 400 that is subsequently filled with a field dielectric material portion can be provided adjacent to the staircase region 200.

The in-process source-level material layers 10' can include laterally protruding strip portions 10P that extend over the diode connection line structures 6'. In one embodiment, the laterally protruding strip portions 10P of the in-process source-level material layers 10' can laterally extend along the first horizontal direction hd1 and can be laterally spaced apart with periodicity along the second horizontal direction hd2. In one embodiment, the laterally protruding strip portions 10P of the in-process source-level material layers 10' can be provided in areas in which backside trenches are to be subsequently formed.

The CMOS circuitry 700 can include peripheral devices for the memory-level assembly to be subsequently formed. The lower-level metal interconnect structures 780 are embedded in the lower-level dielectric layers 760. The combination of the lower-level dielectric layers 760 and the lower-level metal interconnect structures 780 overlie the CMOS circuitry 700.

The lower-level metal interconnect structures 780 can be electrically shorted to active nodes (e.g., transistor active regions 742 or gate electrodes 754) of the CMOS circuitry 700 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Each of the first diode interconnect assemblies 630 and the second diode interconnect assemblies 640 can include a respective diode connection line structure 6', a respective diode connection via structure 792, and a respective subset of the lower-level metal interconnect structures 780. Each of the first diode interconnect assemblies 630 and the second diode interconnect assemblies 640 provides an electrically conductive path between a respective diode (610, 620) and the in-process source-level material layers 10'. The diode connection line structures 6' are laterally spaced from the conductive plate layer 6.

Figure 1D:
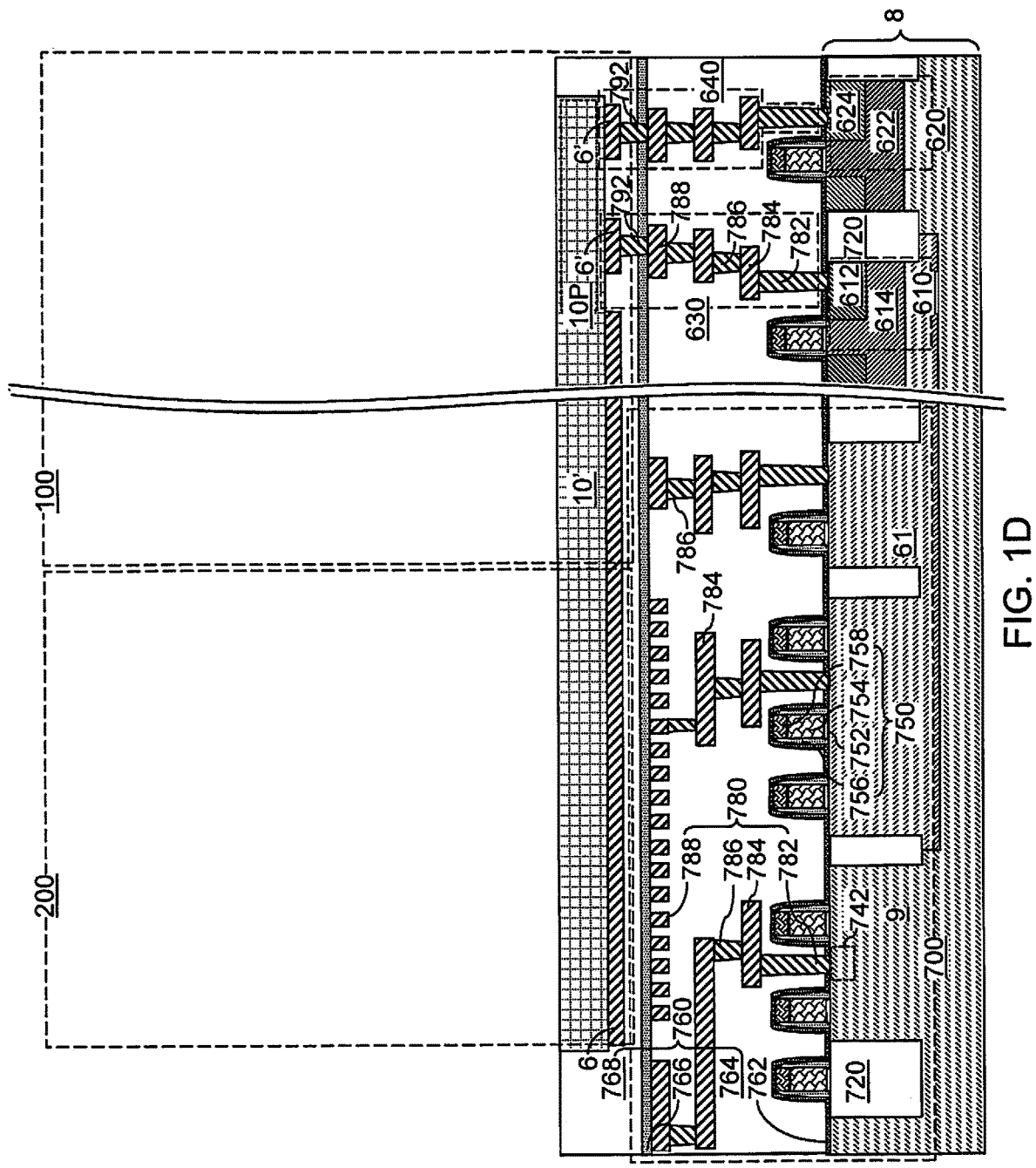
FIG. 1D is a vertical cross-sectional view of an alternative embodiment of the first exemplary structure at the processing steps of FIGS. 1A-1C.

Referring to FIG. 1D, an alternative embodiment of the first exemplary structure of FIGS. 1A-1C is illustrated, which can be derived from the first exemplary structure of FIGS. 1A-1C by employing components of field effect transistors as diodes. In this case, at least one p-doped semiconductor material portion 612 of the p-n diodes 610 may be formed as a transistor active region (such as a source region or a drain region) of a p-type field effect transistor, which may, or may not be electrically connected at the gate electrode and/or at the other transistor active region. At least one n-doped semiconductor material portion 614 of the p-n diodes 610 may be a body region of the respective p-type field effect transistor, which may have the same dopant concentration as, or a higher dopant concentration, than an underlying semiconductor material portion, which may be an n-doped well 61 or an n-doped substrate semiconductor layer 9. Alternatively or additionally, at least one n-doped semiconductor material portion 624 of the n-p diodes 620 may be formed as a transistor active region (such as a source region or a drain region) of an n-type field effect transistor, which may, or may not be electrically connected at the gate electrode and/or at the other transistor active region. At least one p-doped semiconductor material portion 622 of the n-p diodes 620 may be a body region of the respective n-type field effect transistor, which may have the same dopant concentration as, or a higher dopant concentration, than an underlying semiconductor material portion, which may be a p-doped well 61 or a p-doped substrate semiconductor layer 9. Generally, any combination of a p-doped semiconductor material portion and an n-doped semiconductor material portion that directly contact each other or which include an intervening intrinsic region (i.e., to form a p-i-n or n-i-p diode) can be employed as the diode.

Figure 2:
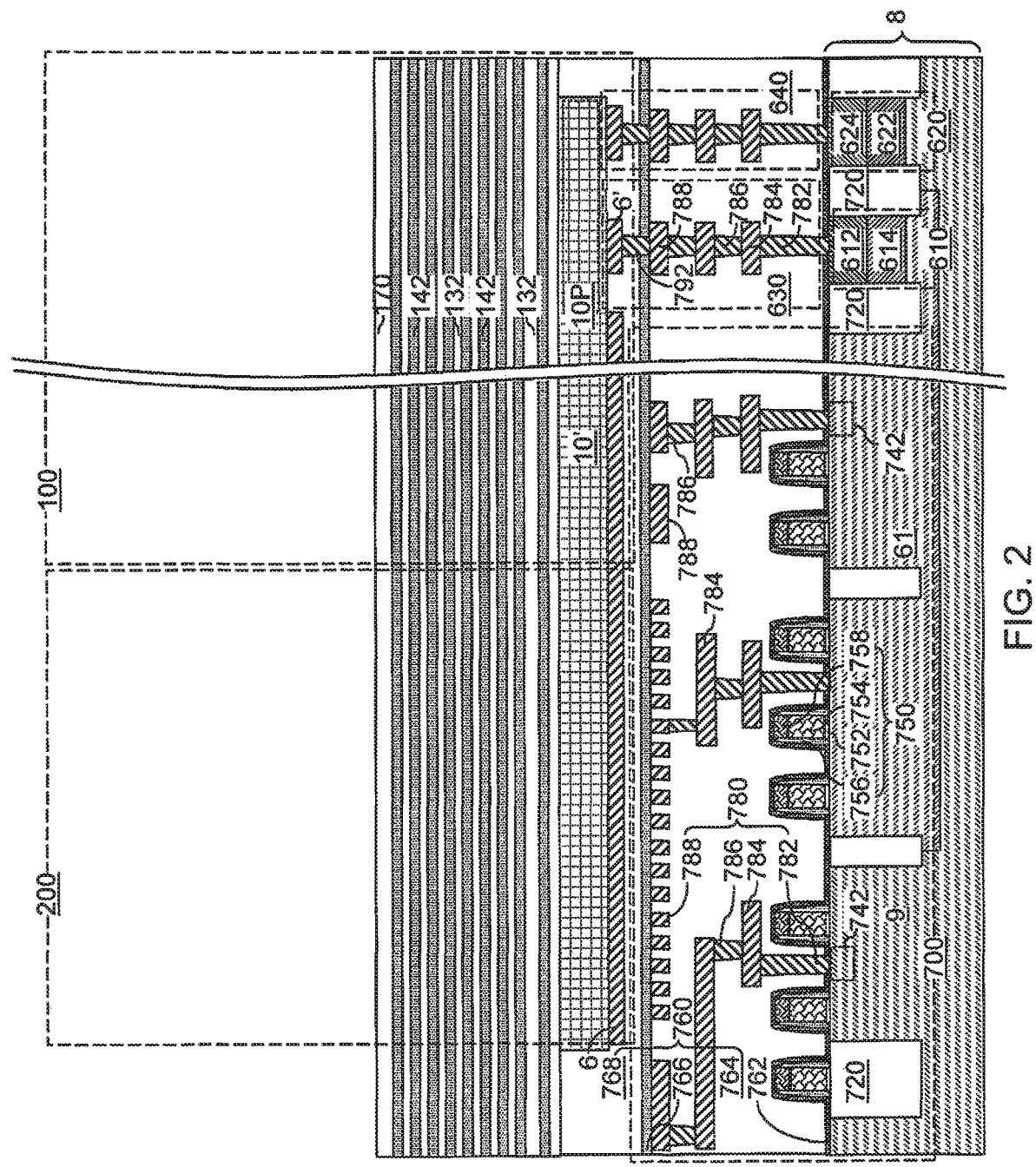
FIG. 2 is a vertical cross-sectional view of the first exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3A:
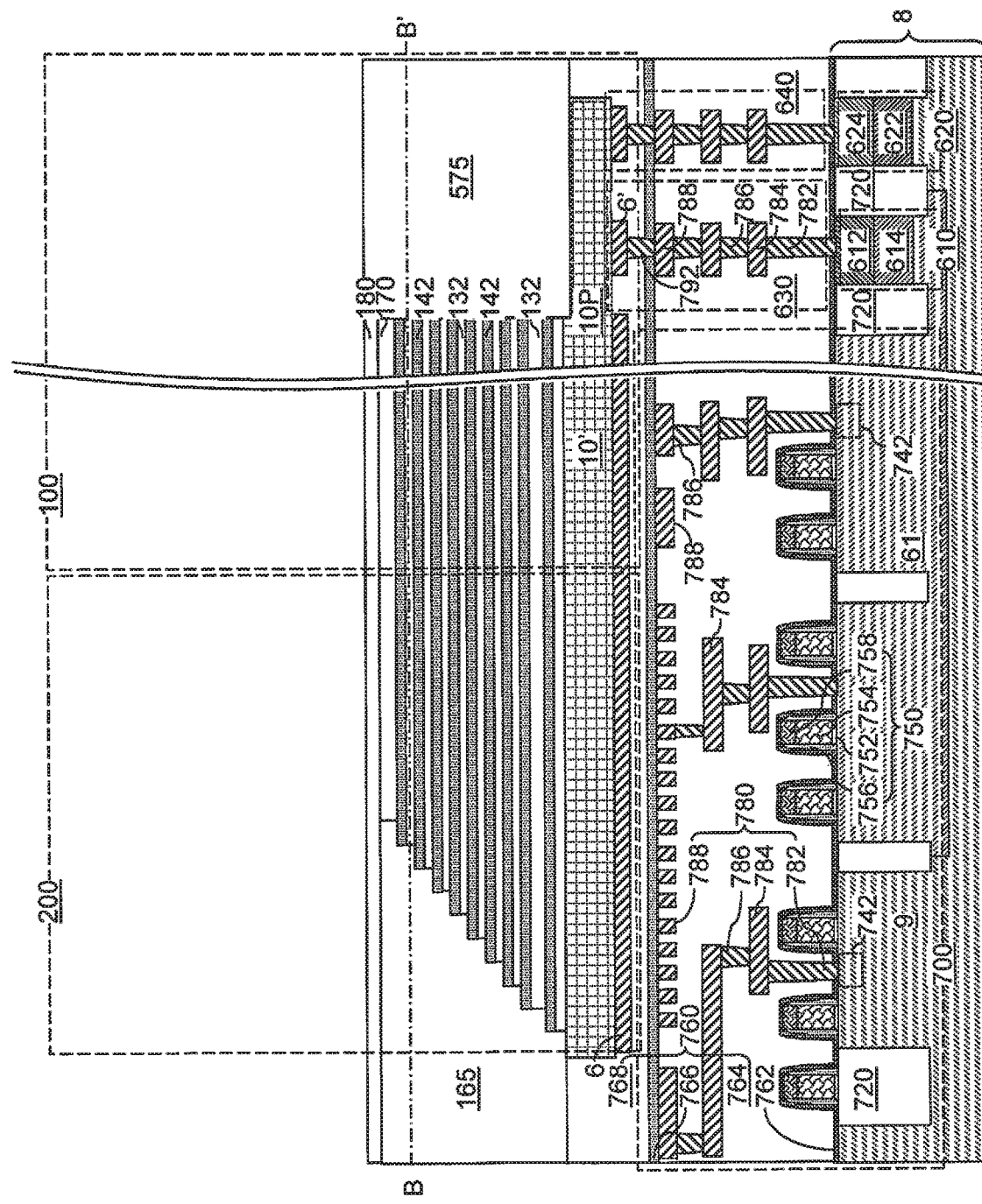
FIG. 3A is a vertical cross-sectional view of the first exemplary structure after patterning a first-tier staircase region, a first retro-stepped dielectric material portion, an inter-tier dielectric layer, and first dielectric pillar portions according to an embodiment of the present disclosure.
Figure 3B:
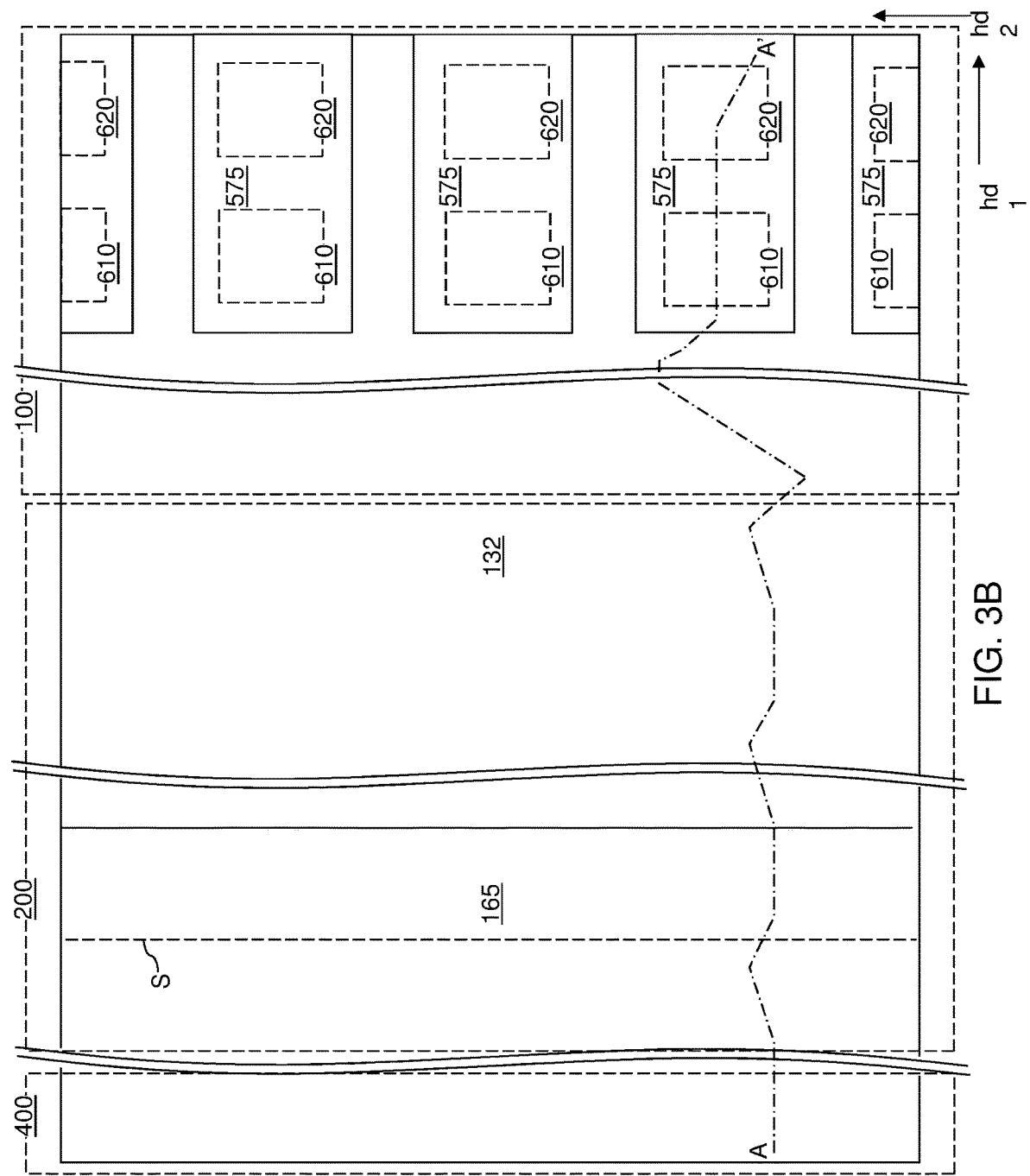
FIG. 3B is a top-down view of the first exemplary structure of FIG. 3A. The zig-zag vertical plane A-A' is the plane of the vertical cross-sectional view of FIG. 3A.

Referring to FIGS. 3A and 3B, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity. Locations of steps S in the first-tier alternating stack (132, 142) are illustrated as dotted lines.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

A photoresist layer can be applied over the inter-tier dielectric layer 180 and can be lithographically patterned to form openings in areas of the memory array region 100 that overlie the diodes (610, 620) and the diode interconnect assemblies (630, 640). The pattern in the photoresist layer can be transferred through the first-tier structure (132, 142, 170, 165) by an anisotropic etch process to form pillar cavities that extend through the first-tier structure (132, 142, 170, 165). A top surface of the laterally protruding strip portions 10P of the in-process source-level material layers 10' can be physically exposed at the bottom of the pillar cavities. In one optional embodiment, the top surface of the laterally protruding strip portions 10P of the in-process source-level material layers 10' can be recessed in the pillar cavities below the top surface of the other portions in-process source-level material layers 10'. The diodes (610, 620) and the diode interconnect assemblies (630, 640) can provide electrically conductive paths for electrical charges that can locally accumulate in the first exemplary structure during the anisotropic etch process that etches the pillar cavities. Specifically, electrical charges that accumulate in the first-tier structure (132, 142, 170, 165) (such as the positive electrical charge (e.g., holes) generated by the positively charged plasma ions that impinge in the etched area of the first-tier structure (132, 142, 170, 165)), and can be discharged to electrical ground through the p-n diodes 610 and the first diode interconnect assemblies 630. Any negative electrical charge (e.g., electrons) that accumulates in the first-tier structure (132, 142, 170, 165) can be discharged to electrical ground through the n-p diodes 620 and the second diode interconnect assemblies 640.

A dielectric fill material such as silicon oxide can be deposited into the pillar cavities to form first dielectric pillar structures 575. In one embodiment, the first dielectric pillar structures 575 can have straight sidewalls that extend through the first-tier structure (132, 142, 170, 165) and the inter-tier dielectric layer 180. A bottom surface of each first dielectric pillar structure 575 can contact a top surface of laterally protruding strip portions 10P of the in-process source-level material layers 10' and the at least one second dielectric layer 768. A top surface of each first dielectric pillar structure 575 can be coplanar with the top surface of the inter-tier dielectric layer 180.

Figure 4A:
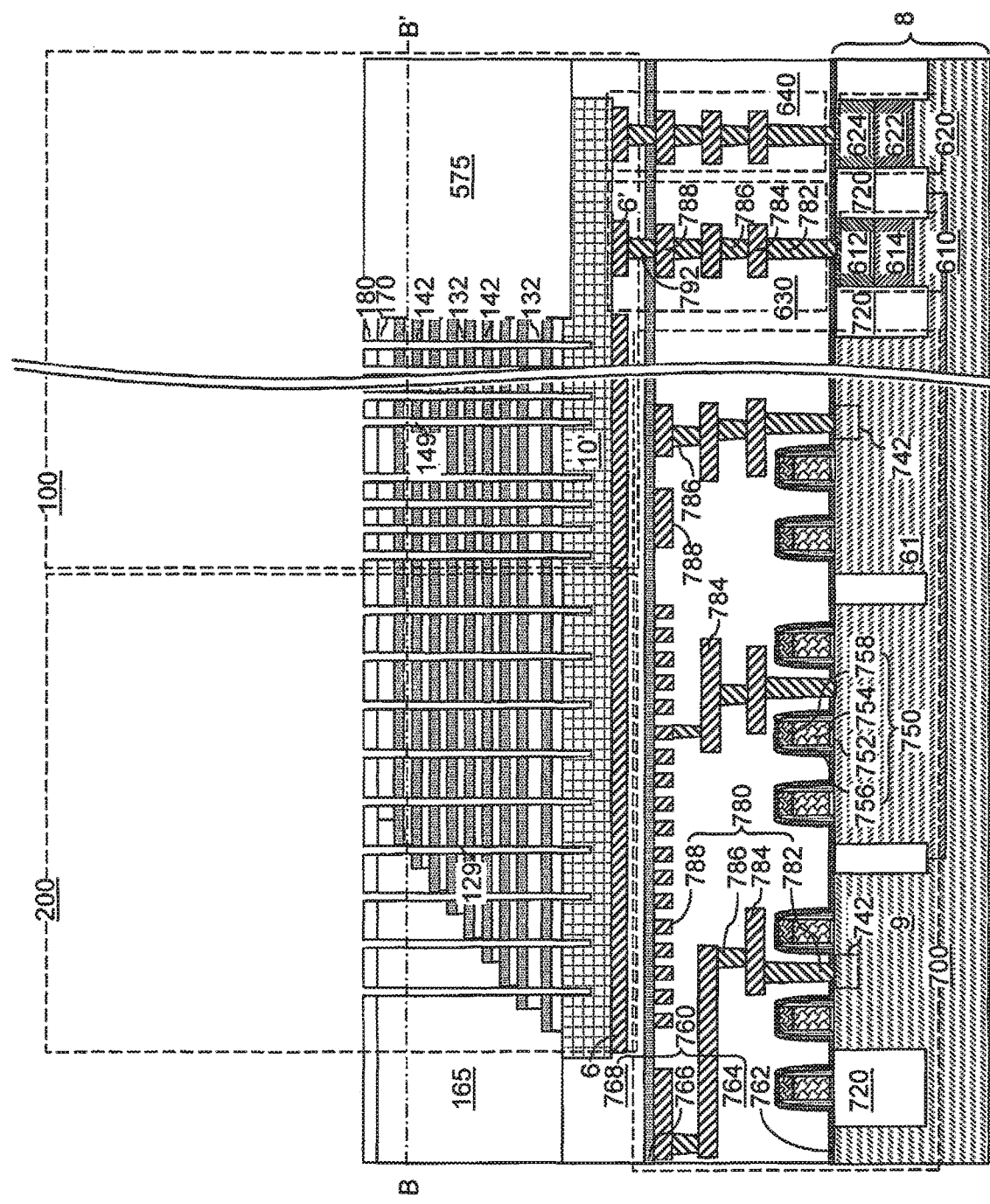
FIG. 4A is a vertical cross-sectional view of the first exemplary structure after formation of first-tier memory openings and first-tier support openings according to an embodiment of the present disclosure.
Figure 4B:
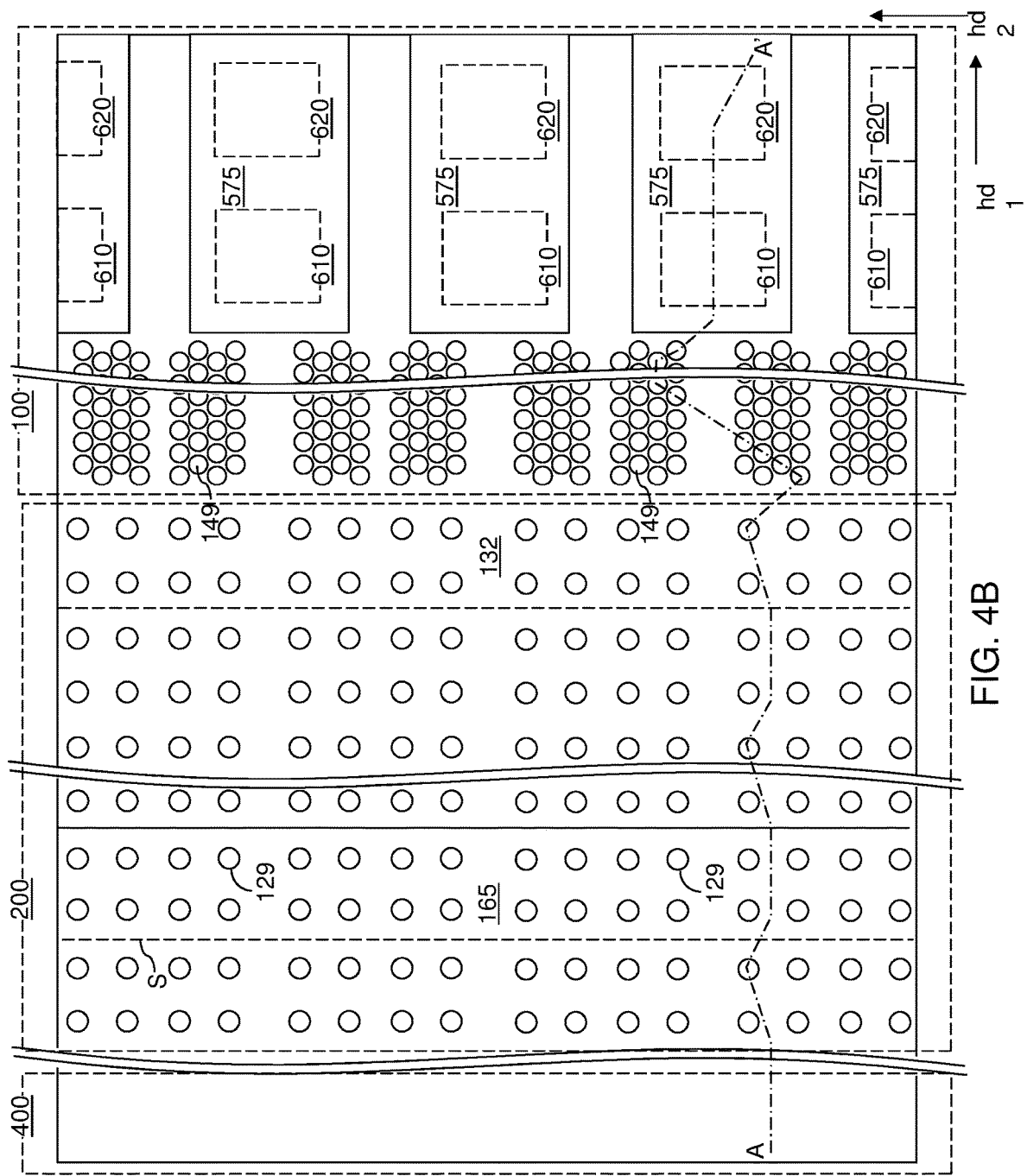
FIG. 4B is a top-down view of the first exemplary structure of FIG. 4A. The zig-zag vertical plane A-A' corresponds to the plane of the vertical cross-sectional view of FIG. 4A.

Referring to FIGS. 4A and 4B, first-tier openings (149, 129) can be formed through the inter-tier dielectric layer 180 and the first-tier structure (132, 142, 170, 165, 575) and into the in-process source-level material layers 10'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165, 575) and into the in-process source-level material layers 10' by a first anisotropic etch process to form the first-tier openings (149, 129) concurrently, i.e., during the first anisotropic etch process.

The first-tier openings (149, 129) can include first-tier memory openings 149 and first-tier support openings 129. The first-tier memory openings 149 are openings that are formed in the memory array region 100 through each layer within the first alternating stack (132, 142) and are subsequently employed to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149. In one embodiment, the first-tier memory openings 149 are located on both sides of each first dielectric pillar structure 575 in the first horizontal direction hd1 in the memory array region 100.

The first-tier support openings 129 are openings that are formed in the staircase region 200 and are subsequently employed to form support structures that are subsequently employed to provide structural support to the second exemplary structure during replacement of sacrificial material layers with electrically conductive layers. In case the first spacer materials are formed as first electrically conductive layers, the first-tier support openings 129 can be omitted. A subset of the first-tier support openings 129 can be formed through horizontal surfaces of the first stepped surfaces of the first alternating stack (132, 142).

The first anisotropic etch process can comprise a plasma etch process, which is herein referred to as a first plasma etch process. The at least one doped semiconductor material layer within the in-process source-level material layers 10', the first and second diode interconnect assemblies (630, 640) including a subset of the lower-level metal interconnect structures 780, and the diodes (610, 620) provide a discharge path for electrical charges that accumulate in regions of the first-tier memory openings 149 and in the first-tier support openings 129 during the first plasma etch process.

The bottom surfaces of the first-tier memory openings 149 and the first-tier support openings 129 can be recessed surfaces of the lower source-level material layer 112. The photoresist layer can be subsequently removed, for example, by ashing. Optionally, the portions of the first-tier memory openings 149 and the first-tier support openings 129 at the level of the inter-tier dielectric layer 180 can be laterally expanded by an isotropic etch process.

FIGS. 5A and 5B illustrate a processing sequence for laterally expanding portions of the first-tier memory openings 149 at the level of the inter-tier dielectric layer 180. FIG. 5A illustrates a first-tier memory opening 149 immediately after the anisotropic etch that forms the first-tier memory openings 149. The inter-tier dielectric layer 180 can comprise a dielectric material (such as borosilicate glass) having a greater etch rate than the first insulating layers 132 (that can include undoped silicate glass). Referring to FIG. 5B, an isotropic etch (such as a wet etch employing HF) can be employed to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 6:
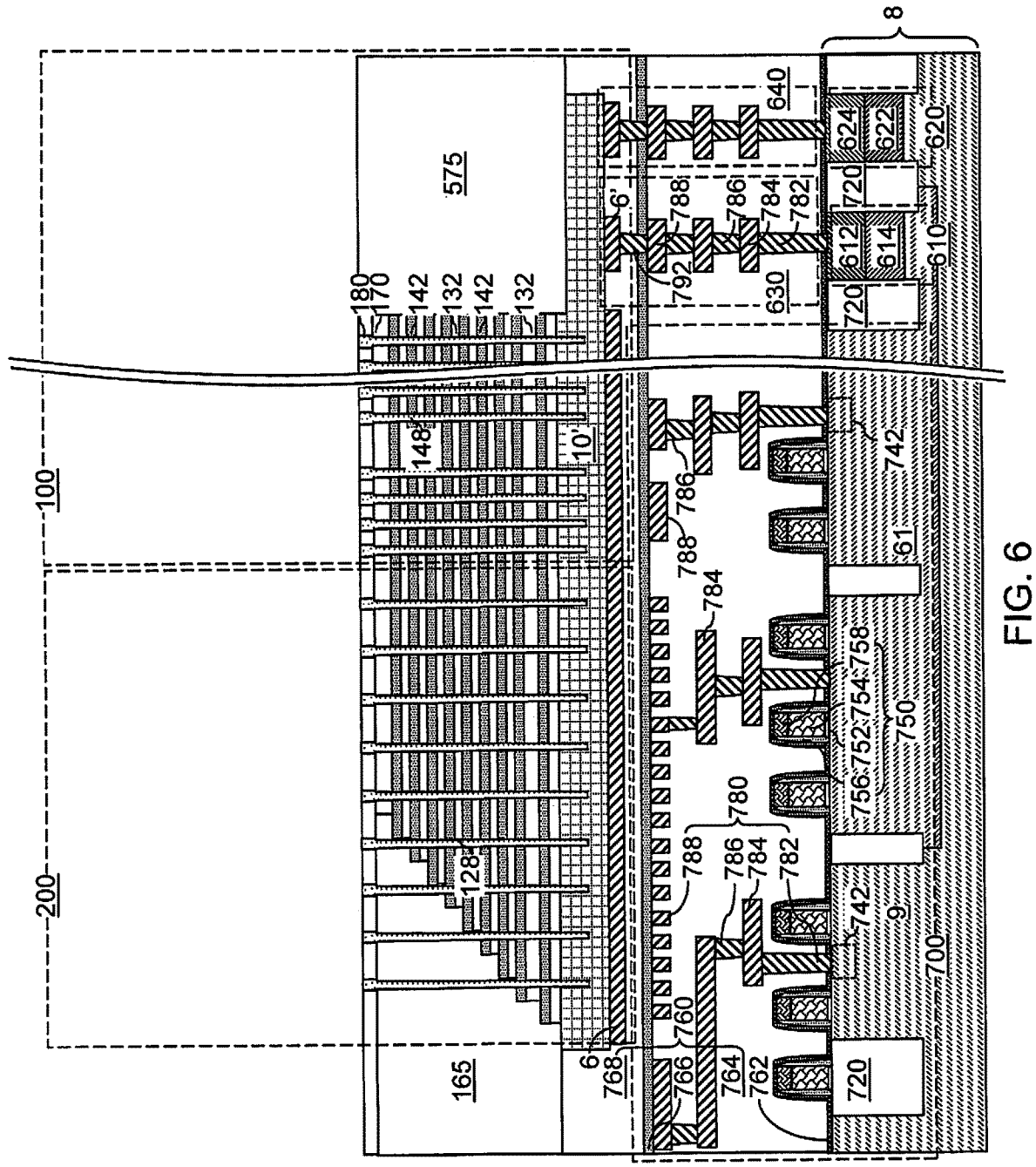
FIG. 6 is a vertical cross-sectional view of the first exemplary structure after formation of sacrificial memory opening fill portions and first-tier support opening fill portions according to an embodiment of the present disclosure.

Referring to FIG. 6, sacrificial first-tier opening fill portions (148, 128) can be formed in the first-tier openings (149, 129). For example, a sacrificial fill material is deposited concurrently deposited in each of the first-tier openings (149, 129). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first-tier alternating stack (132, 142), such as from above the inter-tier dielectric layer 180. For example, the sacrificial fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 7:
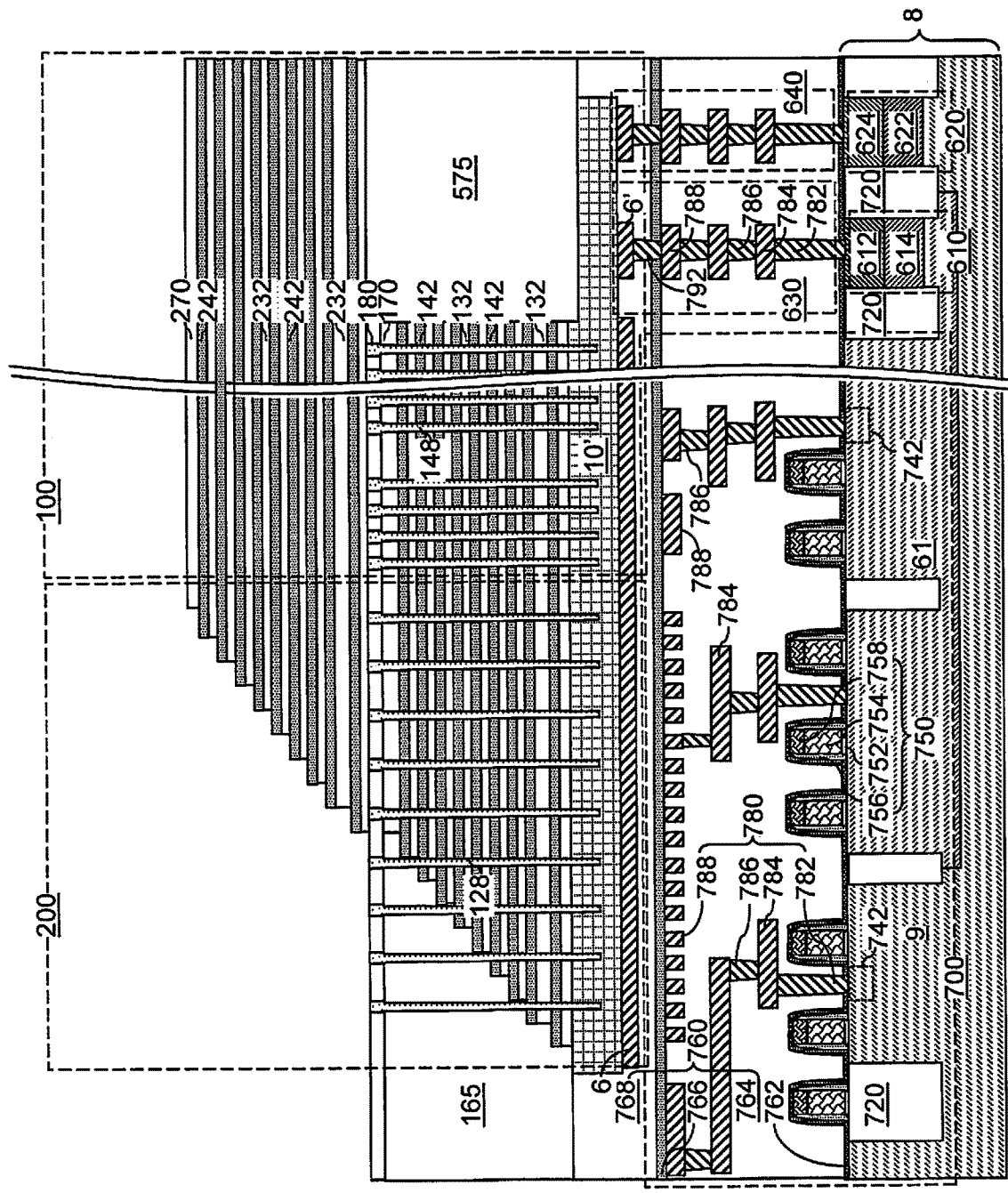
FIG. 7 is a vertical cross-sectional view of the first exemplary structure after formation of a second-tier alternating stack of second insulating layers and second spacer material layers and second stepped surfaces according to an embodiment of the present disclosure.

Referring to FIG. 7, a second-tier structure can be formed over the first-tier structure (132, 142, 170, 165, 575, 148, 128). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200. Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Figure 8A:
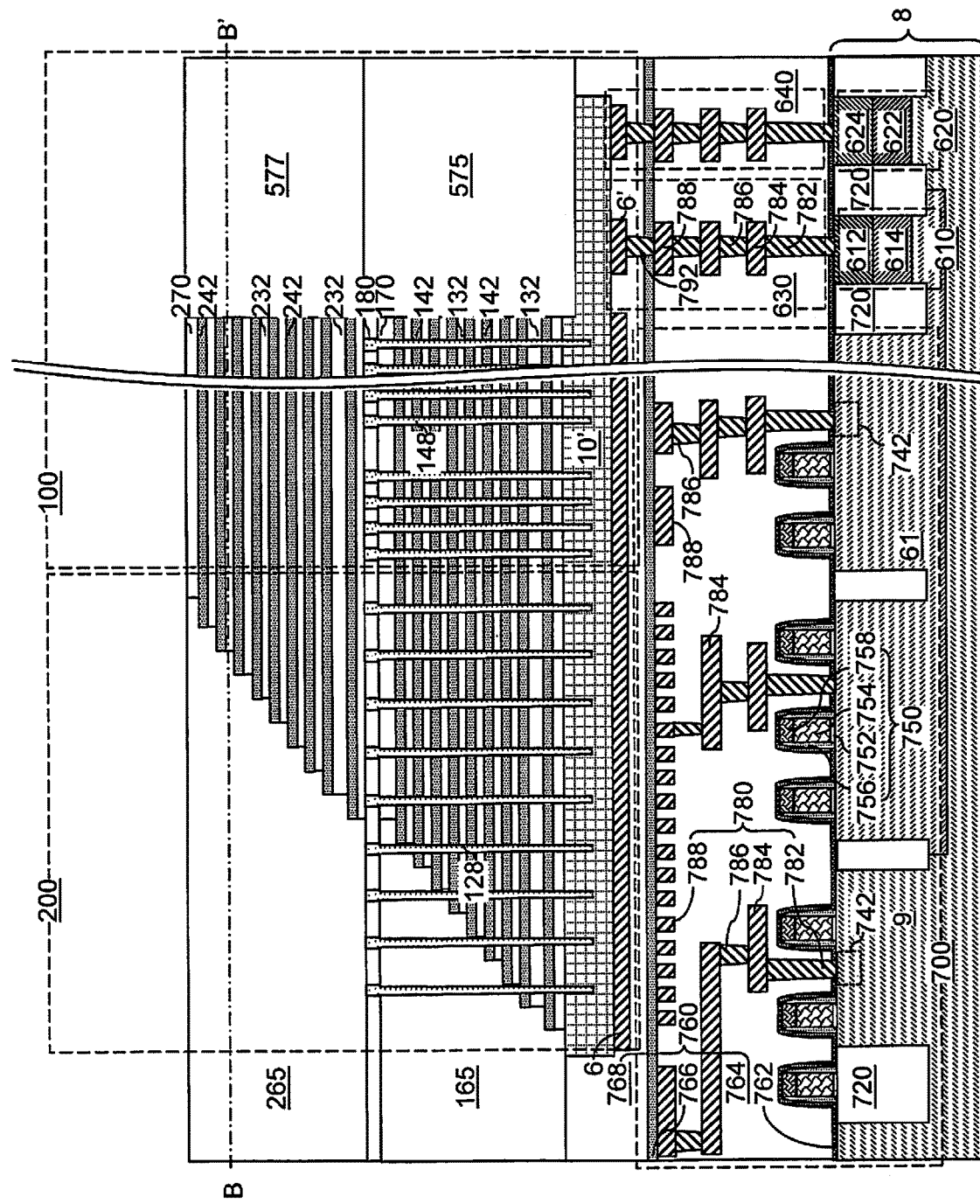
FIG. 8A is a vertical cross-sectional view of the first exemplary structure after formation of a second retro-stepped dielectric material portion and second dielectric pillar portions and dielectric isolation structures according to an embodiment of the present disclosure.
Figure 8B:
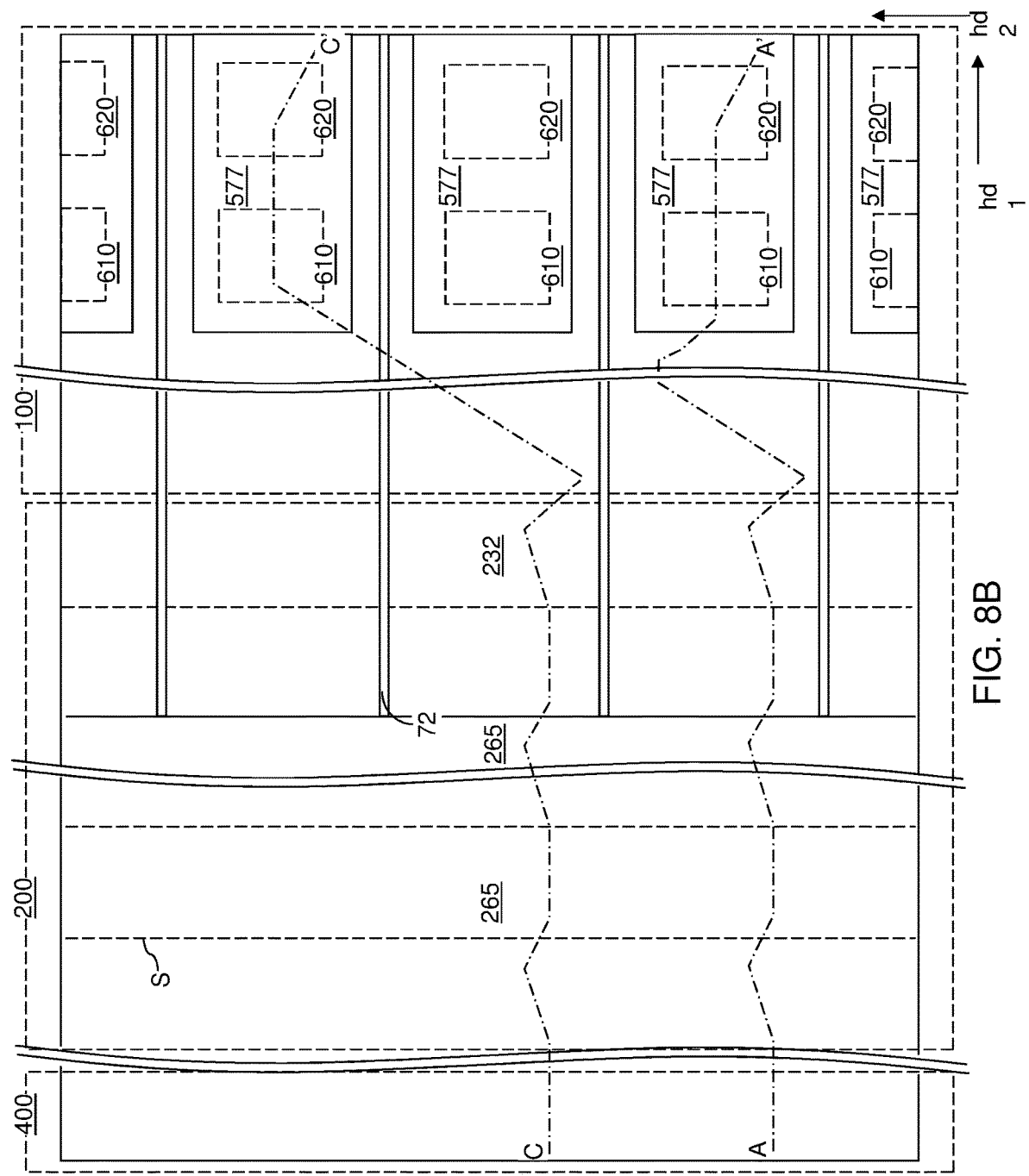
FIG. 8B is a top-down view of the first exemplary structure of FIG. 8A. The zig-zag vertical plane A-A' corresponds to the plane of the vertical cross-sectional view of FIG. 8A.
Figure 8C:
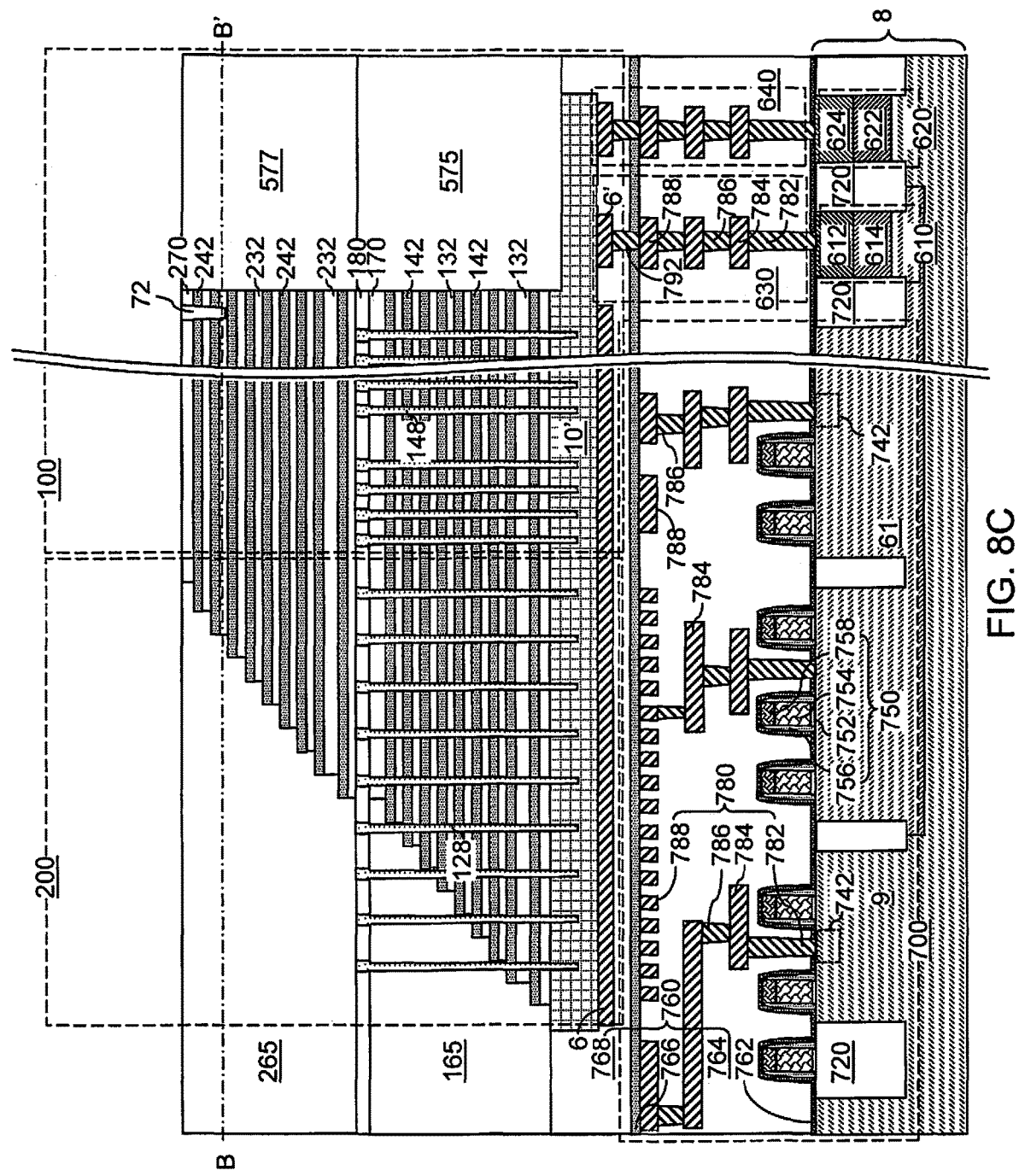
FIG. 8C is a vertical cross-sectional view along the zig-zag vertical plane C-C' of the first exemplary structure of FIG. 8B.

Referring to FIGS. 8A-8C, a photoresist layer can be applied over the second insulating cap layer 270 and the second retro-stepped dielectric material portion 265 and can be lithographically patterned to form openings in areas that overlie the first dielectric pillar structures 575. In one embodiment, the areas of the openings may be the same as the areas of the first dielectric pillar structures 575. The pattern in the photoresist layer can be transferred through the second-tier structure (232, 242, 270, 265) by an anisotropic etch process to form pillar cavities that extend through the second-tier structure (232, 242, 270, 265). A top surface of an underlying first dielectric pillar structure 575 can be physically exposed at the bottom of each pillar cavity. The diodes (610, 620) and the diode interconnect assemblies (630, 640) can provide electrically conductive paths that can accumulate in the first exemplary structure during the anisotropic etch process that etches the pillar cavities. Specifically, electrical charges that accumulate in the second-tier structure (232, 242, 270, 265) can diffuse downward through the first-tier structure (132, 142, 170, 165, 575, 148, 128) (such as the positive electrical charge generated by the positively charged plasma ions that impinge in the etched area of the second-tier structure (232, 242, 270, 265)), and can be discharged to electrical ground through the p-n diodes 610 and the first diode interconnect assemblies 630. Any negative electrical charge that accumulates in the second-tier structure (232, 242, 270, 265) can be discharged to electrical ground through the n-p diodes 620 and the second diode interconnect assemblies 640.

A dielectric fill material such as silicon oxide can be deposited into the pillar cavities to form second dielectric pillar structures 577. In one embodiment, the second dielectric pillar structures 577 can have straight sidewalls that extend through the second-tier structure (232, 242, 270, 265). A bottom surface of each second dielectric pillar structure 577 can contact a top surface of an underlying first dielectric pillar structure 575. A top surface of each second dielectric pillar structure 577 can be coplanar with the top surface of the second insulating cap layer 270.

Optionally, drain-select-level isolation structures 72 can be formed through the second insulating cap layer 270 and through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Figure 9A:
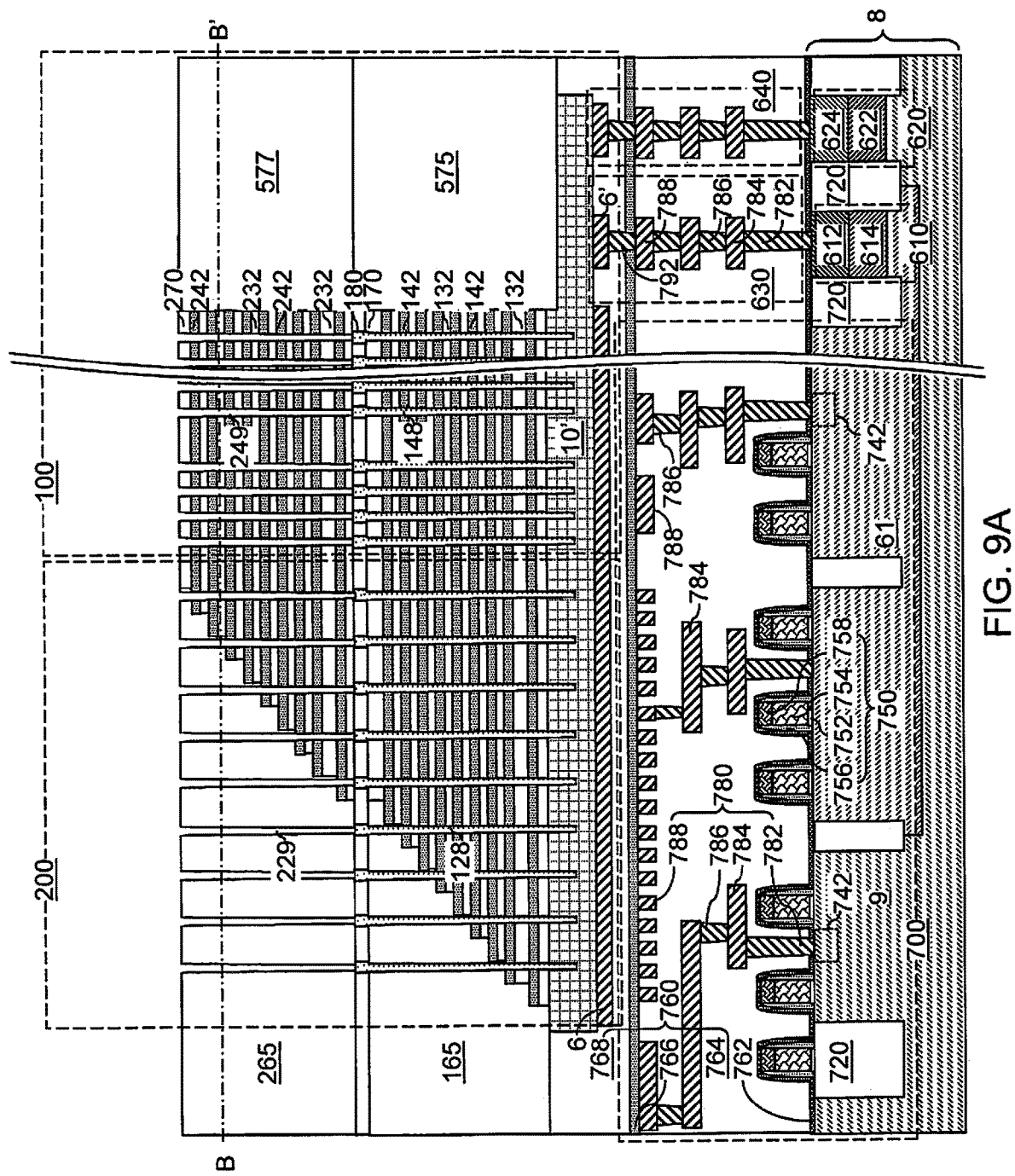
FIG. 9A is a vertical cross-sectional view of the first exemplary structure after formation of second-tier memory openings and second-tier support openings according to an embodiment of the present disclosure.
Figure 9B:
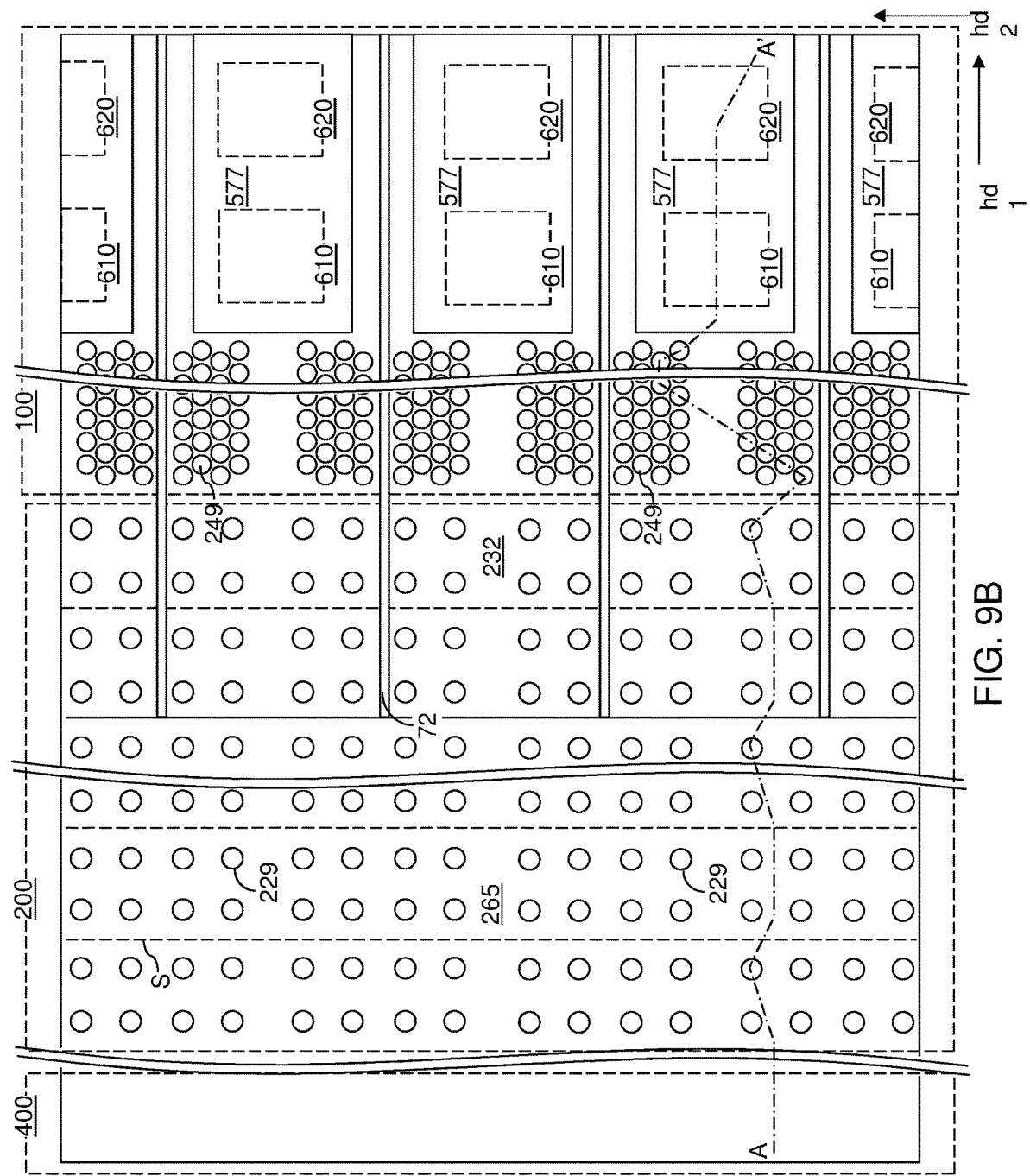
FIG. 9B is a horizontal cross-sectional of the first exemplary structure along the horizontal plane B-B' of FIG. 9A. The zig-zag vertical plane A-A' corresponds to the plane of the vertical cross-sectional view of FIG. 9A.

Referring to FIGS. 9A and 9B, second-tier openings (249, 229) can be formed through the second-tier structure (232, 242, 265, 270, 72, 577). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask employed to pattern the first-tier openings (149, 129) can be employed to pattern the photoresist layer.

The pattern of openings in the photoresist layer can be transferred through the second-tier structure (232, 242, 265, 270, 72, 577) by a second anisotropic etch process to form second-tier openings (249, 229) concurrently, i.e., during the second anisotropic etch process. The second-tier openings (249, 229) can include second-tier memory openings 249 and second-tier support openings.

The second anisotropic etch process can comprise a plasma etch process, which is herein referred to as a second plasma etch process. The at least one doped semiconductor material layer within the in-process source-level material layers 10', the first and second diode interconnect assemblies (630, 640) including a subset of the lower-level metal interconnect structures 780, and the diodes (610, 620) provide a discharge path for electrical charges that accumulate in regions of the second-tier memory openings 249 and in the second-tier support openings 229 during the second plasma etch process. Specifically, electrical charges that accumulate in the second-tier structure (232, 242, 265, 270, 72, 577) can diffuse downward through the first-tier structure (132, 142, 170, 165, 575, 148, 128) (such as the positive electrical charge generated by the positively charged plasma ions that impinge in the etched area of the second-tier structure (232, 242, 265, 270, 72, 577)), and can be discharged to electrical ground through the p-n diodes 610 and the first diode interconnect assemblies 630. Any negative electrical charge that accumulates in the second-tier structure (232, 242, 270, 265) can be discharged to electrical ground through the n-p diodes 620 and the second diode interconnect assemblies 640.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Locations of steps S in the first-tier alternating stack (132, 142) and the second-tier alternating stack (232, 242) are illustrated as dotted lines in FIG. 9B.

Figure 10:
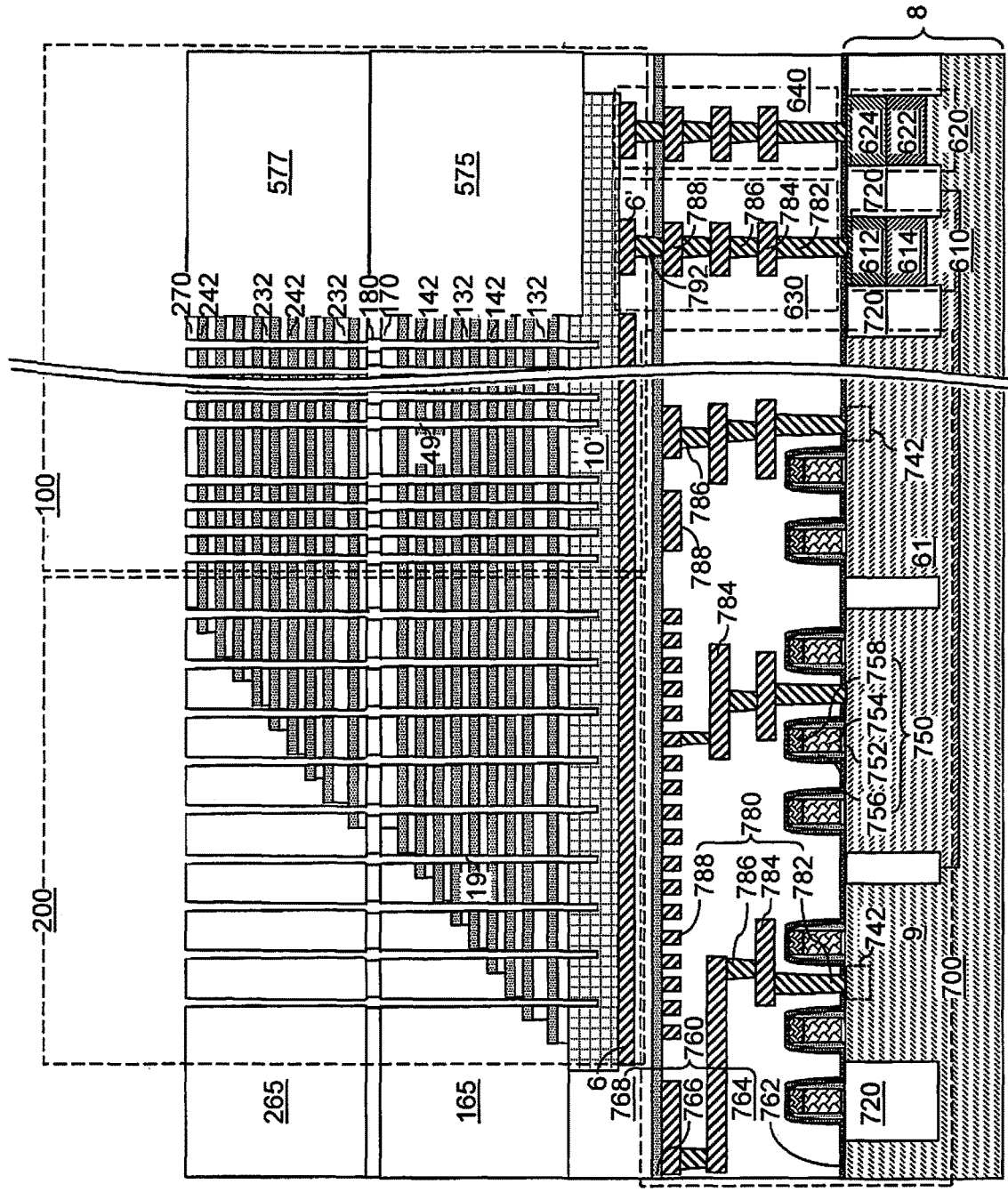
FIG. 10 is a vertical cross-sectional view of the first exemplary structure after formation of inter-tier memory openings and inter-tier support openings according to an embodiment of the present disclosure.

Referring to FIG. 10, the sacrificial fill material can be removed from underneath the second-tier memory openings 249 and the second-tier support openings 229 employing an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each volume from which a sacrificial first-tier memory opening fill portion 148 is removed. A support opening 19, which is also referred to as an inter-tier support opening 19, is formed in each volume from which a sacrificial first-tier support opening fill portion 128 is removed.

FIGS. 11A-11D provide sequential cross-sectional views of a memory opening 49 during formation of a memory opening fill structure 58 or a support pillar structure 20. The same structural change occurs in each memory openings 49.

Referring to FIG. 11A, a memory opening 49 in the first exemplary device structure of FIG. 10 is illustrated. The memory opening 49 extends through the first-tier structure and the second-tier structure.

Referring to FIG. 11B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Referring to FIG. 11C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 11D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements which comprise portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165, 575), the second-tier structure (232, 242, 270, 265, 577, 72), the inter-tier dielectric layer 180, and the memory opening fill structures 58 collectively constitute a memory-level assembly.

Figure 12:
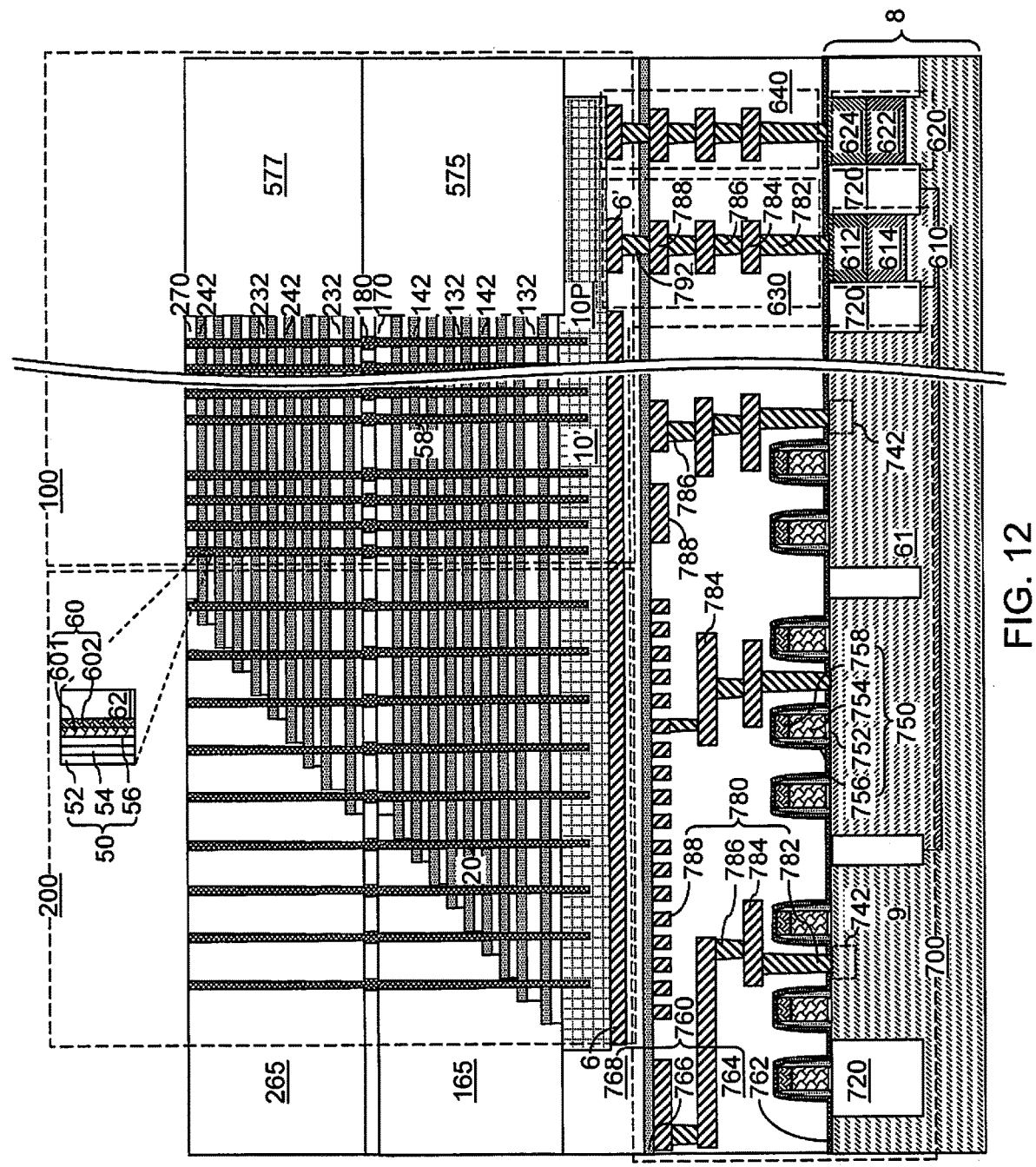
FIG. 12 is a vertical cross-sectional view of the first exemplary structure after formation of memory opening fill structures and support pillar structures according to an embodiment of the present disclosure.

Referring to FIG. 12, each of the support openings 19 is filled with a respective support pillar structure 20 concurrently with formation of the memory opening fill structures 58. Each support pillar structure 20 can have the same structural elements as a memory opening fill structure 58. Each support pillar structure 20 is a dummy structure, i.e., an electrically inactive structure, and as such, is not subsequently contacted by any contact via structure.

Figure 13A:
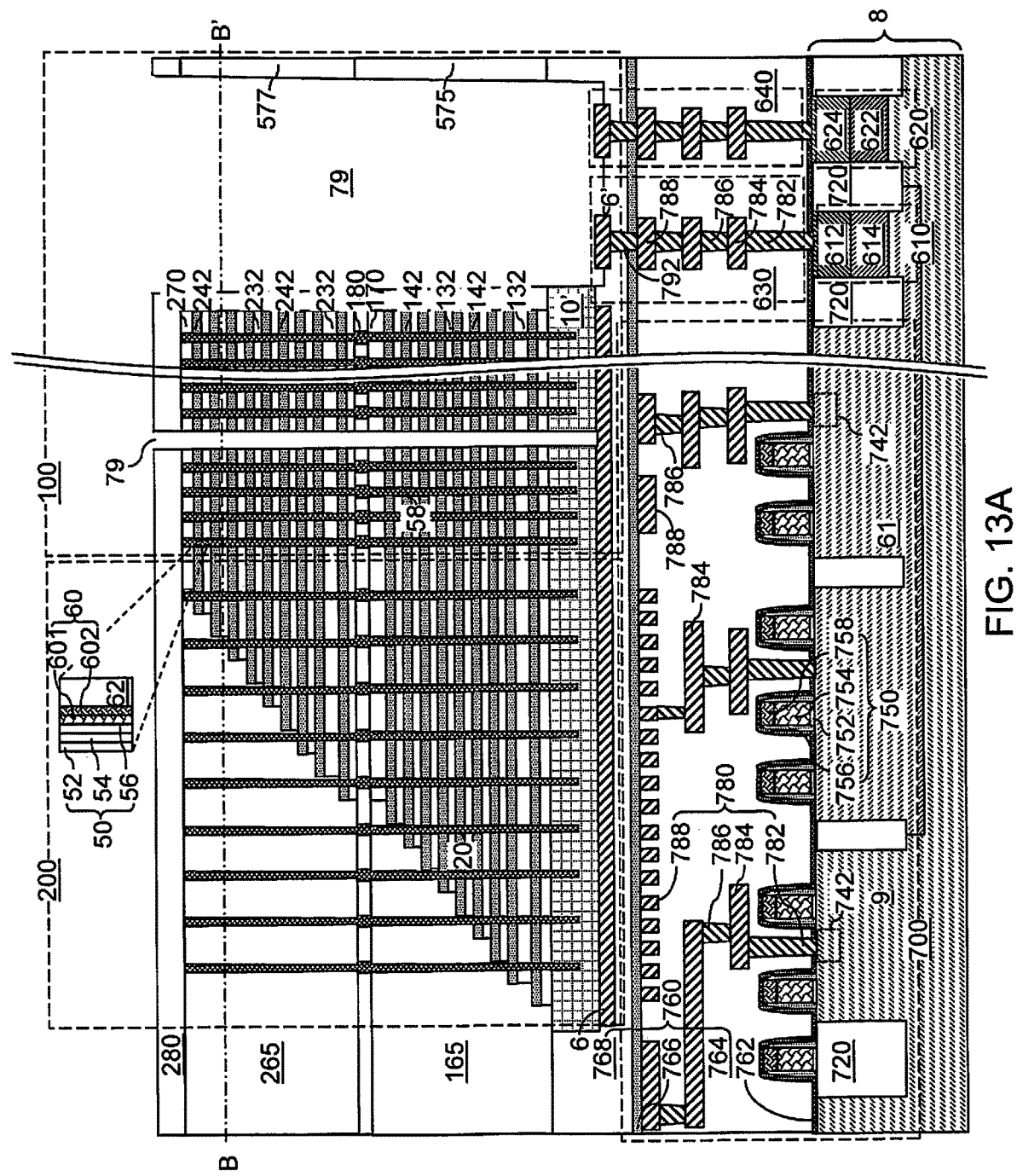
FIG. 13A is a vertical cross-sectional view of the first exemplary structure after formation of a contact level dielectric layer and backside trenches according to an embodiment of the present disclosure.
Figure 13B:
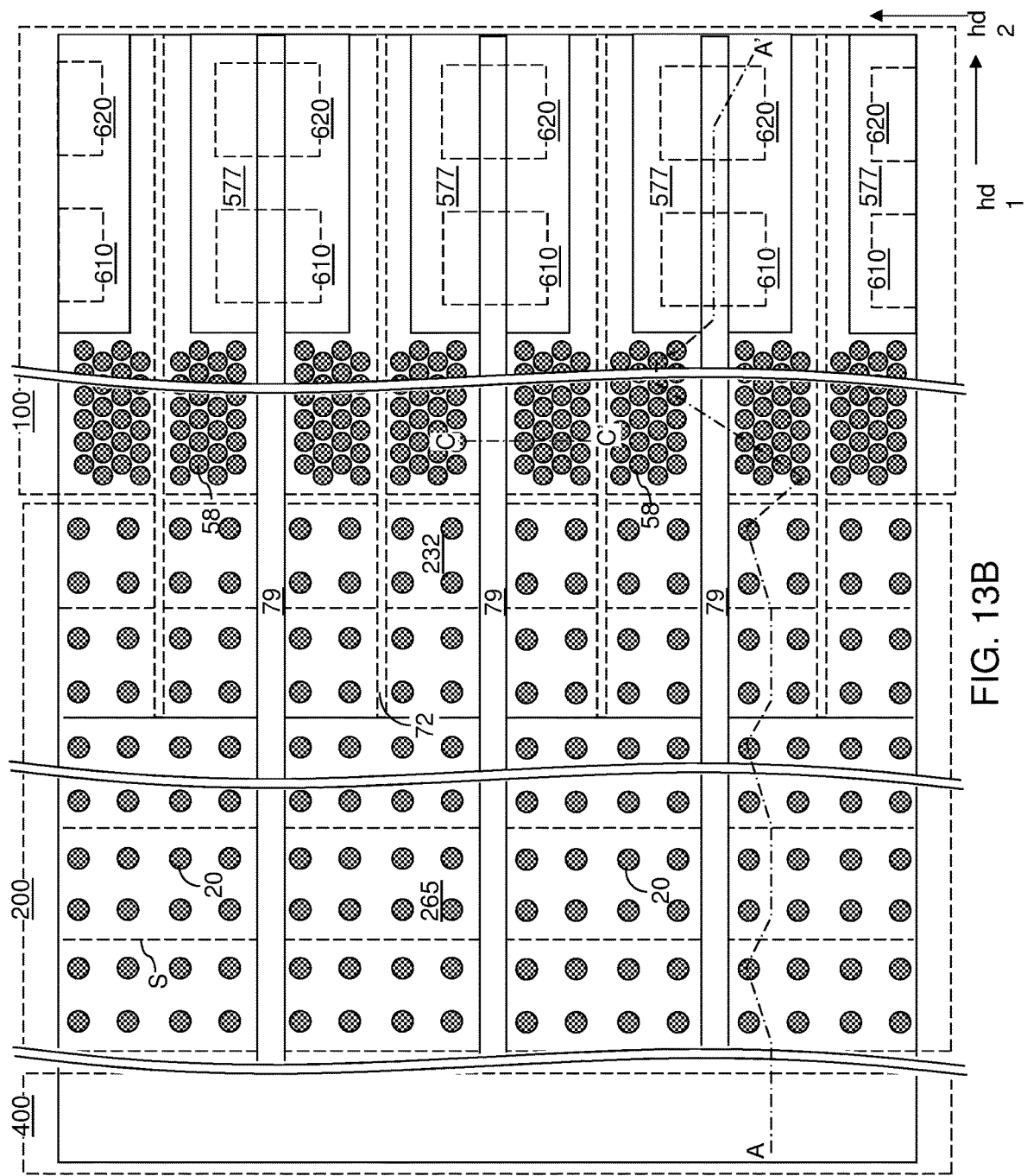
FIG. 13B is a top-down view of the first exemplary structure of FIG. 13A. The zig-zag vertical plane A-A' corresponds to the plane of the vertical cross-sectional view of FIG. 13A.

Referring to FIGS. 13A and 13B, a contact level dielectric layer 280 can be formed over the second-tier structure (232, 242, 270, 265, 577, 72). The contact level dielectric layer 280 includes a dielectric material such as silicon oxide, and can be formed by a conformal or non-conformal deposition process. For example, the contact level dielectric layer 280 can include undoped silicate glass and can have a thickness in a range from 100 nm to 600 nm, although lesser and greater thicknesses can also be employed.

A photoresist layer (not shown) can be applied over the contact level dielectric layer 280, and can be lithographically patterned to form elongated openings that laterally extend along the first horizontal direction hd1. In one embodiment, the openings through the photoresist layer can have rectangular shapes.

Backside trenches 79 can be formed by transferring the pattern in the photoresist layer through the contact level dielectric layer 280, the second alternating stack (232, 242, 270, 265, 577, 72), the first alternating stack (132, 142, 170, 165, 575), and the in-process source-level material layers 10'. Portions of the contact level dielectric layer 280, the second alternating stack (232, 242, 270, 265, 577, 72), the first alternating stack (132, 142, 170, 165, 575), and the in-process source-level material layers 10' that underlie the openings in the photoresist layer can be removed to form backside trenches 79. In one embodiment, the backside trenches 79 can be formed between clusters of memory stack structures 55. In one embodiment, the backside trenches 79 can at least partly overlie the areas of the diodes (610, 620).

In one embodiment, the anisotropic etch process that forms the backside trenches 79 can include a third plasma etch process that employs a plasma of ions that etch the materials of the second alternating stack (232, 242) and the first alternating stack (132, 142). The diodes (610, 620) can provide discharge paths for electrical charges that accumulate in regions of the backside trench 79 during the third plasma etch process. In one embodiment, the laterally protruding strip portions of in-process source-level material layers 10' providing electrical connection between the conductive plate layer 6 and the diode connection line structures 6' can be removed by a terminal portion of the anisotropic etch process (which can be the third plasma etch process). The laterally protruding strip portions of in-process source-level material layers 10' provide electrically conductive paths between the diodes (610, 620) and the at least one doped semiconductor material layer (such as the lower source-level material layer 112 and the upper sacrificial liner 105 in the in-process source level material layers 10'). The electrically conductive paths include the diode interconnect assemblies (630, 640) (which include a respective subset of the lower-level metal interconnect structures 780).

Prior to disconnection, the electrically conductive paths can discharge electrical charges that accumulate in the first-tier structure (132, 142, 170, 165) (such as the positive electrical charge generated by the positively charged plasma ions that impinge in the etched area of the first-tier structure (132, 142, 170, 165)) to electrical ground through the p-n diodes 610 and the first diode interconnect assemblies 630. Any negative electrical charge that accumulates in the first-tier structure (132, 142, 170, 165) can be discharged to electrical ground through the n-p diodes 620 and the second diode interconnect assemblies 640 through the electrically conductive paths that include the laterally protruding strip portions of in-process source-level material layers 10'.

The sidewalls of the backside trenches can be distorted into curved sidewalls during the third plasma etch process in the presence of accumulated local electrical charges. The electrically conductive paths provided between the in-process source-level material layers 10' and the diodes (610, 620) prevent charge accumulation in the second-tier structure and the first-tier structure during until disconnection of the electrically conductive paths at the terminal portion of the anisotropic etch process. In other words, the electrically conductive paths prevent or reduce charge accumulation in the second-tier structure and the first-tier structure while the laterally protruding strip portions of in-process source-level material layers 10' are present. Thus, formation of straight vertical sidewalls of the backside trenches 79 can be facilitated by the combination of the diodes (610, 620), the diode interconnect assemblies (630, 640), and the laterally protruding strip portions 10P of in-process source-level material layers 10' that are subsequently removed. In one embodiment, the anisotropic etch process can etch through all layers of the in-process source-level material layers 10', and the conductive plate layer 6 and the diode connection line structures 6' can function as stopping structures for the anisotropic etch process. Thus, in one embodiment, the conductive plate layer 6 can be employed as an etch stop layer. The photoresist layer can be subsequently removed, for example, by ashing.

In another embodiment, if the top surface of the laterally protruding strip portions 10P of the in-process source-level material layers 10' were previously recessed in the pillar cavities below the top surface of the other portions in-process source-level material layers 10', then the laterally protruding strip portions 10P are thinner than the other portions of the in-process source-level material layers 10'. In this case, the etch that forms the backside trenches 79 can etch all the way through the thinner laterally protruding strip portions 10P to electrically disconnect and isolate the diodes (610, 620) from the in-process source-level material layers 10'. In contrast, the etch terminates above the top surface of the other portions of the in-process source-level material layers 10'. In this embodiment, the conductive plate layer 6 and the diode connection line structure 6' can be optionally omitted.

The electrically conductive paths between the diodes (610, 620) and the at least one doped semiconductor layer within the in-process source-region material layers 10' are disconnected (i.e., removed) by the anisotropic etch process, and the at least one doped semiconductor layer within the in-process source-region material layers 10' is no longer electrically grounded after the anisotropic etch process and is no longer electrically connected to the diodes (610, 620). Thus, source-region material layers to be subsequently derived from the in-process source-region material layers 10' can be electrically biased at operational voltages during device operation.

Figure 14A:
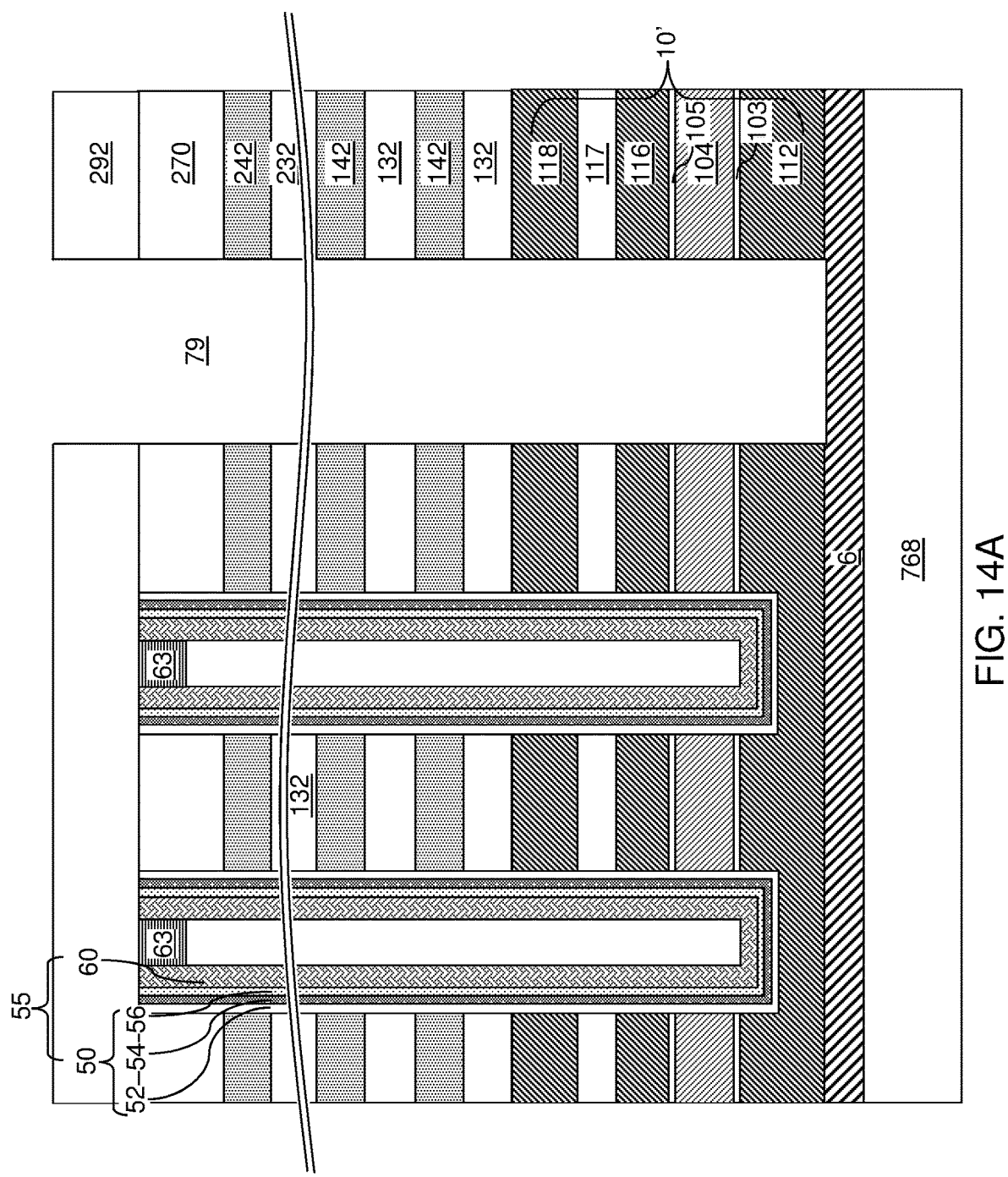
FIGS. 14A-14E are sequential vertical cross-sectional views of a region of the first exemplary structure during formation of source-level material layers by replacement of various material portions within the in-process source-level material layers of FIG. 1C with a source contact layer according to an embodiment of the present disclosure.

Referring to FIG. 14A, vertical cross-sectional view of a region of the first exemplary structure of FIGS. 13A and 13B is illustrated along the vertical plane C-C' of FIG. 13B. In one embodiment, the backside trenches 79 can extend through the optional source-select-level conductive layer 118, the source-level insulating layer 117, the upper source-level material layer 116, the upper sacrificial liner 105, the source-level sacrificial layer 104, the lower sacrificial liner 103, and the lower source-level material layer 112.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region 100 (which may extend over a memory plane) and the staircase region 200. The backside trenches 79 can laterally divide the memory-level assembly into memory blocks.

Figure 14B:
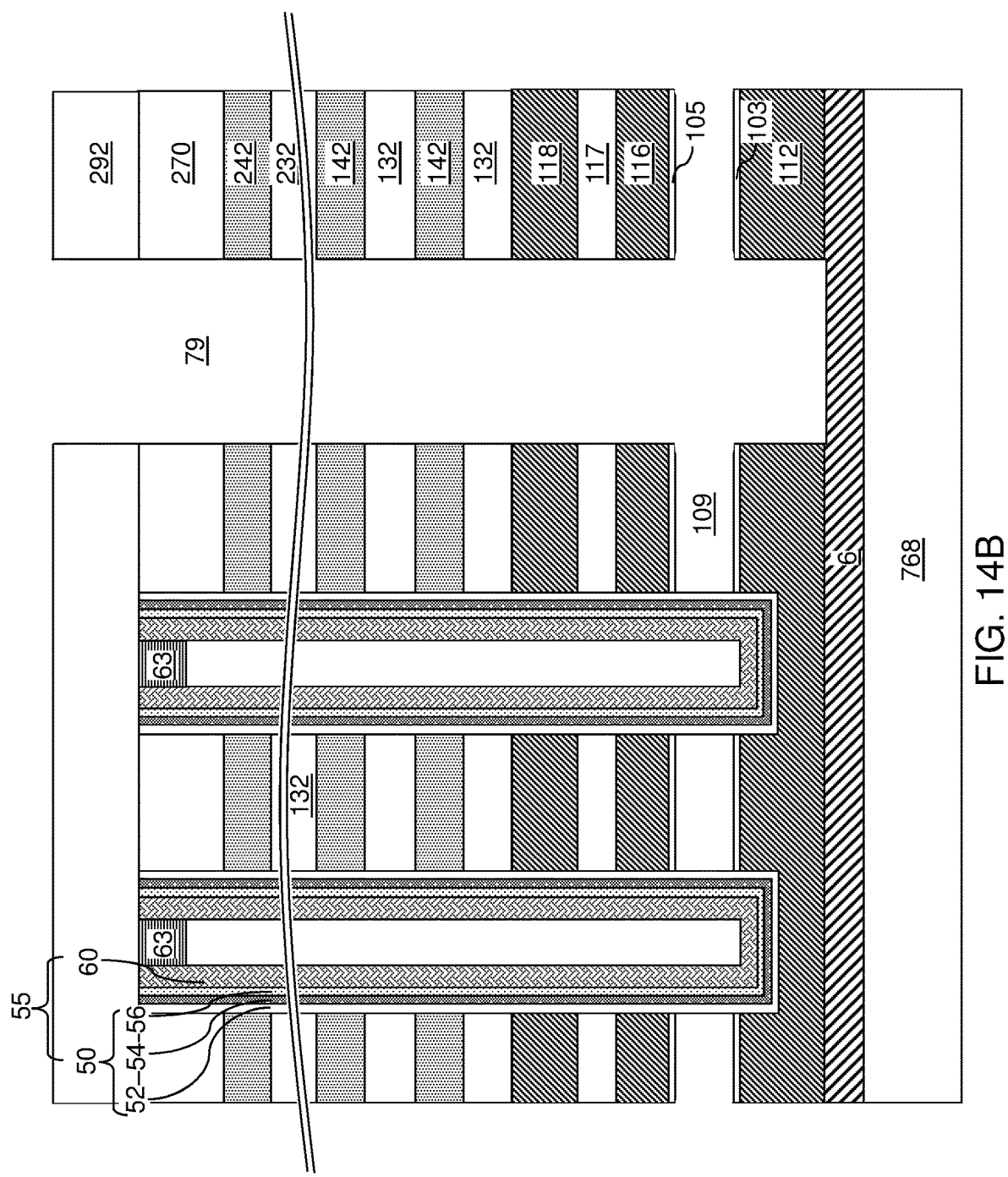

Referring to FIG. 14B, an etchant that etches the material of the source-level sacrificial layer 104 selective to the materials of the source-select-level conductive layer 118, the upper source-level material layer 116, the lower source-level material layer 112, the upper sacrificial liner 105, and the lower sacrificial liner 103 can be introduced into the backside trenches 79 in an isotropic etch process. For example, if the source-level sacrificial layer 104 includes undoped amorphous silicon, undoped polysilicon or an undoped amorphous silicon-germanium alloy, if the source-select-level conductive layer 118, the upper source-level material layer 116, and the lower source-level material layer 112 include heavily doped amorphous silicon or polysilicon, and if the upper and lower sacrificial liners (105, 103) include silicon oxide, a wet etch process employing hot trimethyl-2 hydroxyethyl ammonium hydroxide ("hot TMY") can be employed to remove the source-level sacrificial layer 104 selective to the materials of the source-select-level conductive layer 118, the upper source-level material layer 116, the lower source-level material layer 112, the upper sacrificial liner 105, and the lower sacrificial liner 103. A source cavity 109 is formed in the volume from which the source-level sacrificial layer 104 is removed.

Figure 14C:
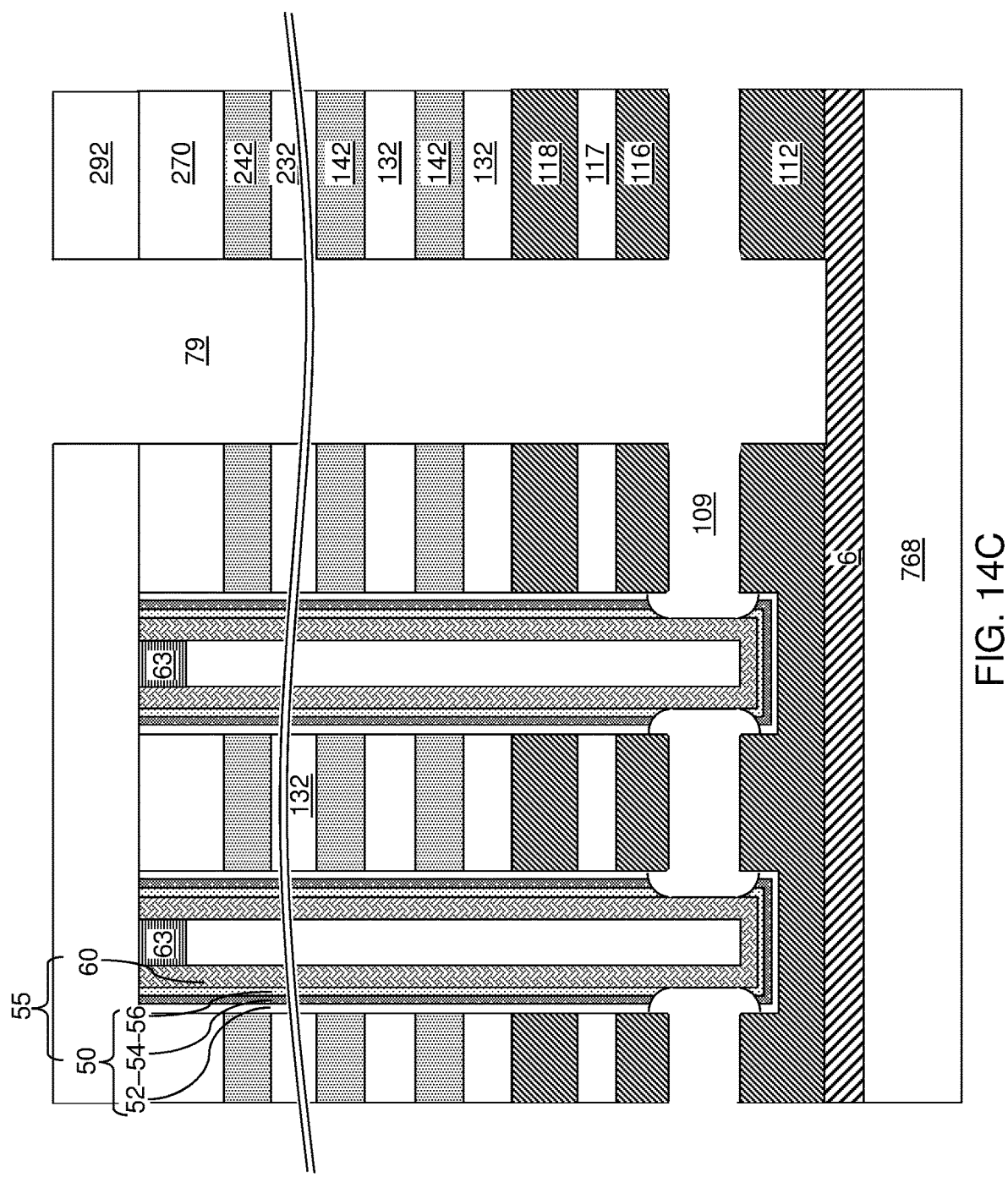

Referring to FIG. 14C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source-level material layer 112 and a bottom surface of the upper source-level material layer 116 can be physically exposed to the source cavity 109.

Figure 14D:
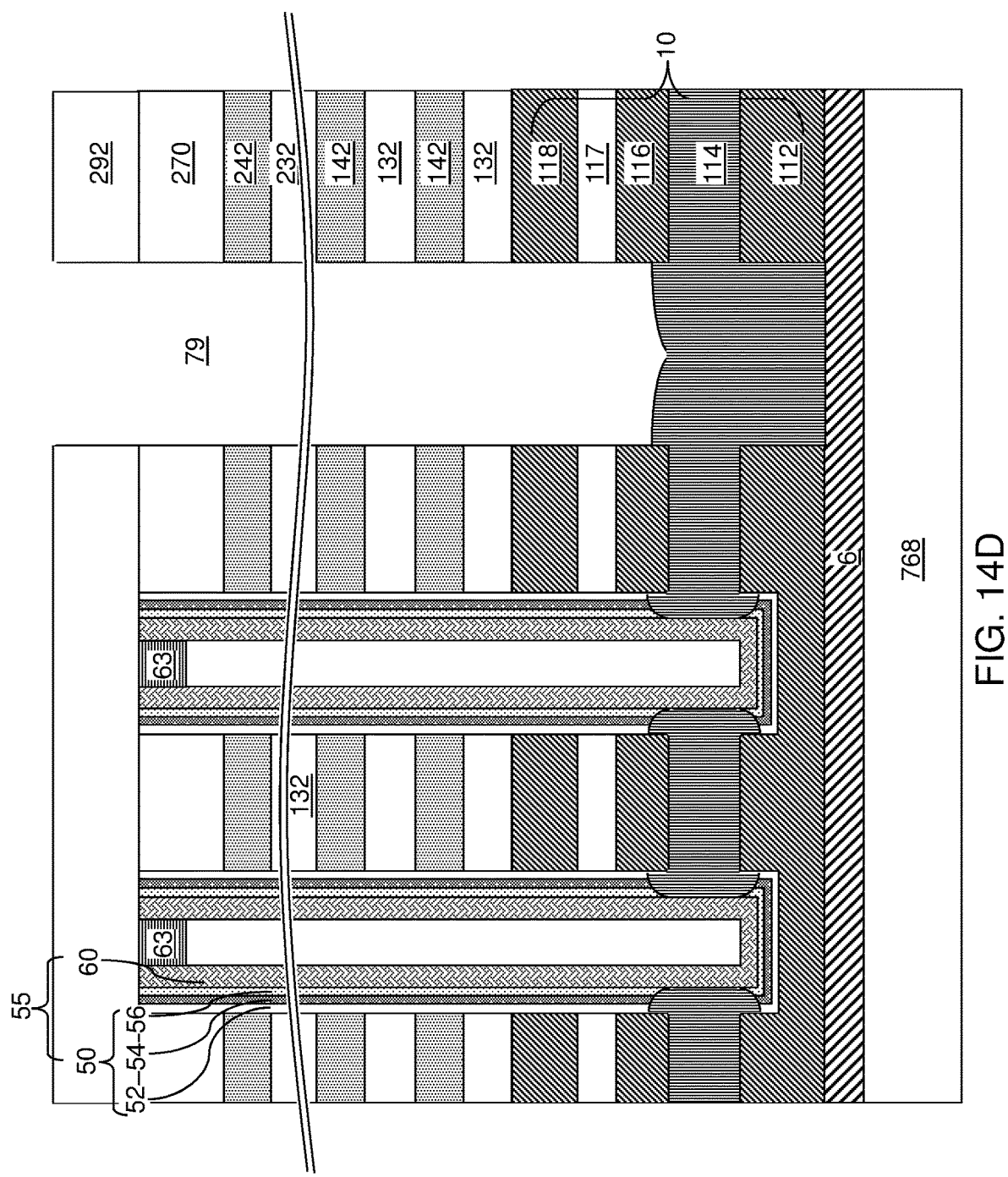

Referring to FIG. 14D, a doped semiconductor material having a doping of the second conductivity type can be deposited by a selective semiconductor deposition process. A semiconductor precursor gas, an etchant, and a dopant precursor gas can be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity is filled with the source contact layer 114. In one embodiment, the doped semiconductor material can include doped polysilicon.

The layer stack including the lower source-level material layer 112, the source contact layer 114, and the upper source-level material layer 116 constitutes a buried source layer (112, 114, 116), which function as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source level layers 10, which replaced the in-process source level layers 10'.

Figure 14E:
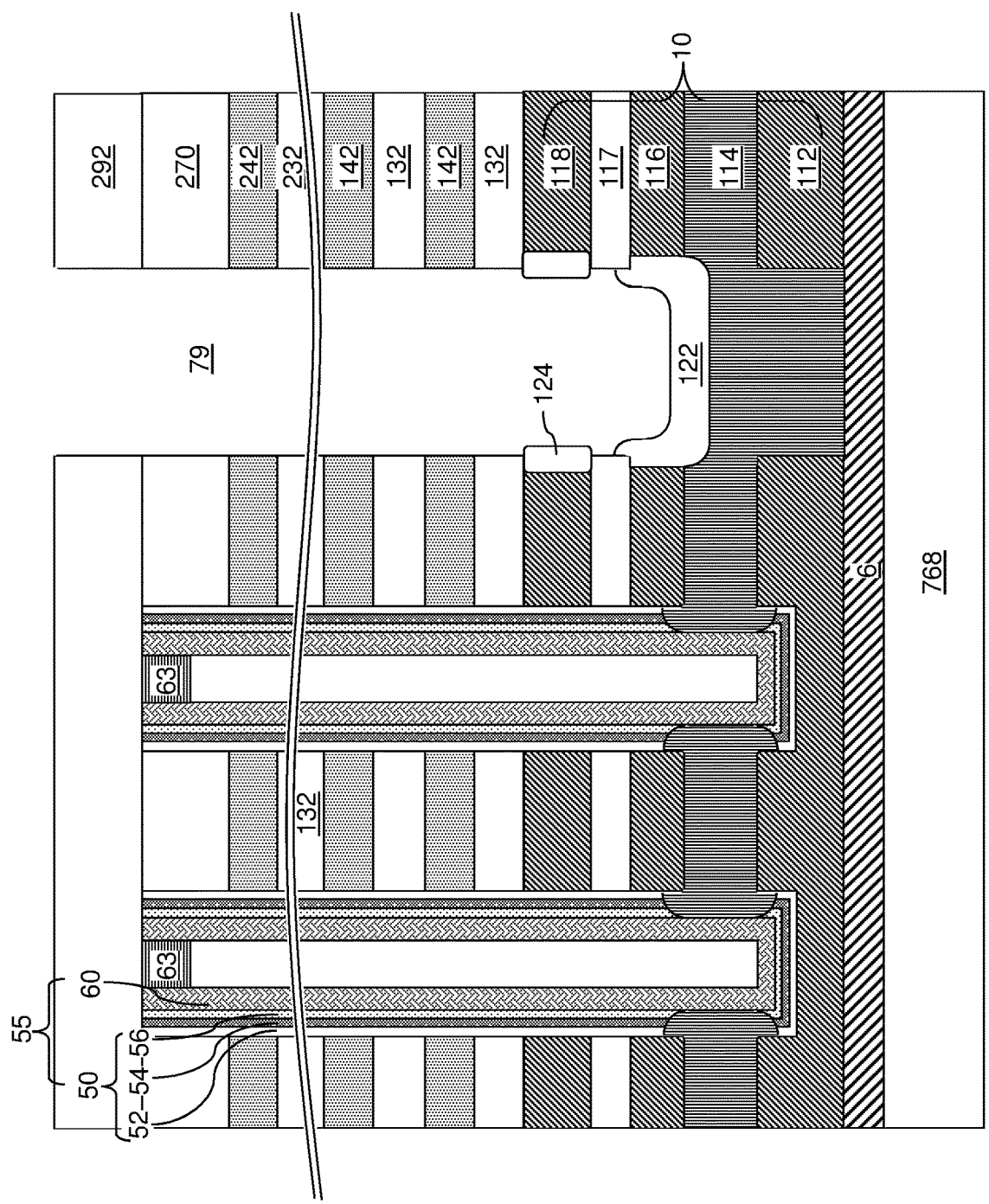
Figure 15:
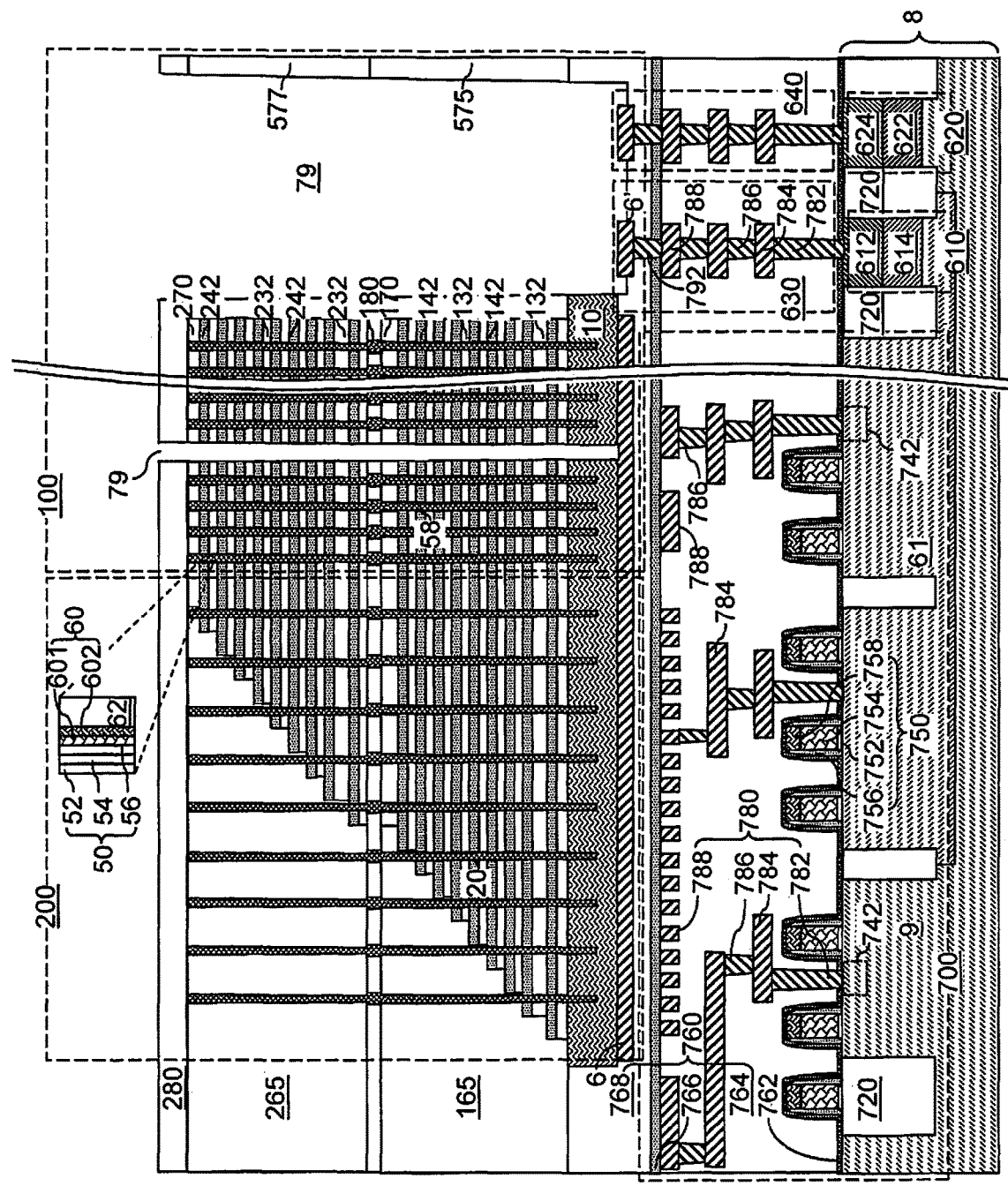
FIG. 15 is a vertical cross-sectional view of the first exemplary structure at the processing steps of FIG. 14E.

Referring to FIGS. 14E and 15, an oxidation process can be performed to convert physically exposed surface portions of the source-select-level conductive layer 118, the upper source-level material layer 116, the source-level sacrificial layer 104, and the lower source-level material layer 112. A thermal oxidation process or a plasma oxidation process may be employed. Semiconductor oxide material portions (such as silicon oxide portions) can be formed at the level of the in-process source level layers 10' around each backside trench 79. For example, a plate semiconductor oxide portion 122 can be formed on the source contact layer 114 and the upper source-level material layer 116, and annular semiconductor oxide portion 124 can be formed on the source-select-level conductive layer 118 within each backside trench 79.

Figure 16:
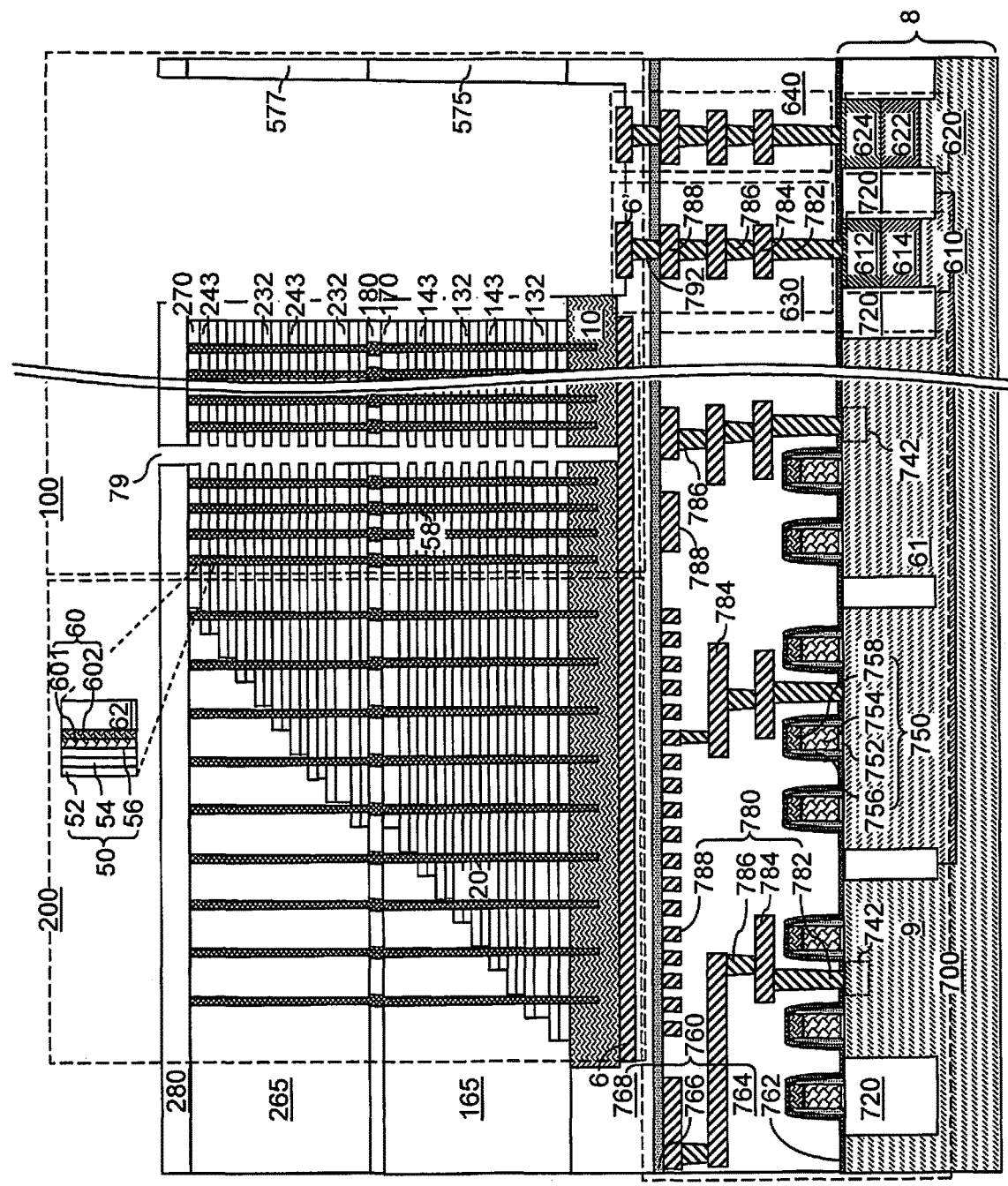
FIG. 16 is a vertical cross-sectional view of the first exemplary structure after formation of backside recesses according to an embodiment of the present disclosure.

Referring to FIG. 16, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 17A:
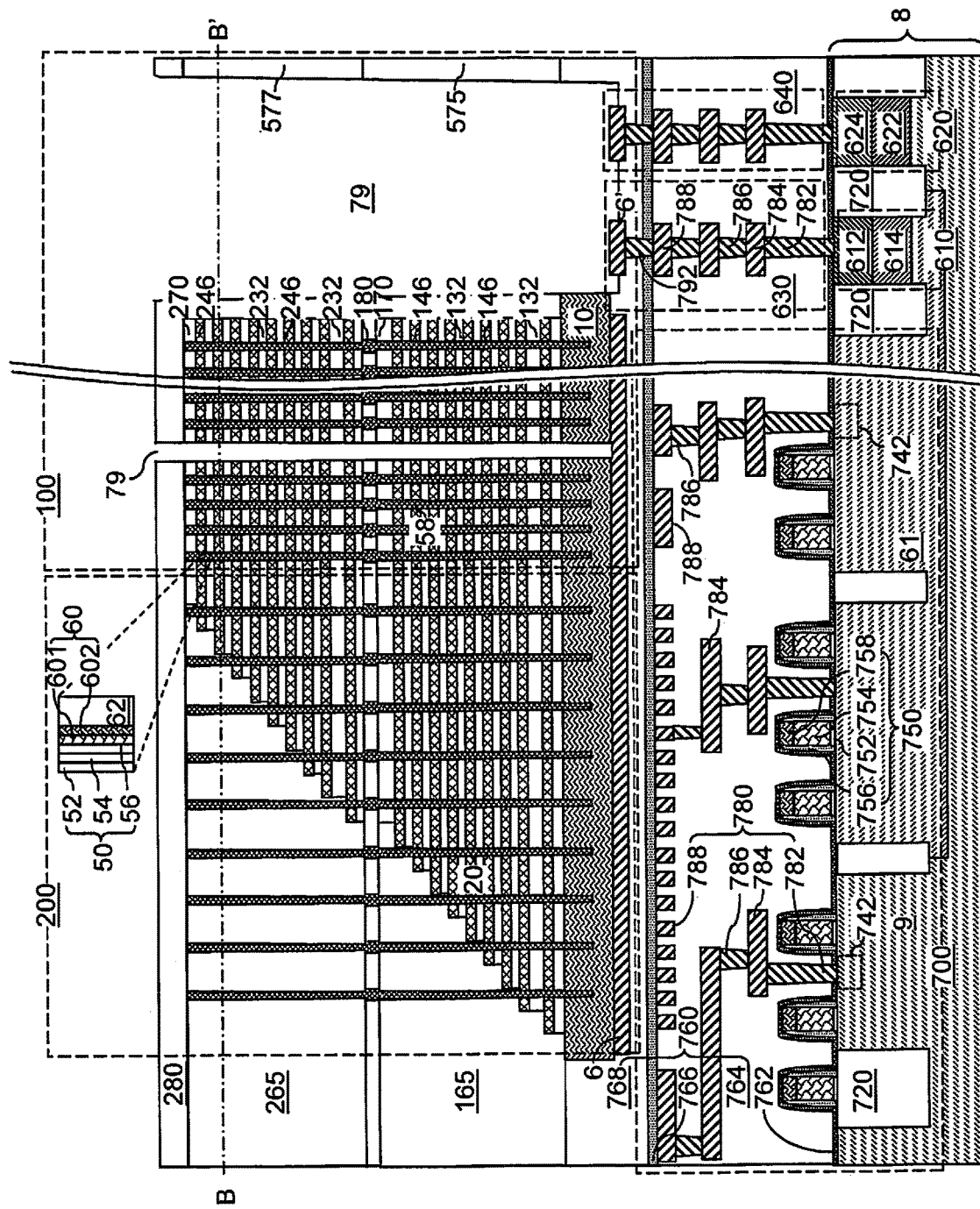
FIG. 17A is a vertical cross-sectional view of the first exemplary structure after formation of electrically conductive layers in the backside recesses according to an embodiment of the present disclosure.
Figure 17B:
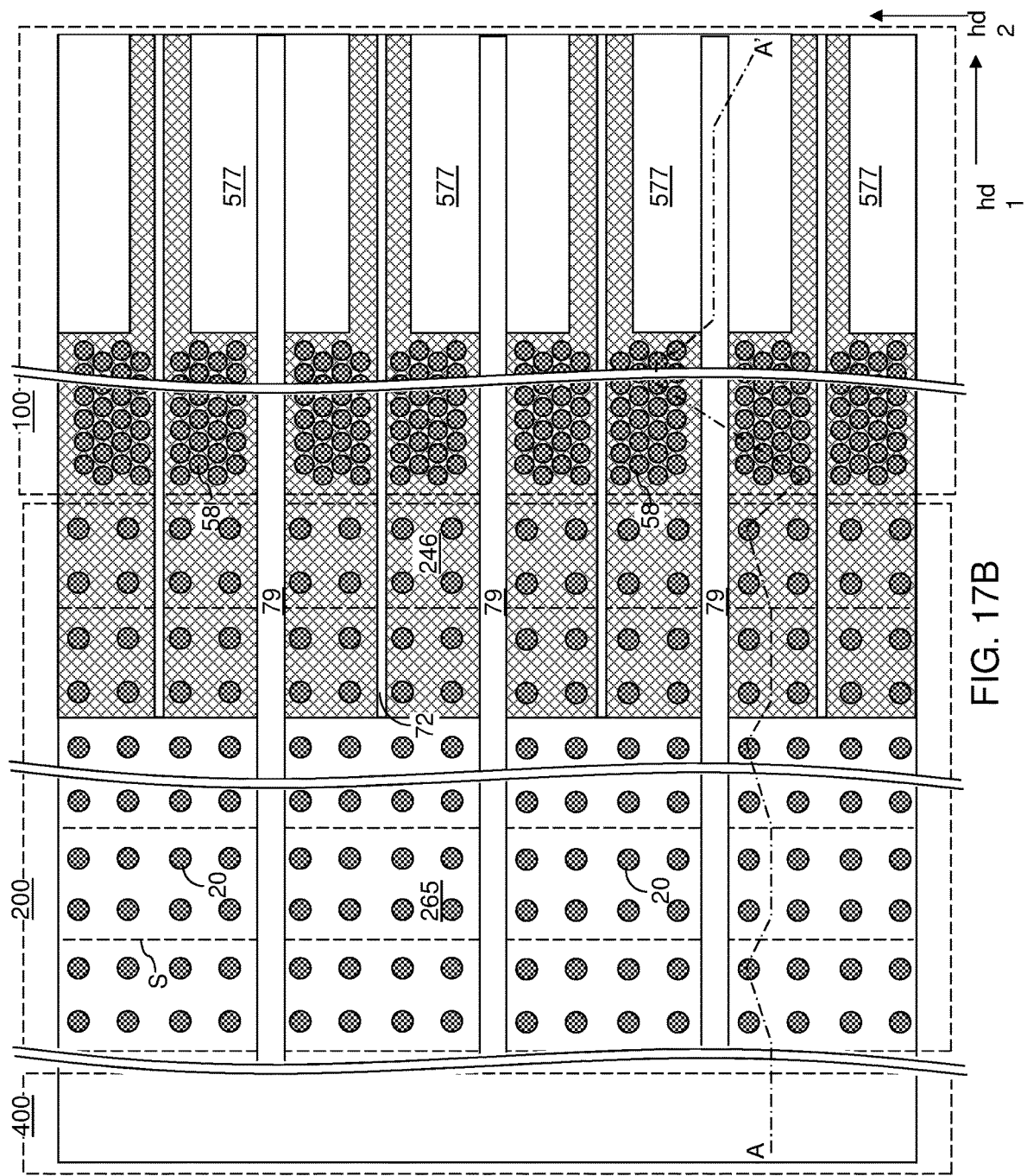
FIG. 17B is a horizontal cross-sectional of the first exemplary structure along the vertical plane B-B' of FIG. 17A. The zig-zag vertical plane A-A' corresponds to the plane of the vertical cross-sectional view of FIG. 17A.

Referring to FIGS. 17A and 17B, a backside blocking dielectric layer (not shown) can be optionally deposited in the backside recesses and the backside trenches 79 and over the contact level dielectric layer 280. The backside blocking dielectric layer can be deposited on the physically exposed portions of the outer surfaces of the memory stack structures 55, which are portions of the memory opening fill structures 58. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (243, 243), on the sidewalls of the backside trench 79, and over the contact level dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Figure 18A:
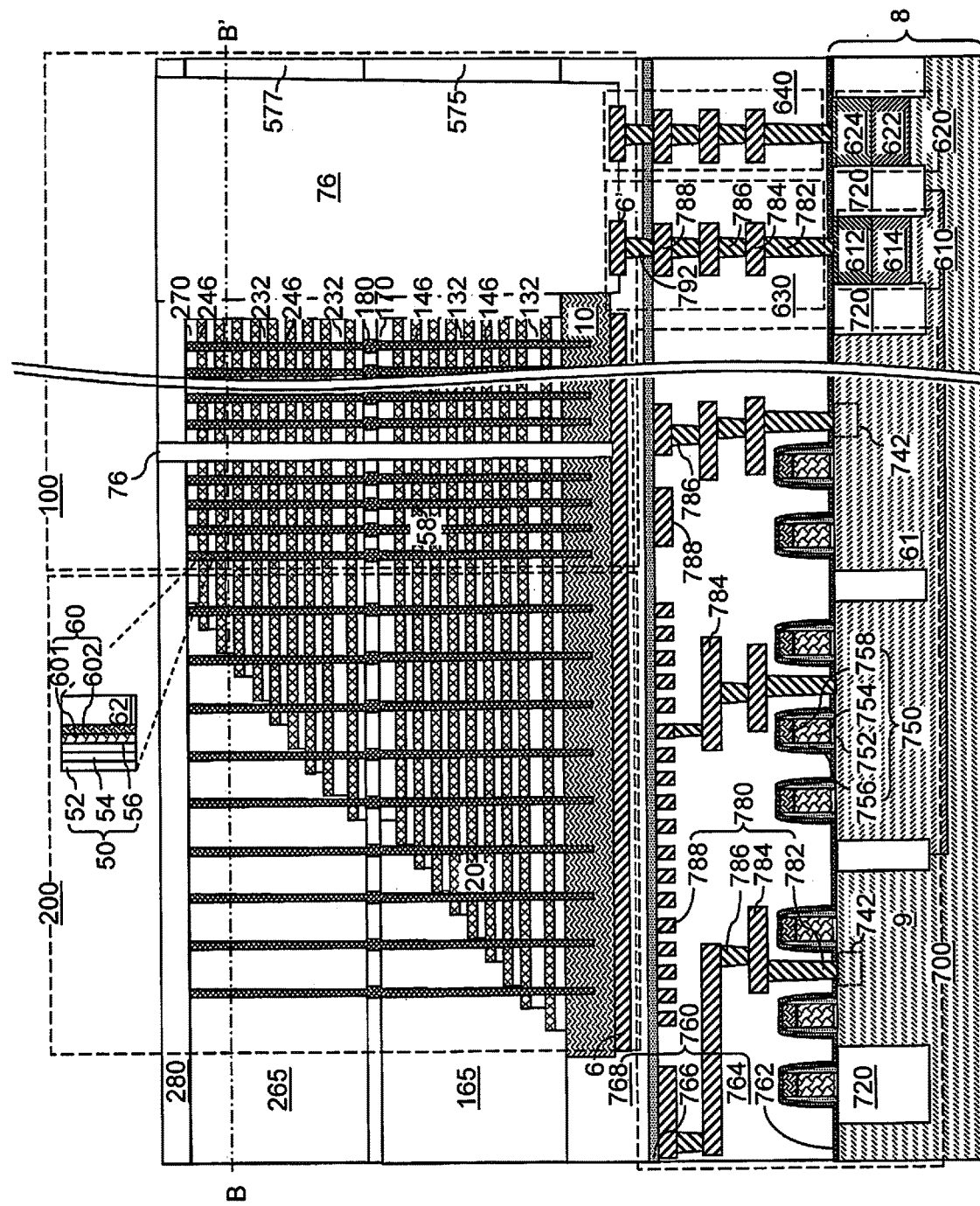
FIG. 18A is a vertical cross-sectional view of the first exemplary structure after formation of dielectric wall structures in the backside trenches according to an embodiment of the present disclosure.
Figure 18B:
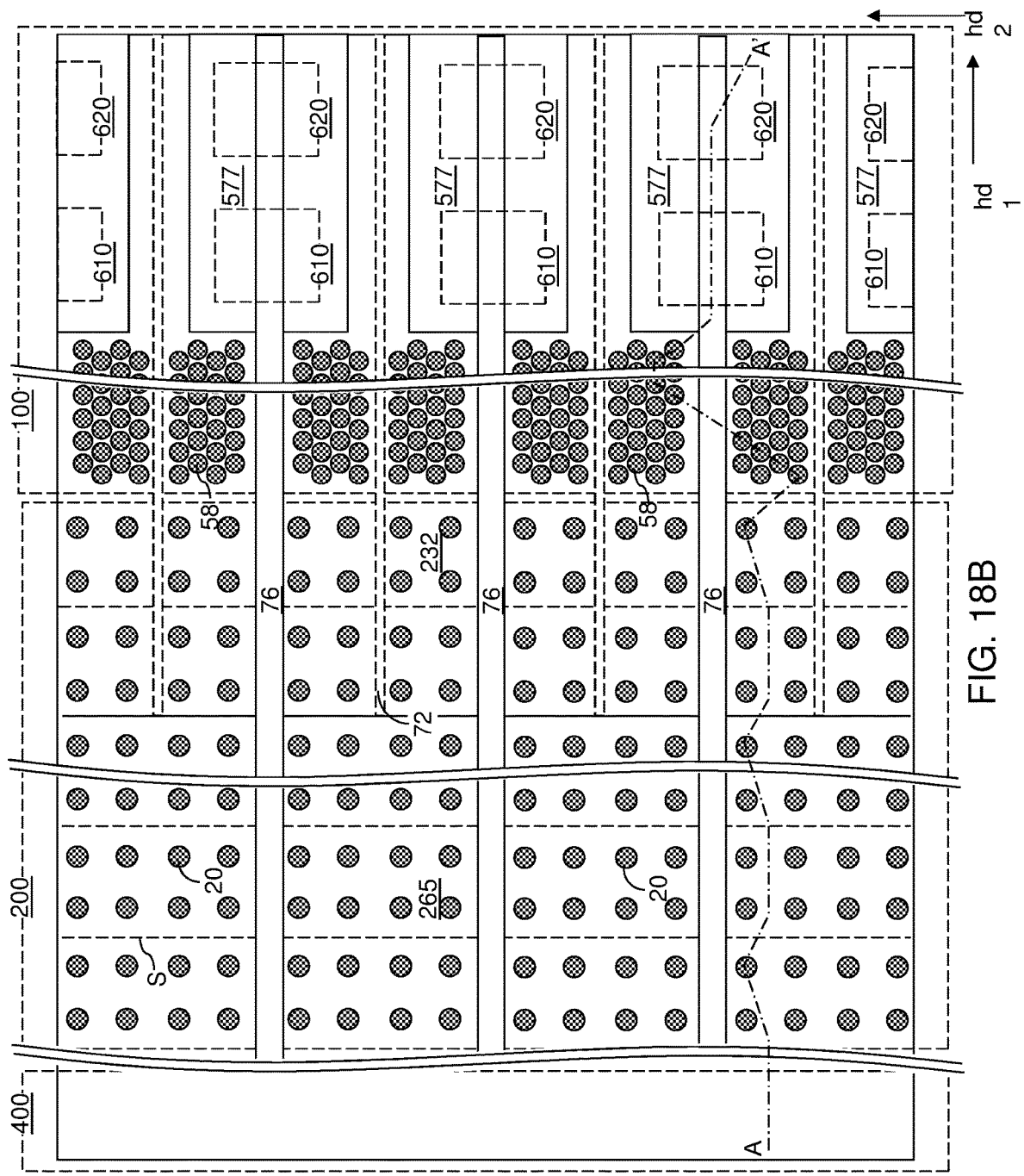
FIG. 18B is a horizontal cross-sectional view of the first exemplary structure along the vertical plane B-B' of FIG. 18A. The zig-zag vertical plane A-A' corresponds to the plane of the vertical cross-sectional view of FIG. 18A.

Referring to FIGS. 18A and 18B, an insulating material can be deposited in the backside trenches 79 by a conformal deposition process. Excess portions of the insulating material deposited over the top surface of the contact level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2. The dielectric wall structures 76 contact a surface of a respective diode connection line structure 6', which is one of the lower-level metal interconnect structures 780.

Figure 19A:
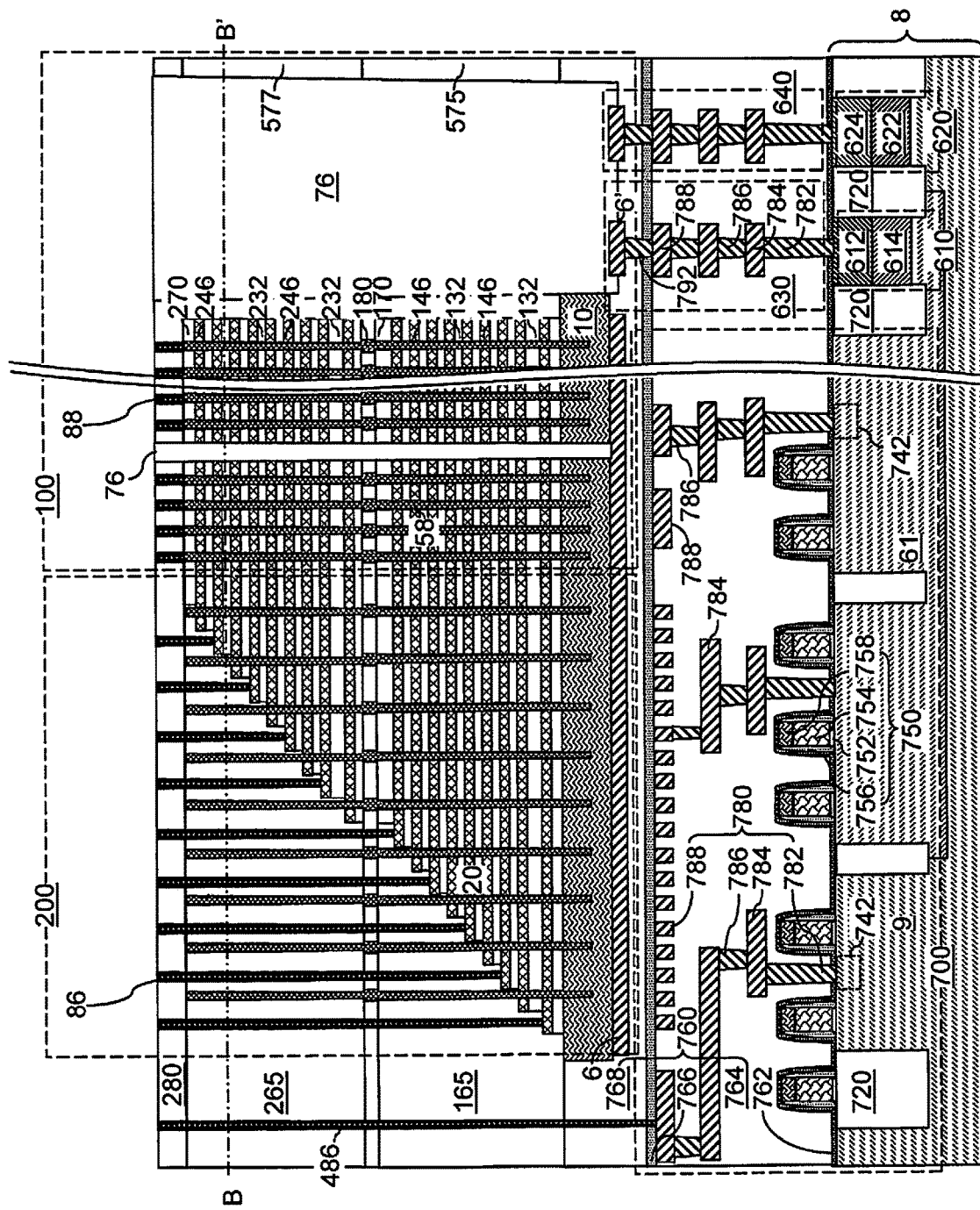
FIG. 19A is a vertical cross-sectional view of the first exemplary structure after formation of drain contact via structures, staircase-region contact via structures, and peripheral-region contact via structures according to an embodiment of the present disclosure.
Figure 19B:
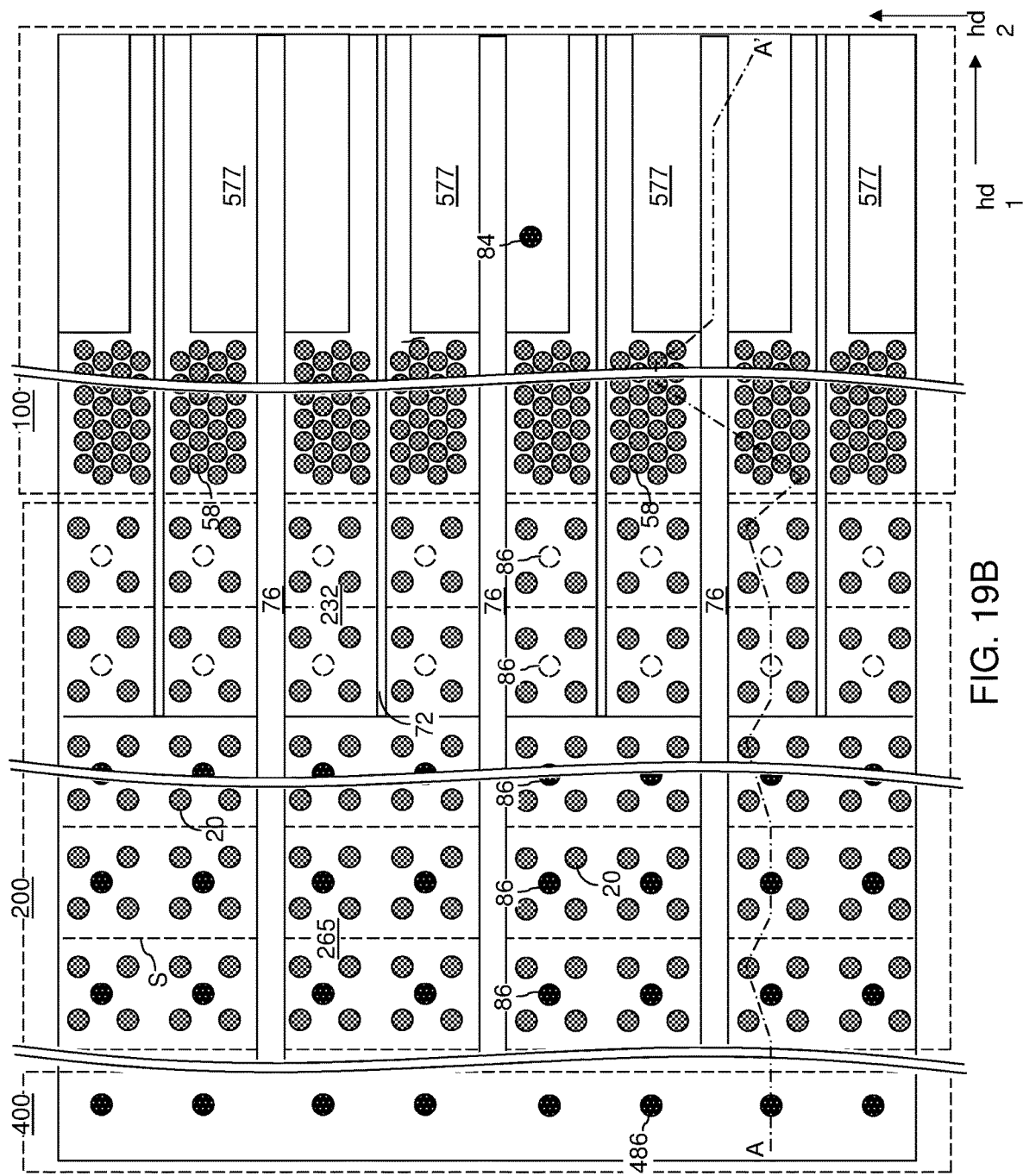
FIG. 19B is a horizontal cross-sectional view of the first exemplary structure along the vertical plane B-B' of FIG. 19A. The zig-zag vertical plane A-A' corresponds to the plane of the vertical cross-sectional view of FIG. 19A.

Referring to FIGS. 19A-19C, various contact via cavities can be formed through the contact level dielectric layer 280 and underlying dielectric material portions to various underlying electrically active elements. For example, one or more source contact via cavities can be formed to the source contact layer 114 through the first and second dielectric pillar structures (575, 577). The electrically conductive layers (146, 246) extend around the respective first and second dielectric pillar structures (575, 577) between parts of the memory array region 100 containing the memory stack structures 55. Drain contact via cavities can be formed through the contact level dielectric layer 280 to top surfaces of the drain regions 63. Staircase-region contact via cavities can be formed in the staircase region 200. The staircase-region contact via cavities can be formed through the contact level dielectric layer 280 and the second and first retro-stepped dielectric material portions (265, 165) to top surfaces of the electrically conductive strips (146, 246) in the staircase region 200. Peripheral-region via cavities can be formed through the contact level dielectric layer 280, the second and first retro-stepped dielectric material portions (265, 165), and the at least one second dielectric layer 768 to top surfaces of the lower metal interconnect structure 780 in the peripheral region 400. Additional via cavities may be formed as needed. The various via cavities may be formed employing a single masking step and a single etch step, or may be formed employing multiple combinations of a masking step in which a patterned mask (such as a patterned photoresist layer) is provided and an etch step in which an anisotropic etch process is employed to transfer the pattern in the patterned mask through underlying dielectric material portions.

At least one conductive material can be deposited in the various contact via cavities. The at least one conductive material can include a metallic nitride liner and a metallic fill material. The metallic nitride liner can include a metallic nitride material such as TiN, TaN, WN, or combinations thereof. The metallic fill material can include a metal or a metallic alloy such as W, Ru, Co, Mo, Cu, or combinations thereof. Excess portions of the at least one conductive material can be removed from above the horizontal plane including the top surface of the contact level dielectric layer 280 by a planarization process such as chemical mechanical planarization and/or a recess etch.

A source contact via structure 84 which electrically contacts the source contact layer 114 can be formed in the source contact cavity. Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive strips (146, 246). The staircase-region contact via structures 86 can include drain select level contact via structures that contact a subset of the second electrically conductive strips 246 that function as drain select level gate electrodes. Further, the staircase-region contact via structures 86 can include word line contact via structures that contact electrically conductive strips (146, 246) that underlie the drain select level gate electrodes and function as word lines for the memory stack structures 55. Peripheral-region contact via structures 488 can be formed in the peripheral-region contact via cavities and on a respective one of the lower metal interconnect structure 780 in a peripheral region adjacent to the staircase region 200.

Figure 20A:
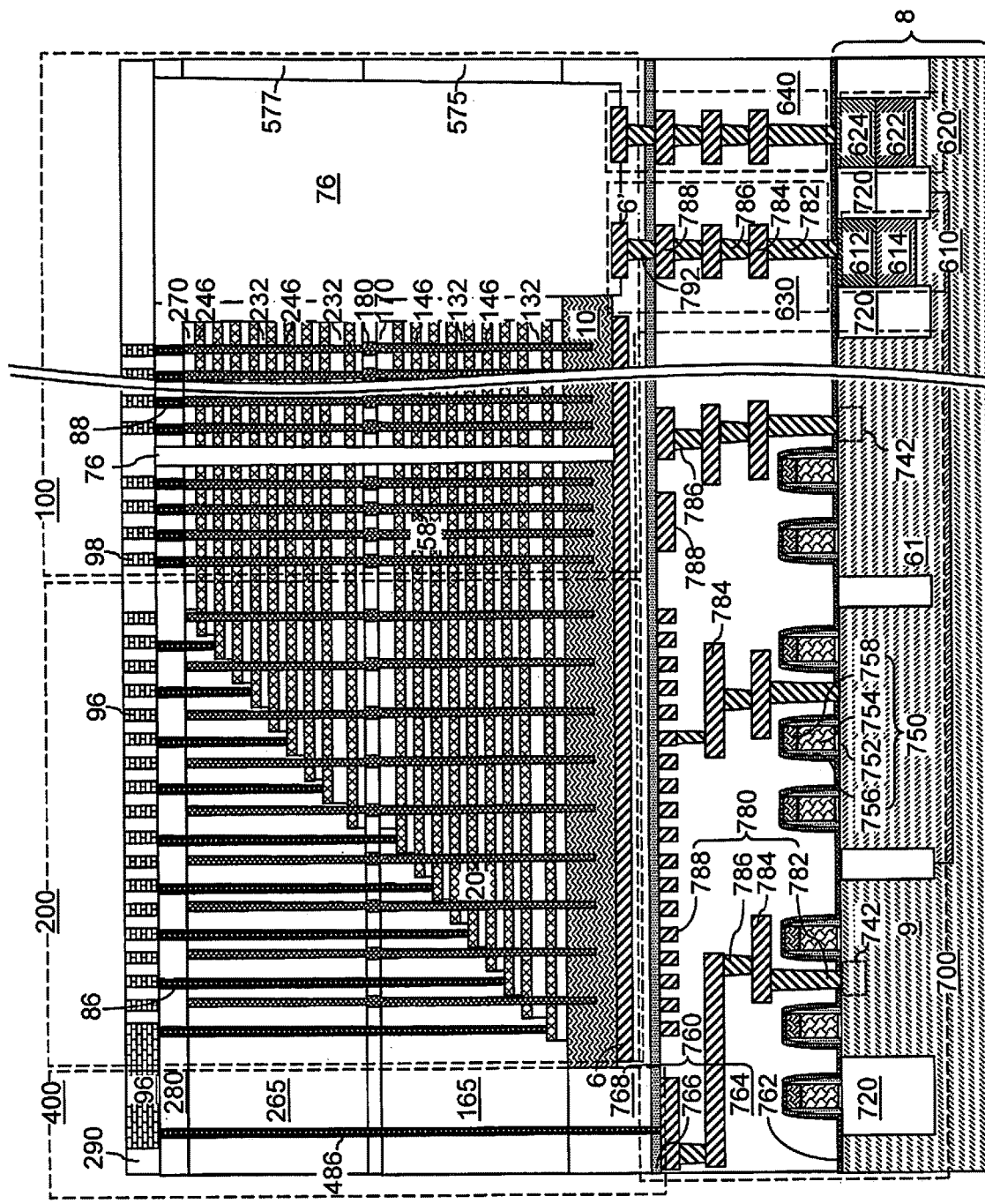
FIG. 20A is a vertical cross-sectional view of the first exemplary structure after formation of upper-level metal line structures according to an embodiment of the present disclosure.

Referring to FIG. 20A, at least one additional dielectric layer can be formed over the contact level dielectric layer 280, and additional metal interconnect structures (herein referred to as upper-level metal interconnect structures) can be formed in the at least one additional dielectric layer. For example, the at least one additional dielectric layer can include a line-level dielectric layer 290 that is formed over the contact level dielectric layer 280. The upper-level metal interconnect structures can include bit lines 98 contacting, or electrically shorted to, a respective one of the drain contact via structures 88, and interconnection line structures 96 contacting, and/or electrically shorted to, at least one of the staircase-region contact via structures 86 and/or the peripheral-region contact via structures 488.

Figure 20B:
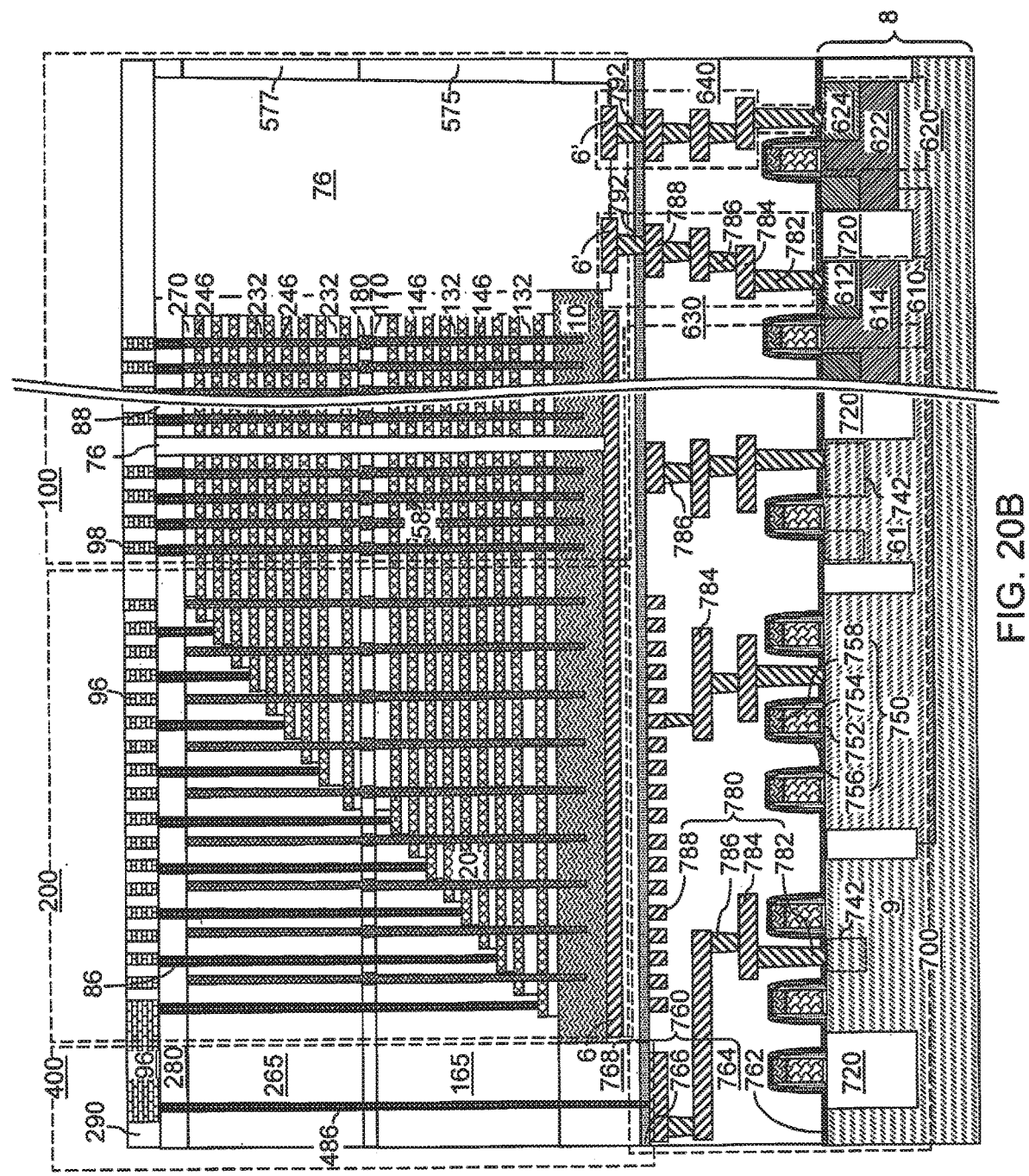
FIG. 20B is a vertical cross-sectional view of an alternative embodiment of the first exemplary structure at the processing steps of FIG. 20A.

Referring to FIG. 20B, an alternative embodiment of the first exemplary structure is illustrated at the processing steps of FIG. 20A, which can be derived from the alternative embodiment of the first exemplary structure of FIG. 1D by performing subsequent processing steps of the first exemplary structure.

Figure 21A:
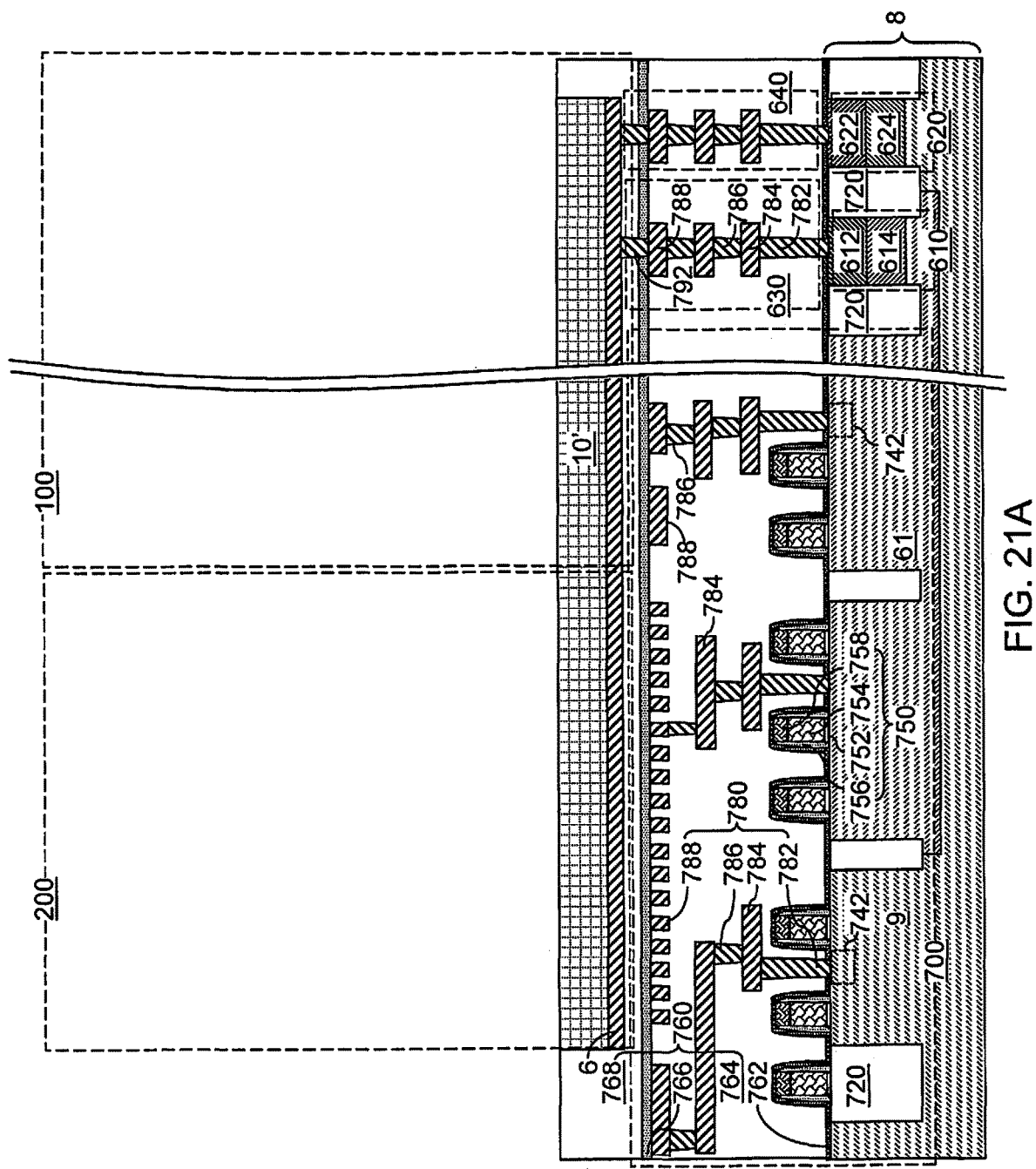
FIG. 21A is a vertical cross-sectional view of a second exemplary structure after formation of semiconductor devices, lower level dielectric layers, lower metal interconnect structures, and in-process source-level material layers on a semiconductor substrate according to an embodiment of the present disclosure.
Figure 21B:
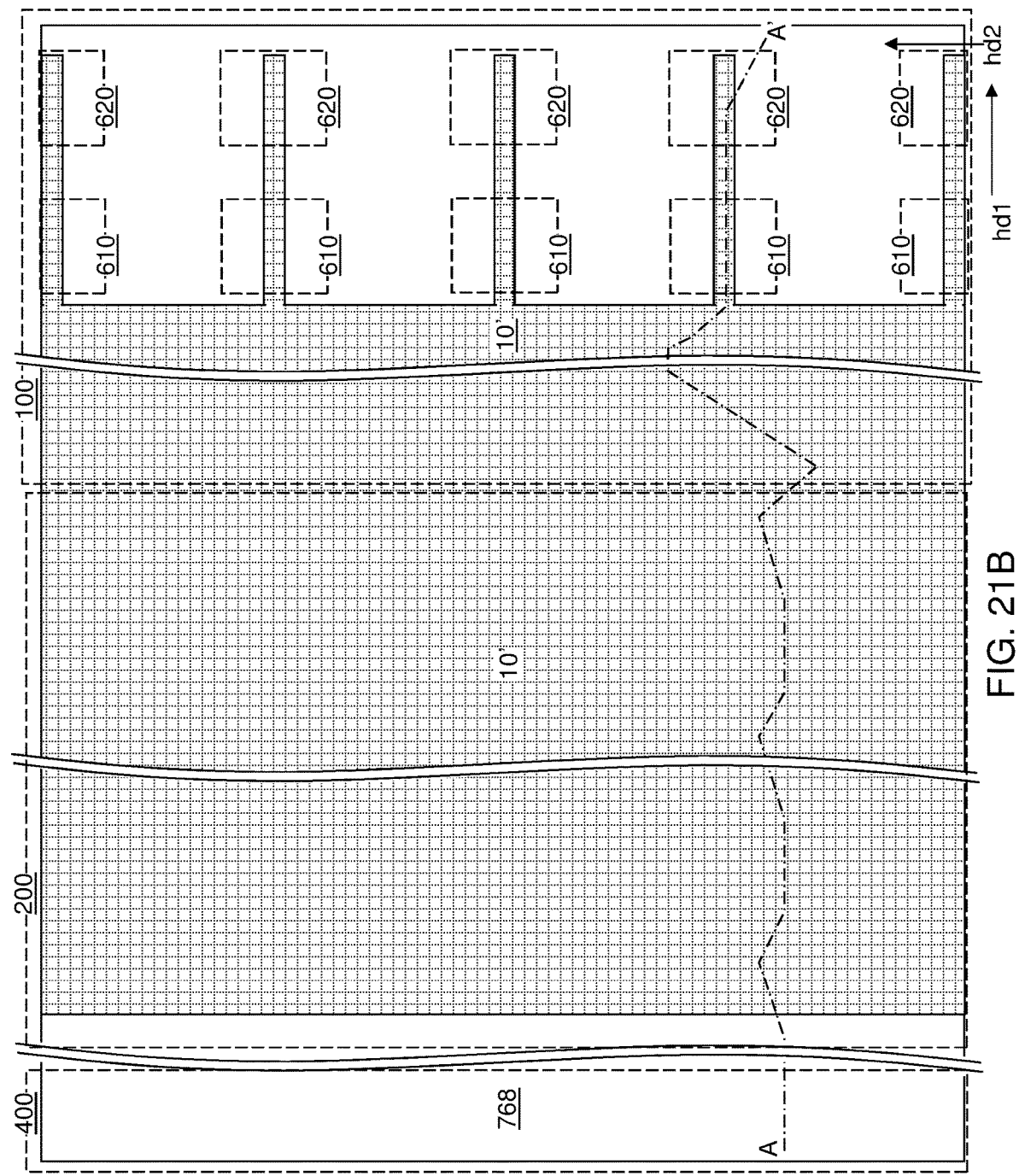
FIG. 21B is a top-down view of the second exemplary structure of FIG. 1A. The zig-zag vertical plane A-A' is the plane of the vertical cross-sectional view of FIG. 1A.

Referring to FIGS. 21A and 21B, a second exemplary structure according to a second embodiment of the present disclosure can be derived from the first exemplary structure by patterning the optional metallic material layer (containing the material of the conductive plate layer 6, if present) and the in-process source-level material layers 10' with a same pattern instead of patterning the metallic material layer and the in-process source-level material layers 10' with separate patterns at the processing steps of FIGS. 1A-1C.

Specifically, the optional metallic material layer and the in-process source-level material layers 10' can be deposited as blanket (unpatterned) material layers over a layer among the at least one second dielectric layer 768, and a photoresist layer can be applied and lithographically patterned over the in-process source-level material layers 10'. An anisotropic etch process is performed employing the patterned photoresist layer as an etch mask to pattern the in-process source-level material layers 10' and the metallic material layer. The in-process source-level material layers 10' and the metallic material layer are patterned with a same pattern. The patterned portion of the metallic material layer (if present) constitutes the conductive plate layer 6.

Each of the in-process source-level material layers 10' and the conductive plate layer 6 can be formed as a respective single continuous material layer including a respective set of laterally protruding strip portions. The laterally protruding strip portions 10P of the in-process source-level material layers 10' and the conductive plate layer 6 can laterally extend along the first horizontal direction hd1 and overlie the diodes (610, 620). In one embodiment, the laterally protruding strip portions 10P of the in-process source-level material layers 10' and the conductive plate layer 6 can be located within areas over which backside trenches 79 are to be subsequently formed.

The optional conductive plate layer 6 can be formed directly on each diode connection via structures 792. Discrete diode connection line structures 6' are not necessary in the second exemplary structure. Laterally protruding strip portions of the conductive plate layer 6 function as electrically conductive paths between at least one doped semiconductor material layer within the in-process source-level material layers 10' and the diodes (610, 620). Thus, the laterally protruding strip portions of the conductive plate layer 6 contact topmost components (such as the diode connection via structures 792) of the first diode interconnect assemblies 630 and the second diode interconnect assemblies 640.

Each of the first diode interconnect assemblies 630 and the second diode interconnect assemblies 640 includes a respective subset of the lower-level metal interconnect structures 780. Topmost components (such as the diode connection via structures 792) of each subset of the lower-level metal interconnect structures 780 contacts a bottom surface of the conductive plate layer 6 or the in-process source-level material layers 10' if layer 6 is omitted.

Figure 21C:
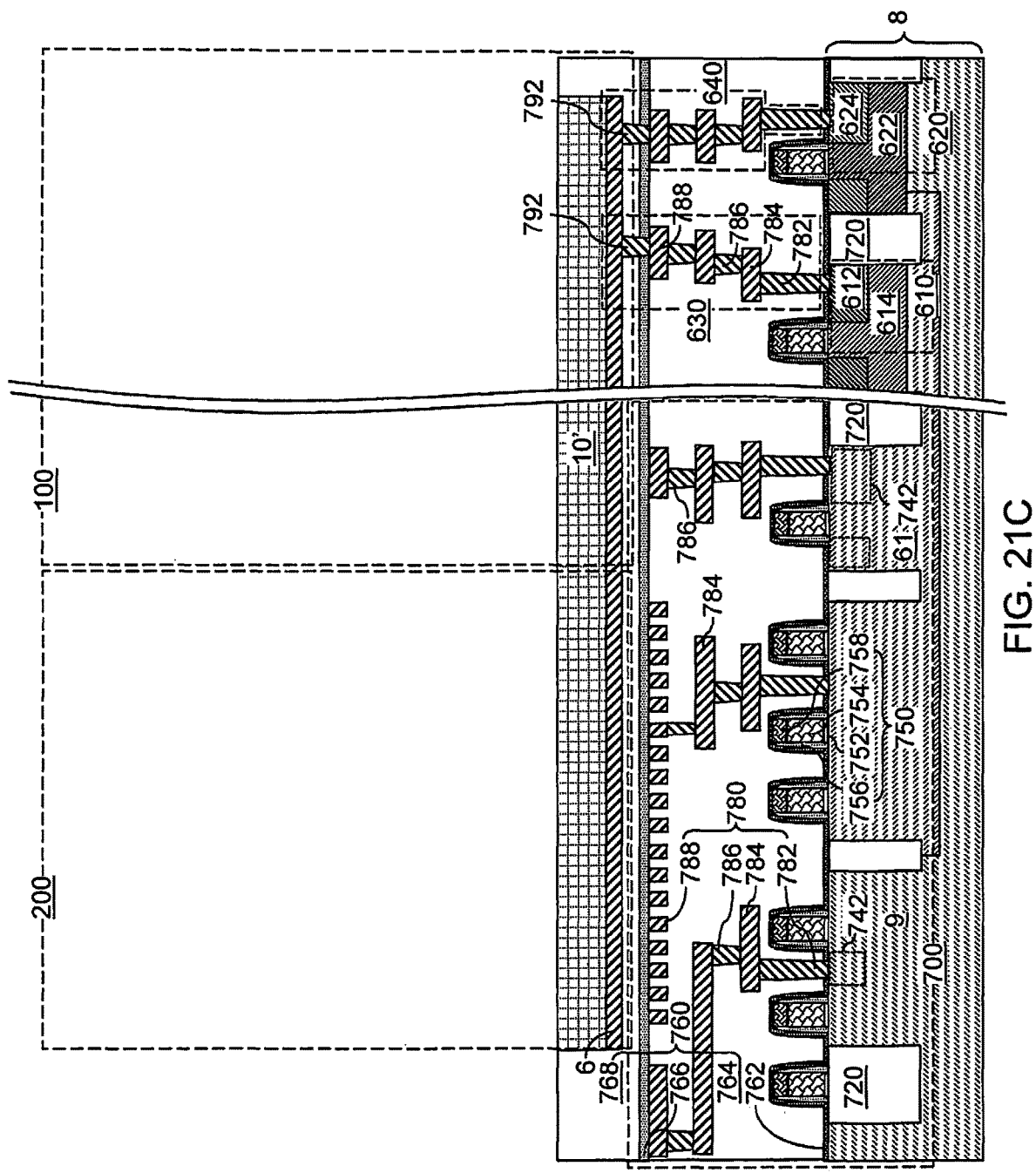
FIG. 21C is a vertical cross-sectional view of an alternative embodiment of the second exemplary structure at the processing steps of FIGS. 21A and 21B.

Referring to FIG. 21C, an alternative embodiment of the second exemplary structure, which can be derived from the second exemplary structure of FIGS. 21A and 21B by forming at least one p-n diode 610 and/or at least one n-p diode 620 as components of a respective field effect transistor as in the alternative embodiment of the first exemplary structure illustrated in FIG. 1D.

Figure 22:
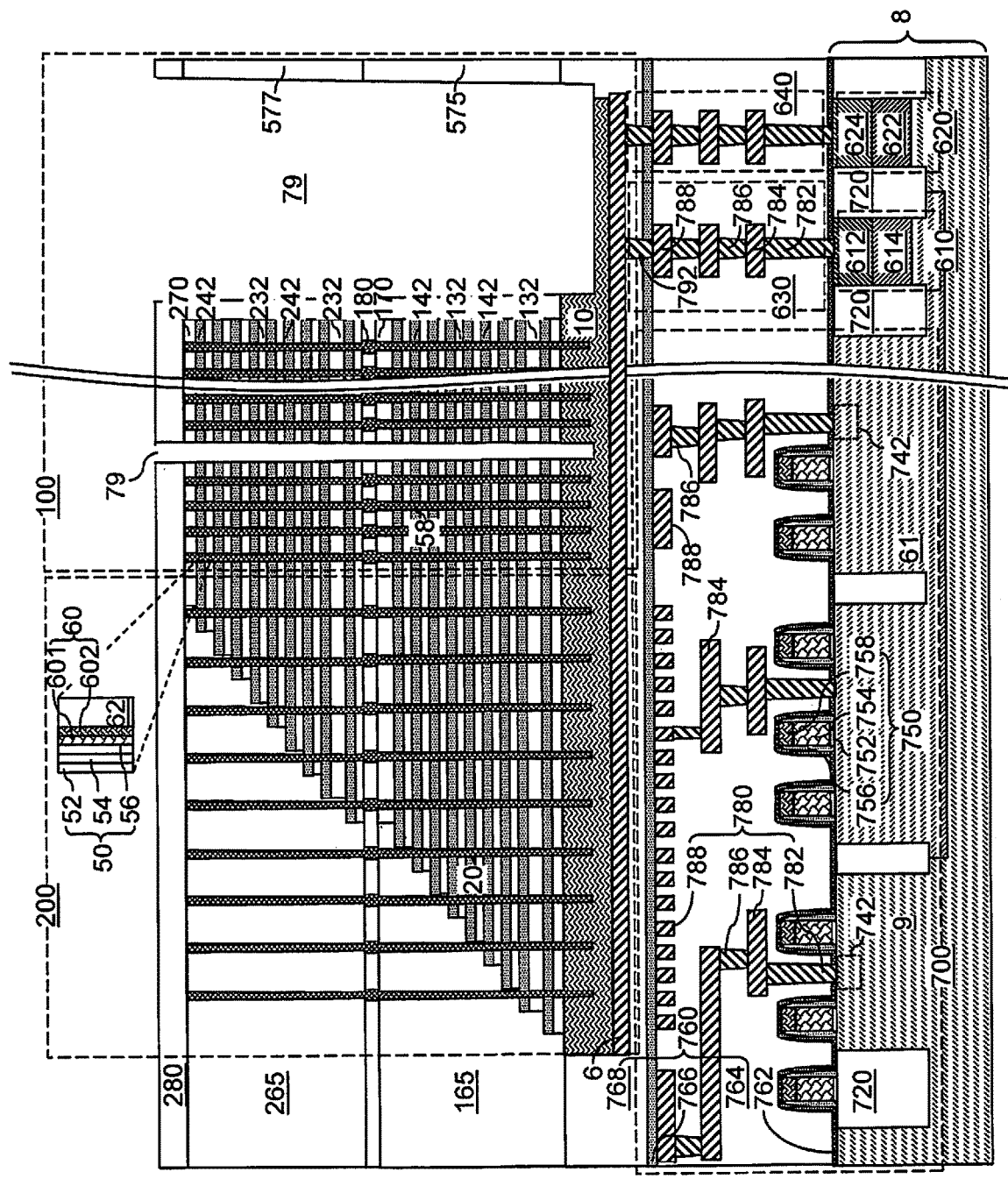
FIG. 22 is a vertical cross-sectional view of the second exemplary structure after formation of backside recesses according to an embodiment of the present disclosure.

Referring to FIG. 22, the processing steps of FIG. 2 to FIGS. 13A and 13B can be performed as in the first embodiment. As in the first embodiment, the diodes (610, 620) and the diode interconnect assemblies (630, 640) function as electrically conductive paths for discharging electrical charges during various plasma etch processes. The laterally protruding strip portions 10P of the in-process source-level material layers 10' and the laterally protruding strip portions (if present) of the conductive plate layer 6 function as electrically conductive paths until the end of the anisotropic etch process that forms the backside trenches 79. The backside trenches 79 can terminate in the middle of the in-process source-level material layers 10' (e.g., at least partially in layer 104) or can extend through all in-process source-level material layers 10' to reach the conductive plate layer 6 (if present) in this embodiment.

Figure 23A:
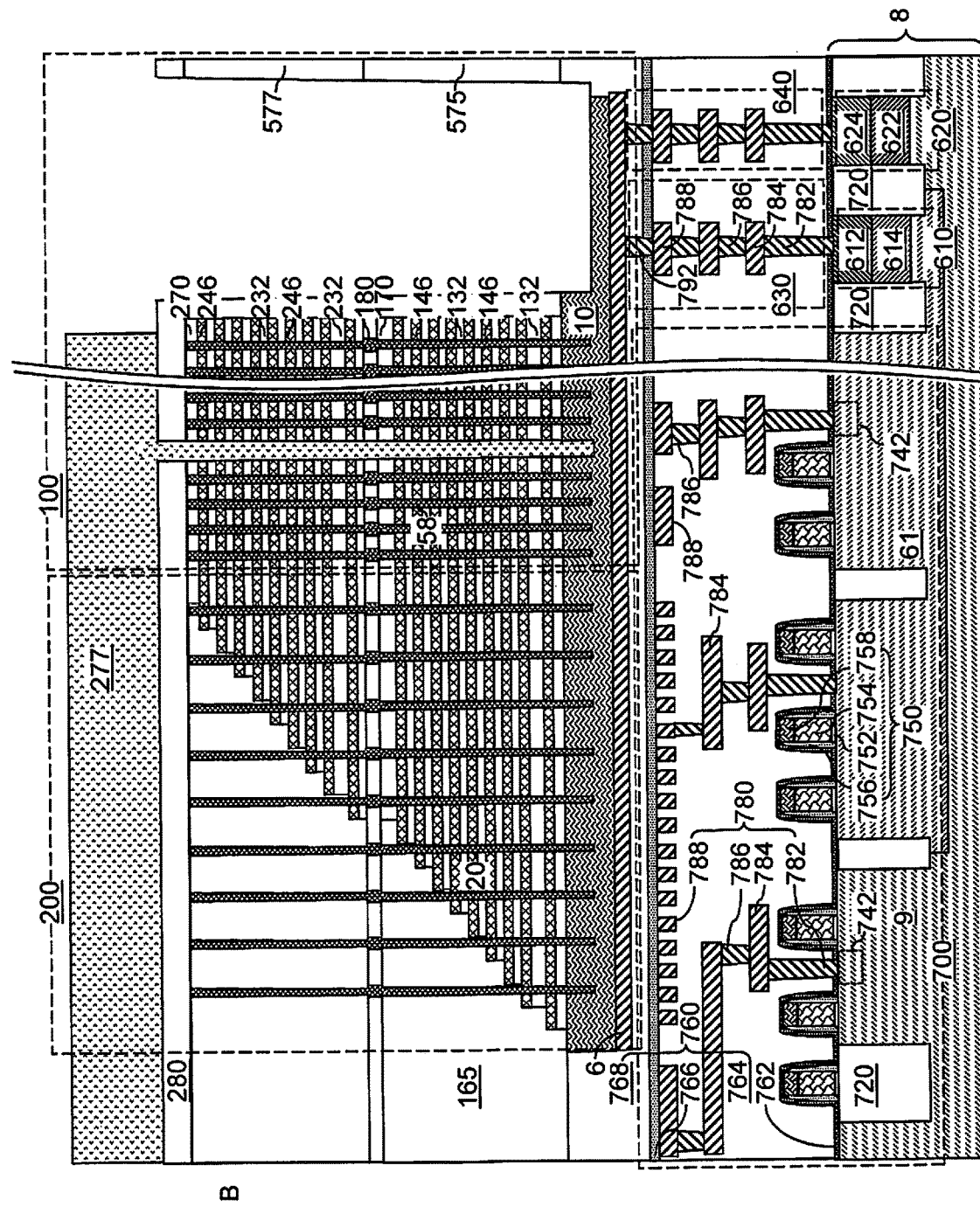
FIG. 23A is a vertical cross-sectional view of the second exemplary structure after application and patterning of a photoresist layer to cover regions of the backside trenches outside of a diode region according to an embodiment of the present disclosure.
Figure 23B:
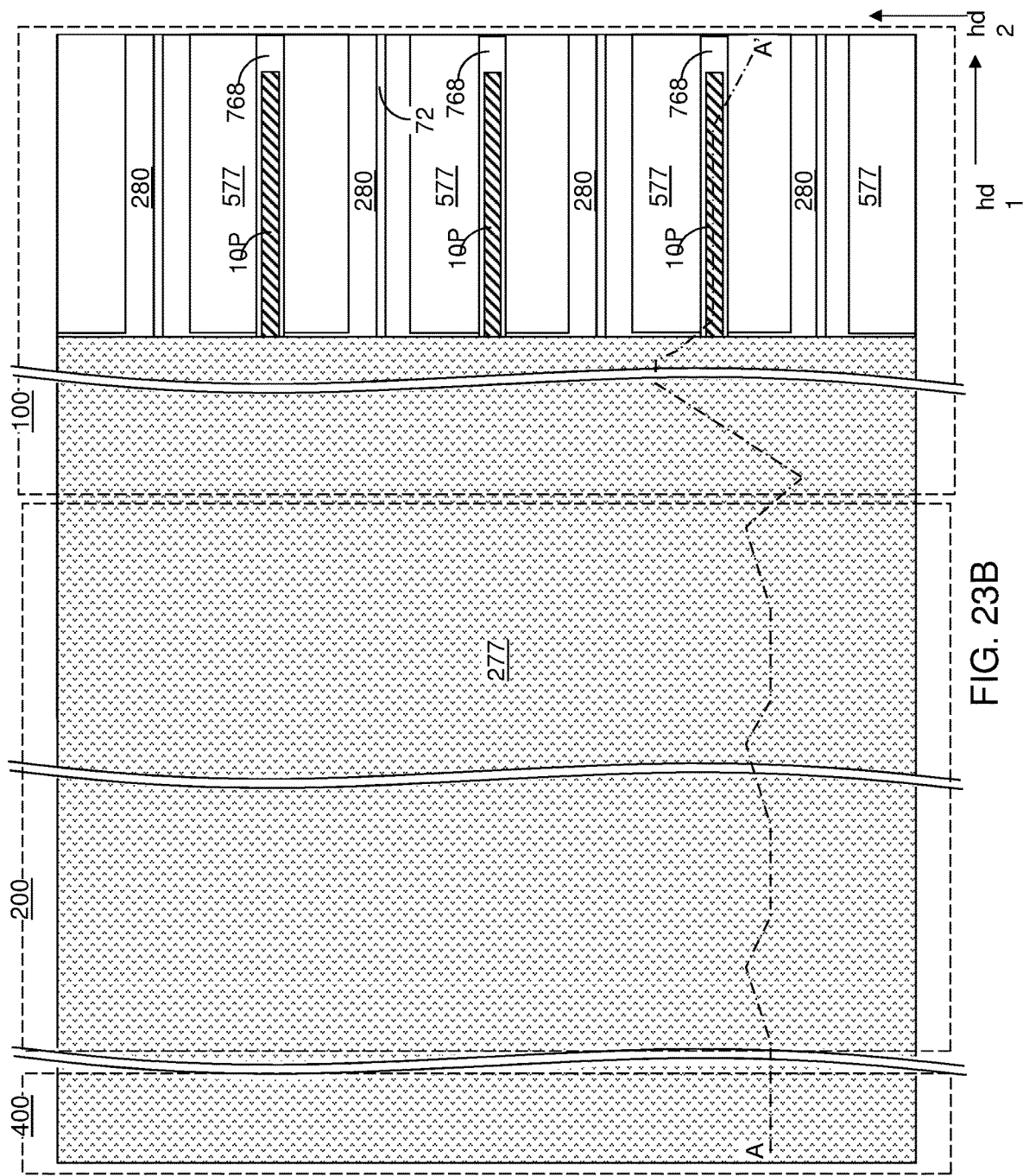
FIG. 23B is a horizontal cross-sectional of the second exemplary structure along the vertical plane B-B' of FIG. 23A. The zig-zag vertical plane A-A' corresponds to the plane of the vertical cross-sectional view of FIG. 23A.

Referring to FIGS. 23A and 23B, a photoresist layer 277 (or a patterning film) can be applied over the second exemplary structure and can be lithographically patterned to cover the portions of the backside trenches 79 that are in the staircase region 200 or are adjacent to the memory opening fill structure 58 in the memory array region 100. Portions of the backside trenches 79 that extend through the first and second dielectric pillar structures (575, 577) that overlie the laterally protruding strip portions 10P of the in-process source-level material layers 10' (if they remain after the backside trench 79 etch) and/or the laterally protruding strip portions (if present) of the conductive plate layer 6 are not covered by the photoresist layer 277.

Figure 24A:
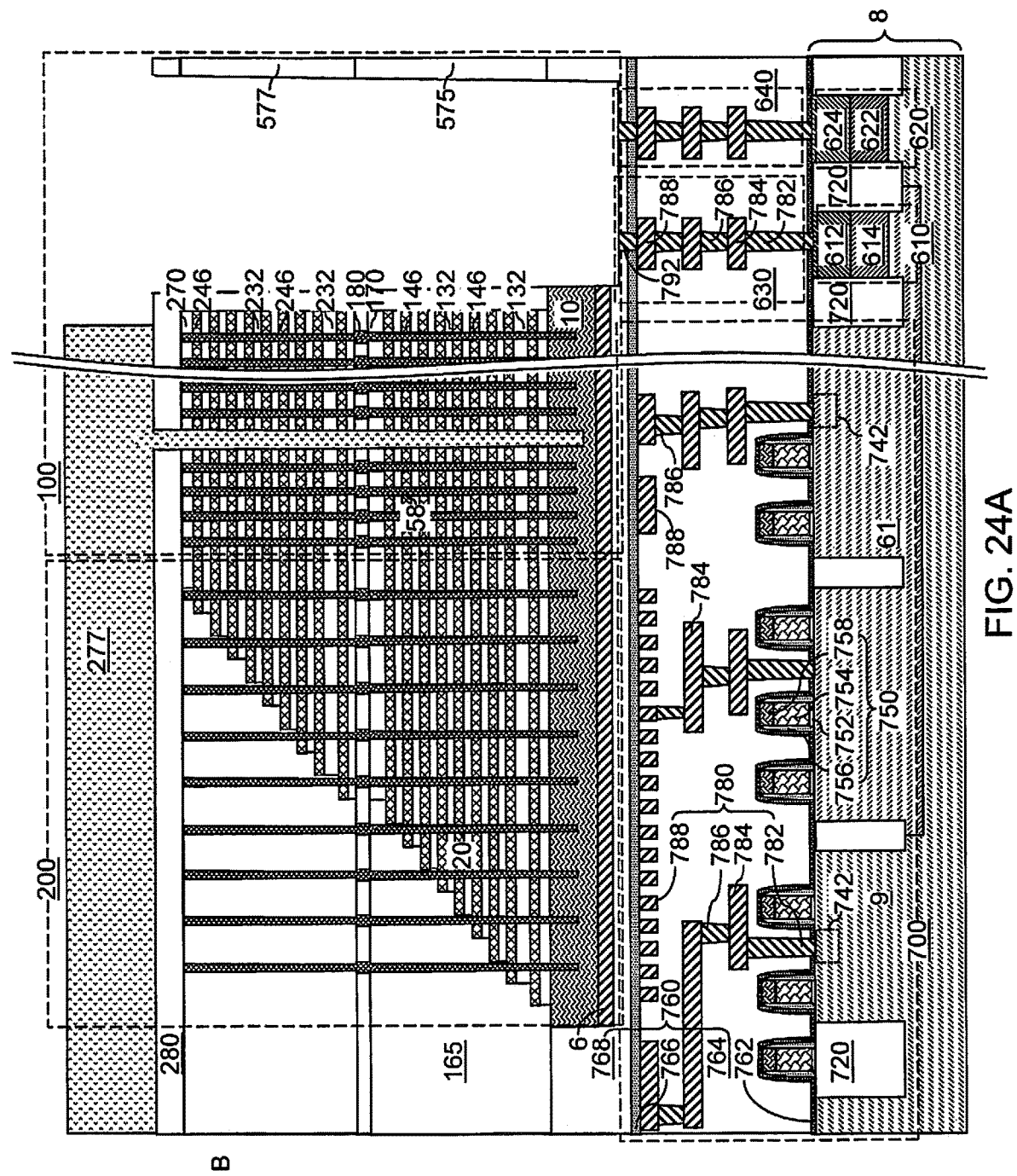
FIG. 24A is a vertical cross-sectional view of the second exemplary structure after disconnection of an electrically conductive path between the source-level material layers and the diodes according to an embodiment of the present disclosure.
Figure 24B:
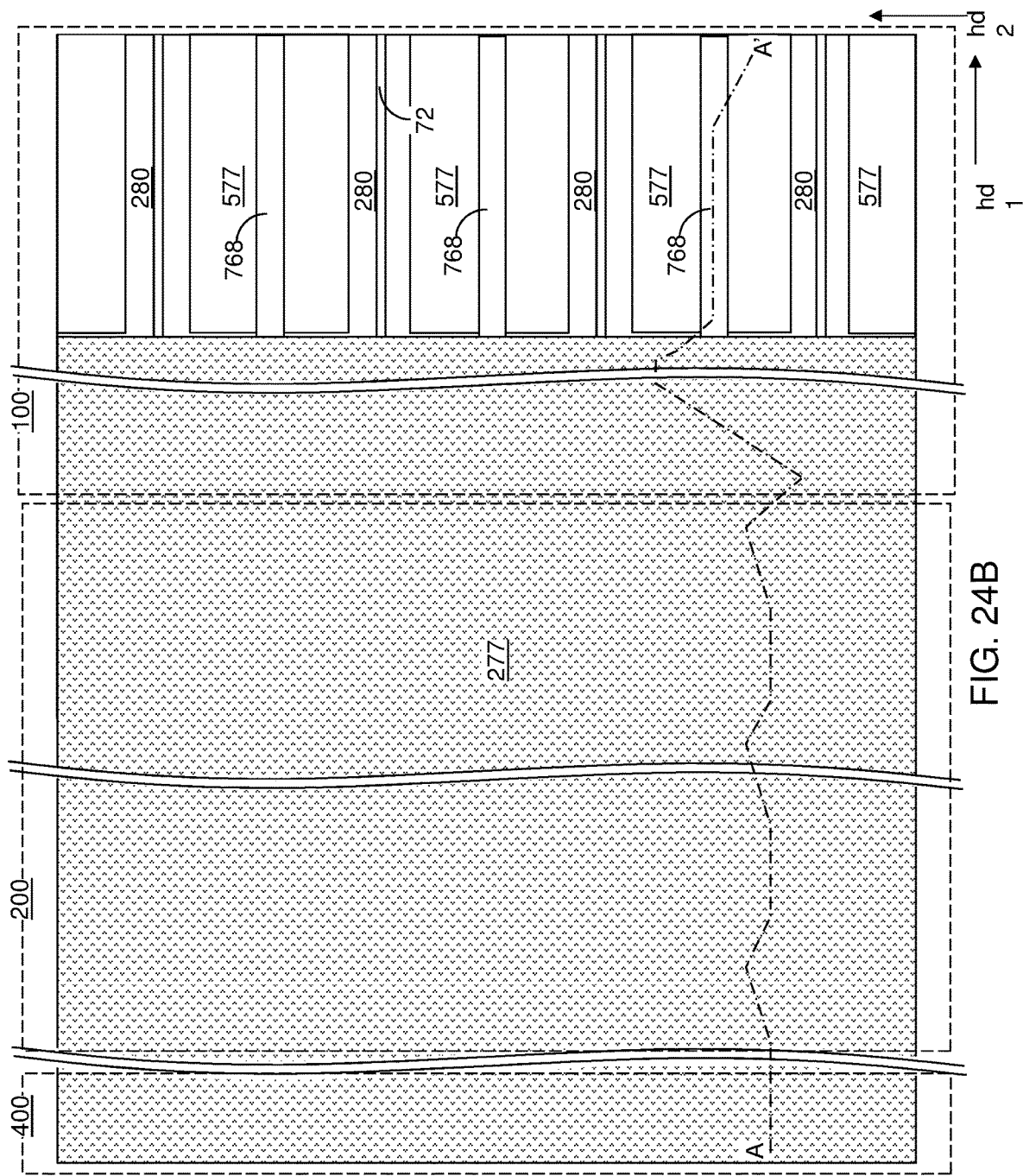
FIG. 24B is a horizontal cross-sectional of the second exemplary structure along the vertical plane B-B' of FIG. 24A. The zig-zag vertical plane A-A' corresponds to the plane of the vertical cross-sectional view of FIG. 24A.

Referring to FIGS. 24A and 24B, an anisotropic etch process can be performed to remove unmasked portions of the in-process source-level material layers 10' and/or the conductive plate layer 6, which include the laterally protruding strip portions 10P of the in-process source-level material layers 10' and/or the laterally protruding strip portions (if present) of the conductive plate layer 6 that electrically contact underlying diode connection via structures 792. An etch chemistry that etches the materials of the in-process source-level material layers 10 and/or the conductive plate layer 6 can be employed for the anisotropic etch process. The unmasked portions of the in-process source-level material layers 10 and/or the conductive plate layer 6 can be completely removed, and upper portions of the diode connection via structures 792 may be collaterally etched. In this case, the height of the diode connection via structures 792 may decrease after the anisotropic etch process.

The electrically conductive paths between the diodes (610, 620) and the at least one doped semiconductor layer within the in-process source-region material layers 10' are disconnected (i.e., removed) by the anisotropic etch process, and the at least one doped semiconductor layer within the in-process source-region material layers 10' is no longer electrically grounded after the anisotropic etch process. The anisotropic etch process disconnects the electrically conductive paths by removing a portion of the in-process source-level material layers 10 and the conductive plate layer 6 overlying the topmost component (e.g., a diode connection via structure 792) of each diode interconnect assemblies (630, 640) (which are subsets of the lower-level metal interconnect structures 780). Thus, source-region material layers to be subsequently formed from the in-process source-region material layers 10' can be electrically biased at operational voltages during device operation. The photoresist layer 277 can be subsequently removed, for example, by ashing.

Figure 25A:
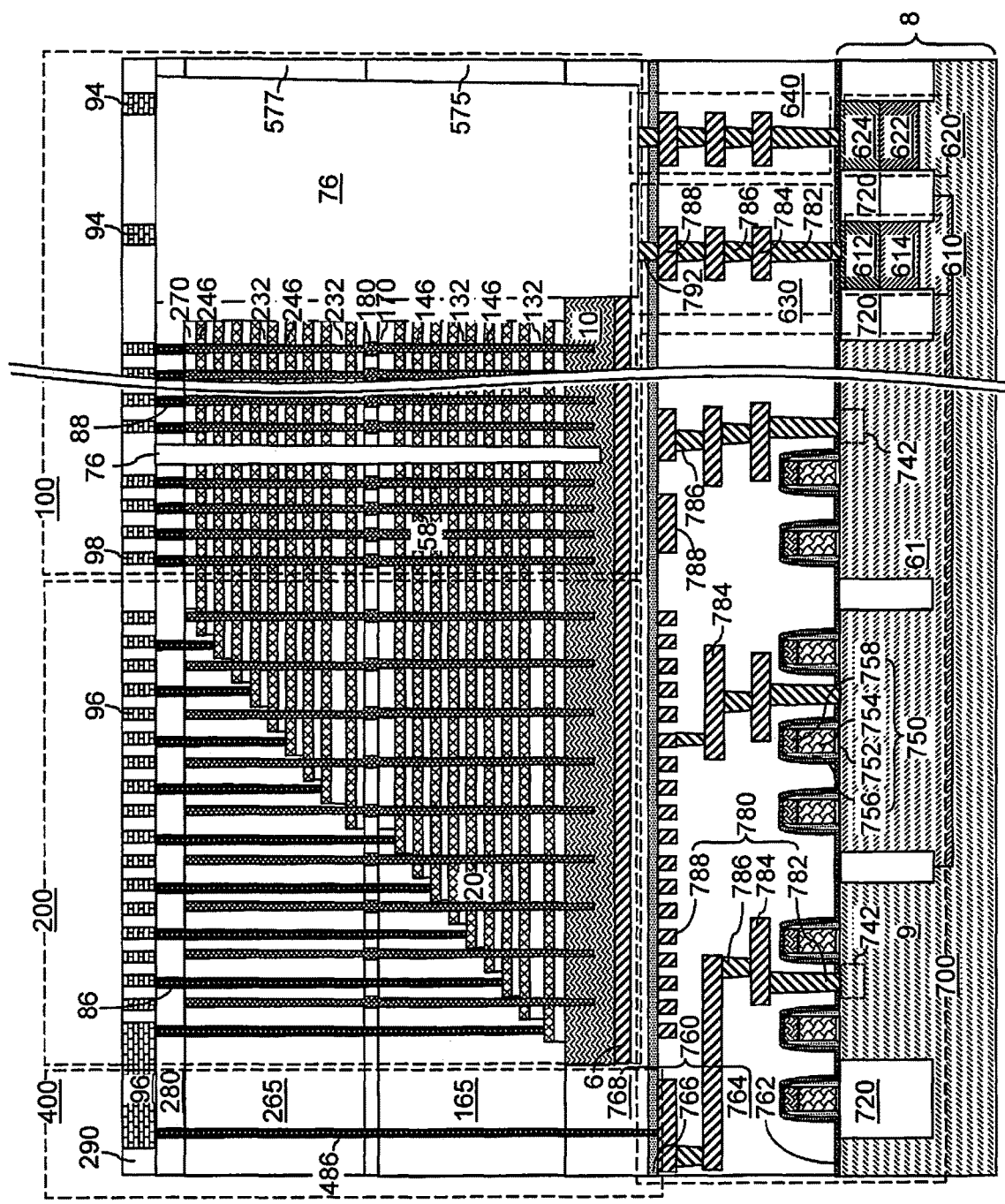
FIG. 25A is a vertical cross-sectional view of the second exemplary structure after formation of upper-level metal line structures according to an embodiment of the present disclosure.

Referring to FIG. 25A, the processing steps of FIGS. 18A and 18B-FIG. 20 can be performed to form the source-level material layers 10, the electrically conductive layers (146, 246), the dielectric wall structures 76, the various contact via structures (88, 86, 486), and upper-level metal line structures. The dielectric wall structures 76 contact top surfaces of the diode connection via structures 792 and a sidewalls of the source-level material layers 10 and the conductive plate layer 6 (if present).

Figure 25B:
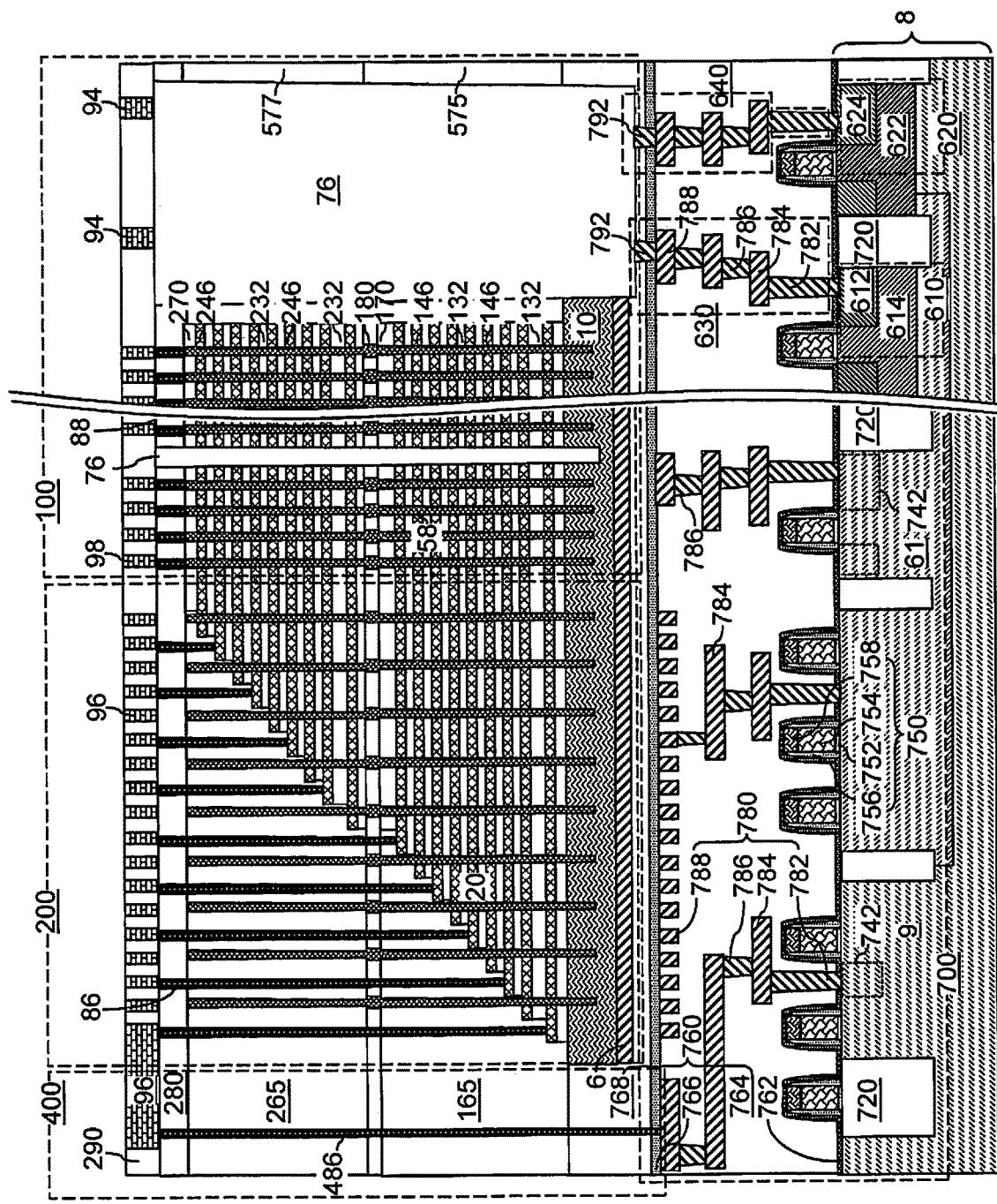
FIG. 25B is a vertical cross-sectional view of an alternative embodiment of the second exemplary structure at the processing steps of FIG. 25A.

Referring to FIG. 25B, an alternative embodiment of the second exemplary structure is illustrated at the processing steps of FIG. 25A, which can be derived from the alternative embodiment of the second exemplary structure of FIG. 21C by performing subsequent processing steps of the second exemplary structure.

Referring to all drawings and according to various embodiments of the present disclosure, a three-dimensional memory device is provided, which comprises: lower-level metal interconnect structures 780 embedded within lower-level dielectric material layers 760 and overlying a semiconductor substrate 8; an alternating stack {(132, 146) and/or (232, 246)} of insulating layers (132 and/or 232) and electrically conductive layers (146 and/or 246) laterally extending along a first horizontal direction hd1, located over the lower-level dielectric material layers 760; memory stack structures 55 that vertically extend through the alternating stack {(132, 145) and/or (232, 246)}; and at least one diode (610, 620) located on the semiconductor substrate 8 and electrically connected to a subset of the lower-level metal interconnect structures 780. The at least one diode (610, 620) comprises an electrically inactive dummy diode.

In one embodiment, the electrically inactive dummy diode (610, 620) is not in electrical contact with any contact via structure (84, 86, 88) or electrical input of the three-dimensional memory device.

In one embodiment, the three-dimensional memory device comprises a dielectric wall structure 76 vertically extending through each layer within the alternating stack {(132, 145) and/or (232, 246)} and including a lengthwise sidewall that laterally extends along the first horizontal direction hd1 and contacts each electrically conductive layer (146 and/or 246) within the alternating stack {(132, 145) and/or (232, 246)}. The lower-level metal interconnect structures 780 include a topmost metal interconnect structure (which may be a diode connection line structures 6' or a diode connection via structure 792 depending on embodiments) that contacts a first bottom surface of the dielectric wall structure 76.

In one embodiment, the three-dimensional memory device comprises source-level material layers 10 including at least one doped semiconductor material layer (such as the lower source-level material layer 112, the source contact layer 114, and the upper source-level material layer 116) and contacting a second bottom surface of the dielectric wall structure 76.

In one embodiment, the second bottom surface of the dielectric wall structure 76 is more distal from the semiconductor substrate 8 than the first bottom surface of the dielectric wall structure 76 is from the semiconductor substrate 8, i.e., is farther from the semiconductor substrate 8 along the vertical direction.

In one embodiment, the three-dimensional memory device comprises a conductive plate layer 6 contacting a bottom surface of the source-level material layers 10, wherein the first bottom surface of the dielectric wall structure 76 is located at, or below, a horizontal plane including an interface between the source-level material layers 10 and the conductive plate layer 6.

In one embodiment, the conductive plate layer 6 comprises a same metallic material as the topmost metal interconnect structure (such as the diode connection line structures 6') of the subset of the lower-level metal interconnect structures (that constitutes a diode interconnection assembly (630, 640)), and is spaced from the semiconductor substrate 8 by a same vertical distance as the topmost metal interconnect structure of the subset of the lower-level metal interconnect structures is from the semiconductor substrate 8.

In one embodiment, the conductive plate layer 6 has a bottom surface within a horizontal plane that overlies, or includes, a top surface of the topmost metal interconnect structure (such as a diode connection via structure 792) of the subset of the lower-level metal interconnect structures (that constitutes a diode interconnection assembly (630, 640)).

In one embodiment, the three-dimensional memory device comprises field effect transistors located on a top surface of the semiconductor substrate 8 and including electrical nodes that contact a respective one of the lower-level metal interconnect structures 780, wherein the at least one diode (610, 620) comprises at least one doped portion (612, 614, 622, 624) of a semiconductor material within the semiconductor substrate 8. In one embodiment, one or more of the at least one diode (610, 620) comprise a vertical stack of a p-doped semiconductor material portion (612 or 622) and an n-doped semiconductor material portion (614 or 624) that is located within the semiconductor substrate 8.

In one embodiment, the dielectric wall structure 76 has an areal overlap with the at least one diode (610, 620) in a plan view along a direction perpendicular to a top surface of the semiconductor substrate 8.

In one embodiment, the three-dimensional memory device comprises a monolithic three-dimensional NAND memory device; the electrically conductive layers (146, 246) comprise, or are electrically connected to, a respective word line of the monolithic three-dimensional NAND memory device; the semiconductor substrate 8 comprises a silicon substrate; the monolithic three-dimensional NAND memory device comprises an array of monolithic three-dimensional NAND strings over the silicon substrate; and at least one memory cell in a first device level of the array of monolithic three-dimensional NAND strings is located over another memory cell in a second device level of the array of monolithic three-dimensional NAND strings. The silicon substrate contains an integrated circuit comprising a driver circuit for the memory device located thereon; the electrically conductive layers (146, 246) comprise a plurality of control gate electrodes having a strip shape extending substantially parallel to the top surface of the substrate; and the array of monolithic three-dimensional NAND strings comprises: a plurality of semiconductor channels 60, wherein at least one end portion of each of the plurality of semiconductor channels 60 extends substantially perpendicular to a top surface of the substrate, and a plurality of charge storage elements (which comprise portions of the charge storage layers 54 located at the levels of the electrically conductive layers (146, 246)), each charge storage element located adjacent to a respective one of the plurality of semiconductor channels 60.

The electrically conductive paths between the in-process source-level material layers 10' and the diodes (610, 620) are temporary electrical connections that are employed to discharge excess electrical charges that accumulate during plasma etch processes that etch materials of the first-tier structure and the second-tier structure during manufacture of the three-dimensional memory device. The diodes (610, 620) are antenna diodes that collect electrical charges during plasma etch processes for discharge to electrical ground. The electrically conductive paths are disconnected after formation of the backside trenches 79 to enable electrical biasing of the source-level material layers 10 in the final structure including the three-dimensional memory device. The diodes (610, 620) and portions of the diode interconnection assemblies (630, 640) remain in the final structure. The temporary electrically conductive paths between the in-process source-level material layers 10' and the diodes (610, 620) facilitate formation of straight sidewalls for the various openings (149, 249) and trenches 79 that are formed by plasma etch processes, thereby enhancing performance, yield, and/or reliability of the three-dimensional memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   lower-level metal interconnect structures embedded within lower-level dielectric material layers and overlying a semiconductor substrate;
   an alternating stack of insulating layers and electrically conductive layers laterally extending along a first horizontal direction, located over the lower-level dielectric material layers;
   memory stack structures that vertically extend through the alternating stack;
   at least one diode located on the semiconductor substrate and electrically connected to a subset of the lower-level metal interconnect structures, wherein the at least one diode comprises an electrically inactive dummy diode;
   a dielectric wall structure vertically extending through each layer within the alternating stack and including a lengthwise sidewall that laterally extends along the first horizontal direction and contacts each electrically conductive layer within the alternating stack, wherein lower-level metal interconnect structures include a topmost metal interconnect structure that contacts a first bottom surface of the dielectric wall structure; and
   source-level material layers including at least one doped semiconductor material layer and contacting a second bottom surface of the dielectric wall structure,
   wherein the dielectric wall structure has an areal overlap with the at least one diode in a plan view along a direction perpendicular to a top surface of the semiconductor substrate.

2. The three-dimensional memory device of claim 1, wherein the second bottom surface of the dielectric wall structure is more distal from the semiconductor substrate than the first bottom surface of the dielectric wall structure is from the semiconductor substrate.

3. The three-dimensional memory device of claim 1, further comprising a conductive plate layer contacting a bottom surface of the source-level material layers, wherein the first bottom surface of the dielectric wall structure is located at, or below, a horizontal plane including an interface between the source-level material layers and the conductive plate layer.

4. The three-dimensional memory device of claim 3, wherein the conductive plate layer comprises a same metallic material as the topmost metal interconnect structure of the subset of the lower-level metal interconnect structures, and is spaced from the semiconductor substrate by a same vertical distance as the topmost metal interconnect structure of the subset of the lower-level metal interconnect structures is from the semiconductor substrate.

5. The three-dimensional memory device of claim 1, further comprising field effect transistors located on a top surface of the semiconductor substrate and including electrical nodes that contact a respective one of the lower-level metal interconnect structures,
   wherein the at least one diode comprises at least one doped portion of a semiconductor material within the semiconductor substrate.

6. The three-dimensional memory device of claim 1, wherein:
   the electrically inactive dummy diode is not in electrical contact with any contact via structure or electrical input of the three-dimensional memory device; and
   the memory stack structures comprise a memory film and a vertical semiconductor channel.

7. The three-dimensional memory device of claim 1, wherein:
   the three-dimensional memory device comprises a monolithic three-dimensional NAND memory device;
   the electrically conductive layers comprise, or are electrically connected to, a respective word line of the monolithic three-dimensional NAND memory device;
   the semiconductor substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon;
   the electrically conductive layers comprise a plurality of control gate electrodes having a strip shape extending substantially parallel to the top surface of the substrate; and
   the array of monolithic three-dimensional NAND strings comprises:
   a plurality of semiconductor channels, wherein at least one end portion of each of the plurality of semiconductor channels extends substantially perpendicular to a top surface of the substrate, and
   a plurality of charge storage elements, each charge storage element located adjacent to a respective one of the plurality of semiconductor channels.

8. A three-dimensional memory device comprising:
   lower-level metal interconnect structures embedded within lower-level dielectric material layers and overlying a semiconductor substrate;

an alternating stack of insulating layers and electrically conductive layers laterally extending along a first horizontal direction, located over the lower-level dielectric material layers;

memory stack structures that vertically extend through the alternating stack;

at least one diode located on the semiconductor substrate and electrically connected to a subset of the lower-level metal interconnect structures, wherein the at least one diode comprises an electrically inactive dummy diode;

a dielectric wall structure vertically extending through each layer within the alternating stack and including a lengthwise sidewall that laterally extends along the first horizontal direction and contacts each electrically conductive layer within the alternating stack, wherein lower-level metal interconnect structures include a topmost metal interconnect structure that contacts a first bottom surface of the dielectric wall structure;

source-level material layers including at least one doped semiconductor material layer and contacting a second bottom surface of the dielectric wall structure;

a conductive plate layer contacting a bottom surface of the source-level material layers, wherein the first bottom surface of the dielectric wall structure is located at, or below, a horizontal plane including an interface between the source-level material layers and the conductive plate layer, wherein the conductive plate layer has a bottom surface within a horizontal plane that overlies, or includes, a top surface of the topmost metal interconnect structure of the subset of the lower-level metal interconnect structures.

9. The three-dimensional memory device of claim 8, wherein the second bottom surface of the dielectric wall structure is more distal from the semiconductor substrate than the first bottom surface of the dielectric wall structure is from the semiconductor substrate.

10. The three-dimensional memory device of claim 8, further comprising field effect transistors located on a top surface of the semiconductor substrate and including electrical nodes that contact a respective one of the lower-level metal interconnect structures, wherein the at least one diode comprises at least one doped portion of a semiconductor material within the semiconductor substrate.

11. The three-dimensional memory device of claim 8, wherein:

the electrically inactive dummy diode is not in electrical contact with any contact via structure or electrical input of the three-dimensional memory device; and the memory stack structures comprise a memory film and a vertical semiconductor channel.

12. The three-dimensional memory device of claim 8, wherein:

the three-dimensional memory device comprises a monolithic three-dimensional NAND memory device;

the electrically conductive layers comprise, or are electrically connected to, a respective word line of the monolithic three-dimensional NAND memory device;

the semiconductor substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *